(12) United States Patent
Shinoda et al.

(10) Patent No.: US 8,890,521 B2
(45) Date of Patent: Nov. 18, 2014

(54) MAGNETIC RESONANCE DIAGNOSIS APPARATUS AND DATA ACQUISITION METHOD OF MAGNETIC RESONANCE SPECTROSCOPY

(75) Inventors: Kensuke Shinoda, Otawara (JP); Satoshi Wakai, Nasushiobara (JP)

(73) Assignees: Kabushiki Kaisha Toshiba, Minato-Ku, Tokyo (JP); Toshiba Medical Systems Corporation, Otawara-Shi, Tochigi-Ken (JP)

( * ) Notice: Subject to any disclaimer, the term of this patent is extended or adjusted under 35 U.S.C. 154(b) by 437 days.

(21) Appl. No.: 13/300,922

(22) Filed: Nov. 21, 2011

(65) Prior Publication Data

US 2012/0133360 A1 May 31, 2012

(30) Foreign Application Priority Data

Nov. 26, 2010 (JP) ................................. 2010-264195
Oct. 31, 2011 (JP) ................................. 2011-238914

(51) Int. Cl.
| | | |
|---|---|---|
| G01V 3/00 | (2006.01) | |
| G01R 33/483 | (2006.01) | |
| G01R 33/485 | (2006.01) | |
| G01R 33/565 | (2006.01) | |
| G01R 33/54 | (2006.01) | |

(52) U.S. Cl.
CPC ...... G01R 33/4838 (2013.01); *G01R 33/56563* (2013.01); *G01R 33/543* (2013.01); G01R 33/485 (2013.01); *G01R 33/56527* (2013.01); *G01R 33/56536* (2013.01)
USPC .......................................................... 324/307

(58) Field of Classification Search
USPC ................................................. 324/300–322
See application file for complete search history.

(56) References Cited

U.S. PATENT DOCUMENTS

| | | | | |
|---|---|---|---|---|
| 5,317,264 | A * | 5/1994 | Rommel et al. | 324/309 |
| 5,800,354 | A * | 9/1998 | Hofland et al. | 600/410 |
| 6,046,588 | A * | 4/2000 | Watanabe | 324/307 |
| 6,700,374 | B1 * | 3/2004 | Wu et al. | 324/312 |
| 6,721,589 | B1 * | 4/2004 | Zhu et al. | 600/413 |
| 7,064,545 | B2 * | 6/2006 | Zaharchuk et al. | 324/307 |
| 7,081,750 | B1 * | 7/2006 | Zhang | 324/309 |
| 7,417,430 | B2 * | 8/2008 | Aldefeld et al. | 324/309 |
| 7,676,075 | B2 * | 3/2010 | Smith et al. | 382/131 |
| 7,689,263 | B1 * | 3/2010 | Fung et al. | 600/410 |
| 7,777,488 | B2 * | 8/2010 | Gore et al. | 324/309 |
| 7,941,204 | B1 * | 5/2011 | Wang et al. | 600/420 |
| 7,952,351 | B2 * | 5/2011 | King et al. | 324/307 |
| 7,953,468 | B2 * | 5/2011 | Tatebayashi et al. | 600/410 |
| 8,072,211 | B2 * | 12/2011 | Harvey | 324/309 |
| 8,077,955 | B2 * | 12/2011 | Dannels et al. | 382/131 |
| 8,502,538 | B2 * | 8/2013 | Dannels et al. | 324/318 |
| 8,503,744 | B2 * | 8/2013 | Shlomi | 382/128 |
| 8,611,624 | B2 * | 12/2013 | Poonawalla et al. | 382/128 |
| 8,781,185 | B2 * | 7/2014 | Shinoda et al. | 382/128 |
| 2011/0140697 | A1 | 6/2011 | Shinoda et al. | |

FOREIGN PATENT DOCUMENTS

JP    2009-279432    12/2009

* cited by examiner

*Primary Examiner* — Dixomara Vargas
(74) *Attorney, Agent, or Firm* — Nixon & Vanderhye PC

(57) ABSTRACT

A magnetic resonance diagnosis apparatus automatically calculates an application region of a prepulse based on image data including a region of interest of an object generated before application of a prepulse. The prepulse is applied to the automatically calculated application region. A magnetic resonance signal is then received from a region including the region of interest, and magnetic resonance spectrum data is generated indicative of concentration distribution of metabolic substances in the region of interest.

20 Claims, 33 Drawing Sheets

COMBINED REGION OF
"REGIONS TO BE AVOIDED"

MAGNETIC RESONANCE DIAGNOSIS APPARATUS AND DATA ACQUISITION METHOD OF MAGNETIC RESONANCE SPECTROSCOPY

CROSS-REFERENCE TO RELATED APPLICATION(S)

This application is based upon and claims the benefit of priority from Japanese Patent Application No. 2010-264195, filed on Nov. 26, 2010 and Japanese Patent Application No. 2011-238914 filed on Oct. 31, 2011;

The entire contents of which are incorporated herein by reference.

BACKGROUND OF THE INVENTION

1. Field of the Invention

Embodiments described herein relate generally to a magnetic resonance diagnosis apparatus and a data acquisition method of magnetic resonance spectroscopy.

2. Description of the Related Art

MRI is an imaging method which magnetically excites nuclear spin of an object (a patient) set in a static magnetic field with an RF pulse having the Larmor frequency and reconstructs an image based on MR signals generated due to the excitation. The aforementioned MRI means magnetic resonance imaging, the RF pulse means a radio frequency pulse, and the MR signal means a nuclear magnetic resonance signal.

In MRI, if an intensity ratio of concentration distribution of metabolic substance such as choline, creatine and NAA (N-acetylaspartate) changes due to, for example, tumor or hemorrhage, information of tumor or hemorrhage cannot be obtained.

Meanwhile, as a technology to visually capture category and concentration distribution of metabolic substance which cannot be obtained from images of MRI, MRS (magnetic resonance spectroscopy, refer to Japanese Publication of Patent Application No. 2009-279432, for example) is known.

MRS is a disuniting method in which signals of respective molecules are individually extracted based on "chemical shift". The chemical shift is difference of magnetic resonance frequency between various molecules caused by difference of chemical bonds of the various molecules.

As a contributing factor of artifact in MRS, "commingling of water signals and a fat signals" and "non-uniformity of static magnetic field" are included.

Specifically, for example, when a region of interest is parenchyma of the brain, a static magnetic field becomes non-uniform "near a part which contains much wet such as cerebrospinal fluid" and "near a part which contains air such as a nasal cavity, auditory canal and bony canal". This is because parenchyma of the brain is different in magnetic susceptibility from "regions near a part containing air or much wet".

If a static magnetic field becomes non-uniform, half bandwidth of a peak of a metabolic substance becomes wider. This disables disuniting of respective peaks of a plurality of metabolic substances whose chemical shifts are close to each other, or causes commingling of undesired signals from outside of a data acquisition region.

Additionally, if strong MR signals of water or fat are mixed, this makes it difficult to detect respective peaks of metabolic substances whose chemical shifts are close to water or fat. This is because signals of metabolic substances are weak.

Then, in order to suppress MR signals from parts which cause artifact in MRS, technology of applying a presaturation pulse before data acquisition of MRS is known. A presaturation pulse is a prepulse which spatially selectively saturates MR signals of its application region.

In the above prior technology, an operator sets an application region of a presaturation pulse which saturates MR signals of parts including air, water and fat, aside from setting of acquisition region of MR signals in MRS.

Therefore, "technology to ease operator's labor required for setting of data acquisition conditions such as an application region of a prepulse and an acquisition region of MR signals when MRS is performed, by making the setting of the data acquisition conditions easier than prior art" has been desired.

BRIEF DESCRIPTION OF THE DRAWINGS

In the accompanying drawings:

FIG. 12 is a pattern diagram showing the state of the scout image, which the exterior border line and the interior border line are superimposed on and the fifth example of a data acquisition region of MRS is set on;

DETAILED DESCRIPTION

Figure 1:
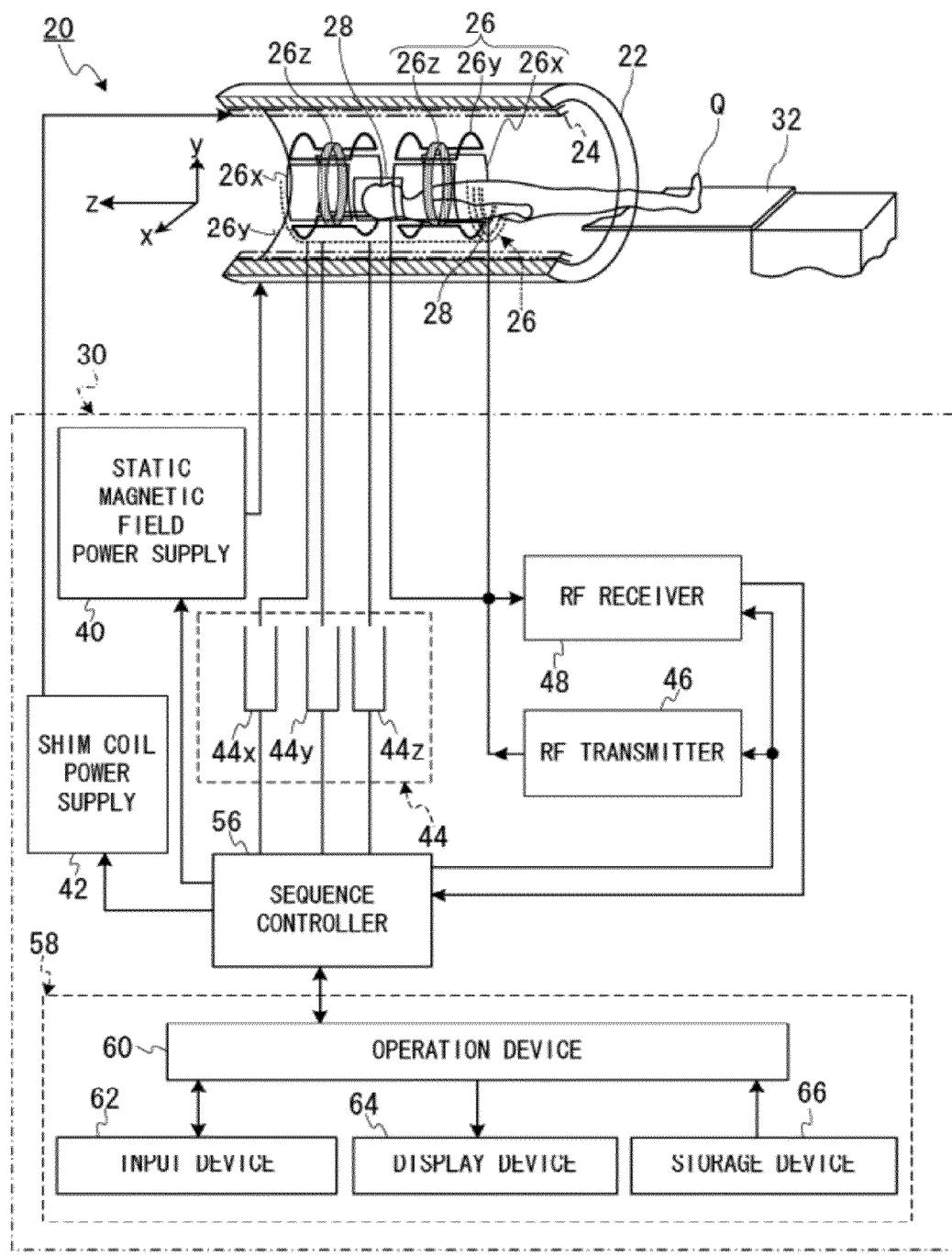
FIG. 1 is a block diagram showing general structure of the magnetic resonance diagnosis apparatus of the first embodiment.

According to one embodiment, a magnetic resonance diagnosis apparatus performs "generation of image data of an object by magnetic resonance imaging" and "magnetic resonance spectroscopy", and includes an application region calculation unit and a data generation unit.

The application region calculation unit automatically calculates an application region of a spatially selective prepulse based on "image data including a region of interest of the object generated by magnetic resonance imaging, before application of a prepulse".

The data generation unit applies the prepulse according to the application region automatically calculated by the application region calculation unit, then receives a magnetic resonance signal from a data acquisition region including the region of interest, and generates magnetic resonance spectrum data indicative of concentration distribution per metabolic substance in the region of interest based on the magnetic resonance signal.

According to another embodiment, a magnetic resonance diagnosis apparatus includes an extraction unit, a display unit, an input unit, an input restriction unit and a data generation unit.

The extraction unit extracts a region of a specific tissue from "image data including a region of interest of an object generated by magnetic resonance imaging", as a region to be avoided.

The display unit displays the region to be avoided.

The input unit receives input which sets a range of a data acquisition region.

The input restriction unit sets a judging frame defined by extending an outer border of data acquisition region. After setting the judging frame, the input restriction unit "restricts the input to the input unit so as to separate the judging frame from the region to be avoided" or "informs that the judging frame overlaps on the region to be avoided in such case".

The data generation unit determines the range of the data acquisition region based on the input to the input unit, then receives a magnetic resonance signal from the data acquisition region, and generates magnetic resonance spectrum data indicative of concentration distribution per metabolic substance in the data acquisition region based on the magnetic resonance signal.

According to one embodiment, a data acquisition method of magnetic resonance spectroscopy includes the steps of:

(a) calculating an application region of a spatially selective prepulse based on "image data including a region of interest of an object generated by magnetic resonance imaging" automatically, before application of a prepulse;

(b) receiving a magnetic resonance signal from a data acquisition region including the region of interest, after applying the prepulse according to the application region automatically calculated; and (c) generating magnetic resonance spectrum data indicative of concentration distribution per metabolic substance in the region of interest based on the magnetic resonance signal.

A magnetic resonance diagnosis apparatus and a data acquisition method of magnetic resonance spectroscopy according to embodiments of the present invention will be described with reference to the accompanying drawings.

Note that the same reference numbers are given for identical components in each figure, and overlapping explanation is abbreviated.

<First Embodiment>

The first Embodiment relates to automatic setting of an application region of each presaturation pulse in the case of data acquisition of MRS targeting the cephalic part. Firstly, apparatus configuration will be explained.

FIG. 1 is a block diagram showing general structure of the magnetic resonance diagnosis apparatus 20 according to the first embodiment. Note that the hardware configuration of the magnetic resonance diagnosis apparatus 20 is common to other embodiments explained later.

As shown in FIG. 1, the magnetic resonance diagnosis apparatus 20 includes a cylinder-shaped static magnetic field magnet 22 for generating a static magnetic field, a cylinder-shaped shim coil 24 coaxially-arranged inside the static magnetic field magnet 22, a gradient coil 26 (i.e. gradient magnetic field coil 26), RF coils 28, a control device 30, and a bed 32 for placing an object (e.g. a patient) Q on it.

Here, as one example, an apparatus coordinate system, whose X axis, a Y axis and a Z axis are perpendicular to each other, is defined as follows. Firstly, the direction of an axis of the static magnetic field magnet 22 and the shim coil 24 is aligned with the direction which is perpendicular to the vertical direction, and the direction of the axis of the static magnetic field magnet 22 and the shim coil 24 is defined as the Z axis direction.

Additionally, it is assumed that the vertical direction is the same as the Y axis direction. Moreover, the bed 32 is disposed in such a position that the direction of "the normal line of the table plane thereof on which an object is put" is the same as the Y axis direction.

The control device 30 includes, for example, a static magnetic field power supply 40, a shim coil power supply 42, a gradient magnetic field power supply 44, an RF transmitter 46, an RF receiver 48, a sequence controller 56 and a computer 58.

The gradient magnetic field power supply 44 includes an X-axis gradient magnetic field power supply 44x, a Y-axis gradient magnetic field power supply 44y and a Z-axis gradient magnetic field power supply 44z.

The computer 58 includes an operation device 60, an input device 62, a display device 64 and a storage device 66.

The static magnetic field magnet 22 is electrically connected to the static magnetic field power supply 40 and generates a static magnetic field in an imaging space by using electric current supplied from the static magnetic field power supply 40.

The aforementioned "imaging space" means, for example, a space in a gantry in which an object Q is placed and to which a static magnetic field is applied. The term "gantry" refers to a structure having a cylindrical shape, for example, which includes a static magnetic field magnet 22, a shim coil 24, a gradient magnetic field coil 26, and RF coils 28. The gantry and a bed 32 are configured so that the bed 32 on which the object Q is placed can move to the inside of the gantry. For simplicity, FIG. 1 does not show the gantry itself but shows components of the gantry such as the static magnetic field magnet 22.

The "imaging region" means, for example, a region set as a part of the imaging space and is a range of acquisition of MR signals used to generate "one image" or "one set of image". The "one image" or "one set of image" may be a two-dimensional image or a three-dimensional image.

The shim coil 24 is electrically connected to the shim coil power supply 42 and uniforms the static magnetic field with the electric current supplied from the shim coil power supply 42.

The static magnetic field magnet 22 includes a superconductivity coil in many cases. The static magnetic field magnet 22 gets electric current from the static magnetic field power supply 40 at excitation. However, once excitation has been made, the static magnetic field magnet 22 is usually isolated from the static magnetic field power supply 40. The static magnetic field magnet 22 may include a permanent magnet which makes the static magnetic field power supply 40 unnecessary.

The gradient coil 26 includes an X-axis gradient coil 26x, a Y-axis gradient coil 26y and a Z-axis gradient coil 26z. Each of the X-axis gradient coil 26x, the Y-axis gradient coil 26y and the Z-axis gradient coil 26z is cylinder-shaped and arranged inside the static magnetic field magnet 22.

The X-axis gradient coil 26x, the Y-axis gradient coil 26y and the Z-axis gradient coil 26z are electrically connected to the X-axis gradient magnetic field power supply 44x, the Y-axis gradient magnetic field power supply 44y and the Z-axis gradient magnetic field power supply 44z of the gradient magnetic field power supply 44 respectively.

The X-axis gradient magnetic field power supply 44x, the Y-axis gradient magnetic field power supply 44y and the Z-axis gradient magnetic field power supply 44z supply electric current to the X-axis gradient coil 26x, the Y-axis gradient coil 26y and the Z-axis gradient coil 26z respectively so as to generate a gradient magnetic field Gx in the X-axis direction, a gradient magnetic field Gy in the Y-axis direction and a gradient magnetic field Gz in the Z-axis direction in the imaging region.

That is, directions of "a gradient magnetic field Gss in a slice selection direction", "a gradient magnetic field Gpe in a phase encoding direction" and "a gradient magnetic field Gro in a readout (frequency encoding) direction" can be arbitrarily set as logical axises, by combining the gradient magnetic fields Gx, Gy and Gz in the X-axis, Y-axis and Z-axis directions as three physical axises.

The gradient magnetic fields Gss, Gpe and Gro in the slice selection direction, the phase encoding direction and the readout direction are superimposed on the static magnetic field.

The RF transmitter 46 generates RF pulses in accordance with control information provided from the sequence controller 56, and outputs the generated RF pulses to the transmission RF coil 28.

The RF coils 28 include "a WBC (whole body coil) built in the gantry for transmission and reception of RF pulses" and "local coils arranged around the bed 32 or the object Q for reception of RF pulses".

The transmission RF coil 28 transmits an RF pulse given from the RF transmitter 46 to the object Q. The reception RF coil 28 receives an MR signal generated due to excited nuclear spin inside the object Q by the RF pulse and this MR signal is detected by the RF receiver 48.

The RF receiver 48 generates raw data which are digitized complex number data obtained by performing A/D (analogue to digital) conversion after performing predetermined signal processing such as preamplification, intermediate-frequency conversion, phase detection, low-frequency amplification and filtering to the detected MR signal. The RF receiver 48 inputs the generated raw data to the sequence controller 56.

The operation device 60 performs system control of the magnetic resonance diagnosis apparatus in imaging operation, and its function will be explained later with FIG. 2.

The sequence controller 56 storages control information needed in order to make the gradient magnetic field power supply 44, the RF transmitter 46 and the RF receiver 48 drive. The aforementioned control information includes, for example, sequence information describing operation control information such as intensity, impression period and impression timing of the pulse electric current which should be impressed to the gradient magnetic field power supply 44.

The sequence controller 56 generates the gradient magnetic fields Gx, Gy and Gz in the X-axis, Y-axis and Z-axis directions and RF pulses by driving the gradient magnetic field power supply 44, the RF transmitter 46 and the RF receiver 48 according to a predetermined sequence stored. Additionally, the sequence controller 56 receives raw data of an MR signal inputted from the RF receiver 48, and input the raw data to the operation device 60.

Figure 2:
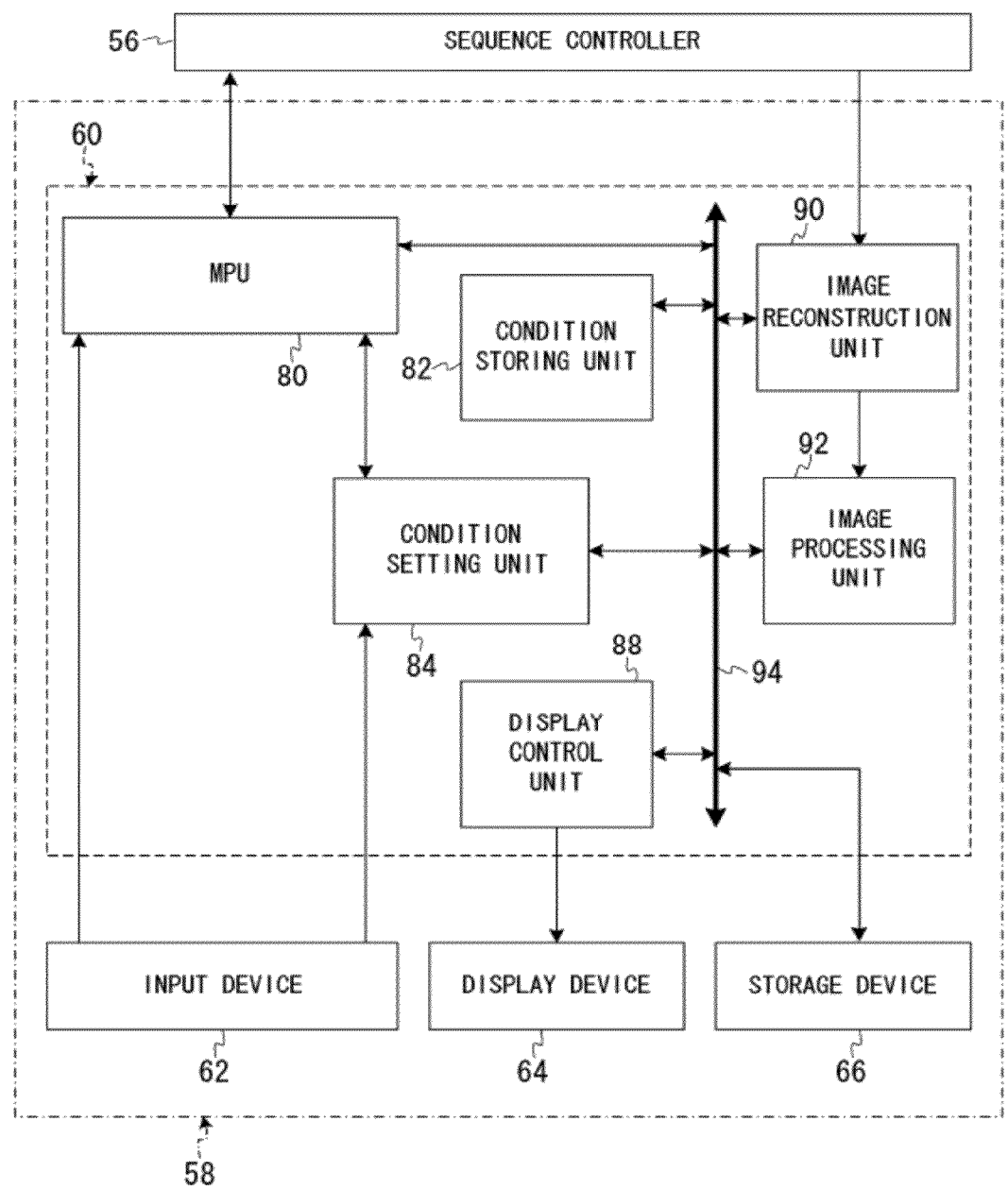
FIG. 2 is a functional block diagram of the computer 58 shown in FIG. 1.

FIG. 2 is a functional block diagram showing the details of the computer 58 (especially operation device 60) shown in FIG. 1.

As shown in FIG. 2, the operation device 60 includes an MPU (Micro Processor Unit) 80, a condition storing unit 82, a condition setting unit 84, display control unit 88, an image reconstruction unit 90, an image processing unit 92 and a system bus 94.

The MPU 80 performs system control of the magnetic resonance diagnosis apparatus 20 in setting of "data acquisition conditions", "imaging operation of scout images", "data acquisition operation in MRS" and "their post-processing", through interconnection via the system bus 94.

Additionally, the MPU 80 generates magnetic resonance spectrum data by performing processing such as Fourier transformation onto MR signals obtained by the aforementioned data acquisition.

The input device 62 provides a user with a function to set "data acquisition conditions in MRS", "imaging conditions of scout images". Additionally, the input device 62 inputs a control command such as "start of imaging of scout images" or "abort of imaging" inputted by an operator into the MPU 80.

The condition storing unit 82 stores conditions such as data acquisition conditions in MRS" and "imaging conditions of scout images".

The condition setting unit 84 obtains data acquisition conditions in MRS performed in the past from the condition storing unit 82 via the system bus 94, and receives input by an operator for setting data acquisition conditions through the input device 62.

Additionally, the condition setting unit 84 makes the condition storing unit 82 store data acquisition conditions changed by input by an operator.

Moreover, the condition setting unit 84 obtains image processing conditions performed in the past from the condition storing unit 82 via the system bus 94, and receives input by an operator for setting image processing conditions through the input device 62.

Furthermore, the condition setting unit 84 makes the condition storing unit 82 store image processing conditions changed by input by an operator.

The image reconstruction unit 90 generates image data of respective slices of an object Q by performing image reconstruction processing including such as heretofore known 2-dimensional Fourier transformation onto the raw data of MR signals inputted from the sequence controller 56. The image reconstruction unit 90 inputs the generated image data into the image processing unit 92.

The image processing unit 92 performs predetermined image processing on the inputted image data according to the image processing conditions stored in the condition storing unit 82, and stores the image data after the image processing in the storage device 66.

Here, as features of the first embodiment, at least the following two points are included.

Firstly, the condition setting unit 84 performs "tissue region extracting processing" in which "specific tissue regions" inside the body of the object Q such as organs and a backbone based on, for example, image data obtained by imaging of scout images and the like.

Secondly, the condition setting unit 84 automatically calculates an application region of each spatially selective presaturation pulse based on "data acquisition conditions" and "boundary information between the specific tissue regions such as a cephalic surface, eyeballs, a tissue region of the jaw, a water content region and a fat region obtained by the tissue region extracting processing".

This automatic calculation of an application region of each presaturation pulse is performed by the condition setting unit 84, every time conditions of a data acquisition region of MRS are renewed by an operator on a scout image displayed on the viewing surface, for example. The condition setting unit 84 inputs the calculated results into the condition storing unit 82, and makes the condition storing unit 82 store them. The "tissue region extracting processing" and "the calculating method of an application region of each presaturation pulse" will be described later with FIG. 3.

The storage device 66 stores "the image data undergone image processing by the image processing unit 92 after generated by the image reconstruction unit 90" and "the data acquisition conditions and information on the object Q (patient information) which are used for generating the image data", in the way both data are correlated with each other.

Additionally, the storage device 66 transmits the image data to the image processing unit and display control unit 88 according to command from the MPU 80.

The display control unit 88 makes the display device 64 display a screen for setting data acquisition conditions and image processing conditions stored in the condition storing unit 82. Also, the display control unit 88 makes the display device 64 display an image indicated by the image data stored in the storing device 66, as an MR (magnetic resonance) image.

Moreover, the display control unit 88 makes the display device 64 display updated (newest) data acquisition conditions and updated image processing conditions, when the data acquisition conditions or the image processing conditions stored in the condition storing unit 82 are changed.

Figure 3:
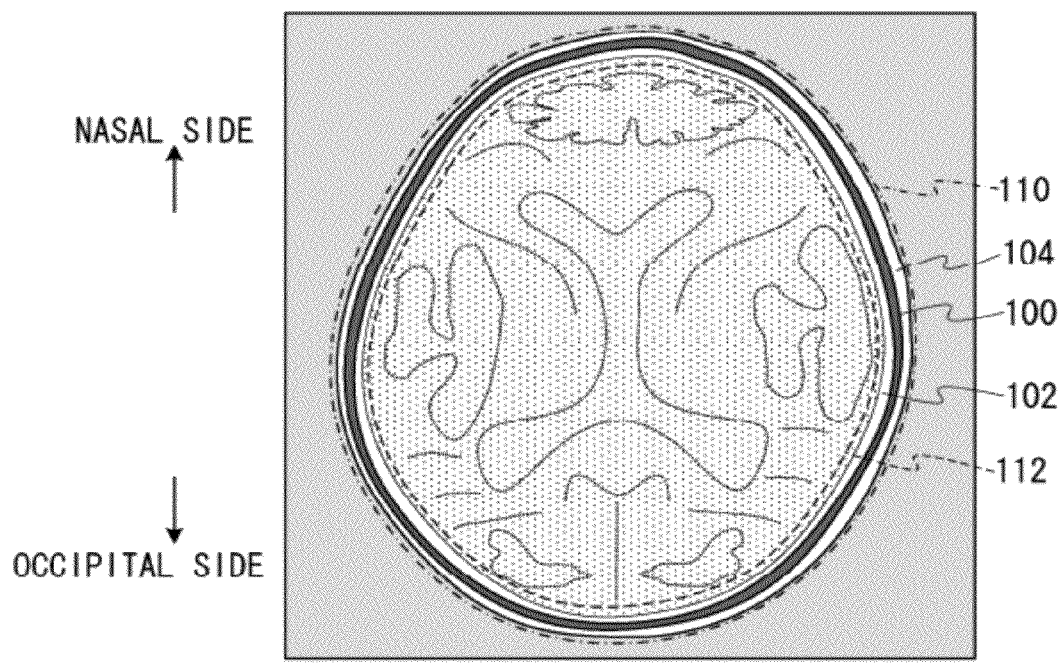
FIG. 3 is an example of a schematic diagram of a scout image for MRS targeting the head part, as a cross-sectional pattern diagram of an approximately axial cross-section.

FIG. 3 is an example of a schematic diagram of a scout image for MRS targeting the cephalic part, as a cross-sectional pattern diagram of an approximately axial cross-section.

The condition setting unit 84 performs the aforementioned tissue region extracting processing onto the image data of such a scout image.

More specifically, the condition setting unit 84 performs denoising processing such as a median filter and contraction processing on this image data. Then, the condition setting unit 84 obtains a mask image in which air parts and an object part (in this case, the cephalic part) are extracted, by performing threshold processing on the image data after the denoising processing.

Generally, a region of air or a bone in an MR image is projected as a low-level signal region (projected as black in an MR image). This is because a region of air or a bone scarcely contains water and the number of hydrogen atoms in such a region is few. Thus, a region of air or a bone in an MR image is distinguishable from adjacent regions which consist of other sort of tissue.

Therefore, in the extraction processing of a border line of a cephalic surface, boundary information of scalp can be obtained by performing threshold processing on the image data, then treating "regions linked to low-level signal areas (black areas) in the outer rim of the image" as an air regions, and finally performing edge extracting processing using a differential filter.

Note that though it is not shown in the cross-section in FIG. 3, border line extraction of each region such as an eye and a jaw is capable by using image processing of prior art. In this image processing, for example, "template matching between an obtained image and a standard human skeleton model including a shape and size of a cranial bone and the like" is performed.

By performing the above image processing, (1) a bone region of a cephalic outline form (exterior edge), (2) a fat region outside the bone region and (3) a fat region inside the bone region can be extracted as examples of the aforementioned "specific tissue regions".

In FIG. 3, the annular region, which is blackly painted out, is the osteal region 100 (a cranial bone) in the cephalic part extracted by the above image processing. The annular white region adjacent to the inner side of the osteal region 100 is the fat region 102 extracted in the similar way. The annular white region adjacent to the outer side of the osteal region 100 is the fat region 104 extracted in the similar way.

Here, because intensity of MR signals in the fat region 102, 104 is strong, it is preferable to avoid the fat region 102, 104 in determination of data acquisition in MRS.

That is, the annular dashed-dotted line outside the fat region 104 is an exterior border line 110 of the "region to be avoided" described later, and the annular dashed line inside the fat region 102 is an interior border line 112 of the "region to be avoided". The condition setting unit 84 calculates (extracts) the interior border line 112 and the exterior border line 110 of the "region to be avoided" in this way.

Figure 4:
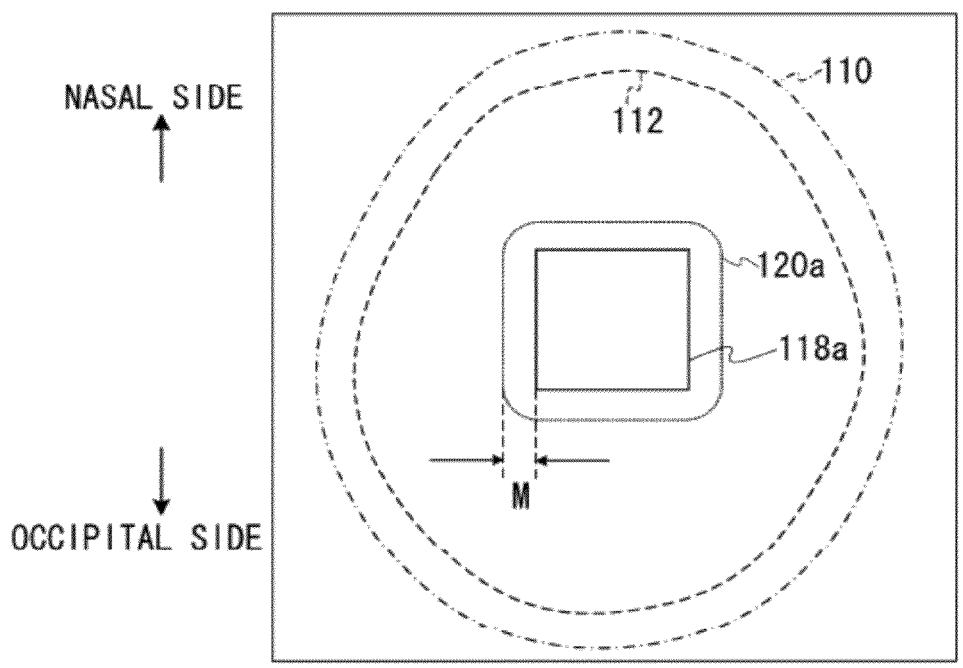
FIG. 4 is a pattern diagram showing the state of the scout image, on which an exterior border line and an interior border line of a "region to be avoided" are superimposed and the first example of a data acquisition region of MRS is set.

FIG. 4 is a pattern diagram showing the state of the scout image, on which the exterior border line 110 and the interior border line 112 of the "region to be avoided" are superimposed and the first example of the data acquisition region of MRS is set.

In the first example, as shown in FIG. 4, the data acquisition region 118a in MRS overlaps on neither the exterior border line 110 nor interior border line 112, and is set to approximately midst of the cephalic part. Note that the data acquisition region may be a single voxel or a multi-voxel.

In this embodiment, the judging region 120a is determined and defined as follows. That is, the outer border of the data acquisition region 118a is extended by a margin M which is a constant interval, and the hollowed region by pulling "the original data acquisition region 118a" out of "the extended data acquisition region 118a by the margin M" is defined as the judging region 120a.

The judging region 120a is a judgment criterion region for determining (judging) whether acquired MR signals are influenced by "adjacent regions contributory to artifact" or not, when the MR signals are acquired from the data acquisition region 118a (currently) set.

Here, for simplicity of explanation, as an example of "adjacent regions contributory to artifact", only the in-between region between the exterior border line 110 and the interior border line 112 is considered, and this region is hereinafter referred to as the "region to be avoided".

Then, in the first example shown in FIG. 4, the condition setting unit 84 determines (judges) that application of a presaturation pulse is unnecessary, because the judging region 120a does not overlap on the "region to be avoided".

If the value of the above margin M is functionally referred to, an average interval between "the outer border of the region to be avoided" and "the outer border of the range which influence of strong MR signals of the region to be avoided extends over" may be determined as the margin M.

Influence of the "region to be avoided" on the data acquisition region can be reduced by setting the margin M in this way and using a presaturation pulse in the way explained in the following examples, when the judging region 120a overlaps on the "region to be avoided".

Figure 5:
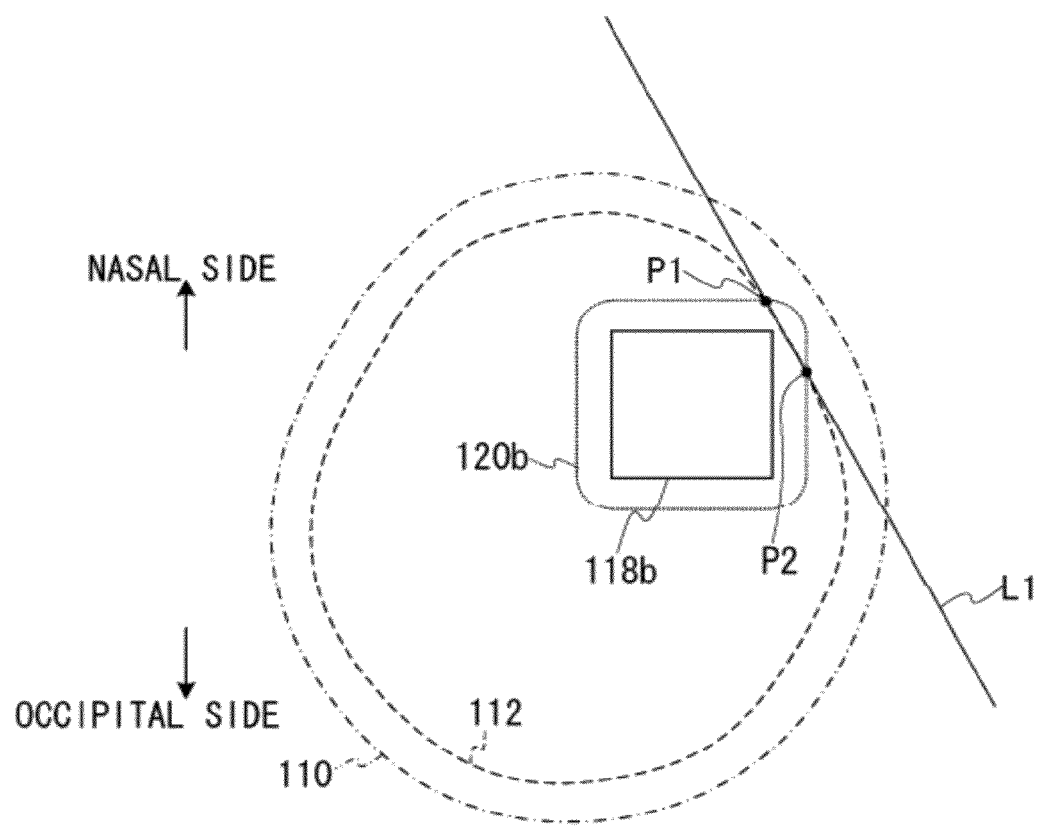
FIG. 5 is a pattern diagram showing the state of the scout image, on which the exterior border line and the interior border line are superimposed and the second example of a data acquisition region of MRS is set.

FIG. 5 is a pattern diagram showing the state of the scout image, on which the exterior border line 110 and the interior border line 112 are superimposed and the second example of the data acquisition region of MRS is set.

Figure 6:
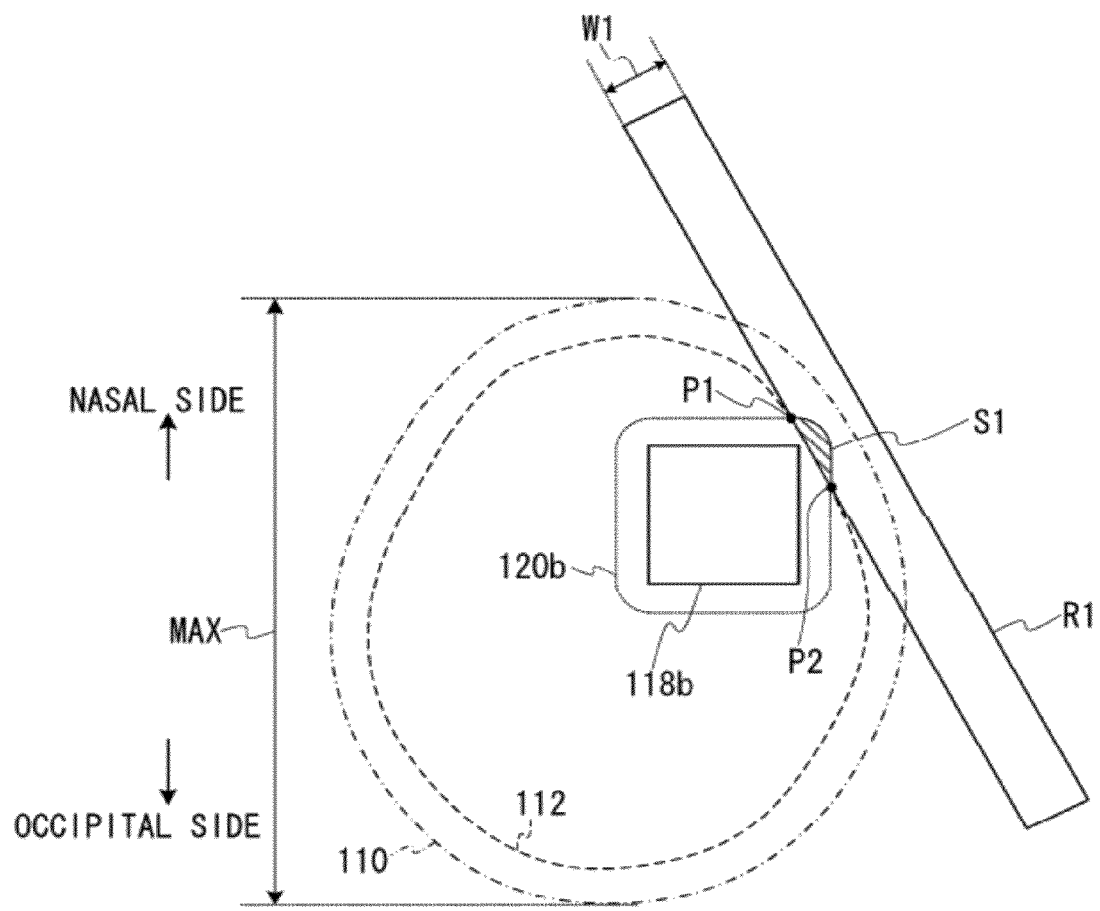
FIG. 6 is a pattern diagram of the displayed scout image, on which an application region of a presaturation pulse automatically calculated in the second example is superimposed.

FIG. 6 is a pattern diagram of the displayed scout image, on which an application region of a presaturation pulse automatically calculated in the second example is superimposed.

In the second example, though the data acquisition region 118b does not overlap on the "region to be avoided", the judging region 120b overlaps on only one section of the "region to be avoided". Thus, the condition setting unit 84 automatically calculates an application region of a presaturation pulse.

In this case, the condition setting unit 84 calculates the application region of a presaturation pulse, so that the application region completely covers the overlapped region S1 (see FIG. 6 described later) which is a crossover region of the judging region 120b and the "region to be avoided".

Then, the condition setting unit 84 defines the two intersection points between the interior border line 112 and the outer border of the judging region 120b as intersection points P1 and P2, respectively.

Next, the condition setting unit 84 calculates the straight line L1 which passes the intersection points P1 and P2. As to the length of the straight line L1, it is explained later. FIG. 5 shows the state after the above calculation.

Next, the condition setting unit 84 calculates the rectangular region R1 whose one side is the straight line L1, so that the region R1 satisfies the following two conditions on the scout image.

Firstly, "the side opposed to the straight line L1 in the rectangle of the region R1" is located outside the exterior border line 110 (i.e. opposite to the inside of the object Q).

Secondly, the length of the straight line L1 (see FIG. 5) is set longer than the maximum width MAX of the "region to be avoided" projected on the scout image (see FIG. 6). For example, the straight line L1 is set approximately 1.2 times longer than the maximum width MAX.

That is, "the region R1 on which presaturation pulse is applied" is automatically calculated, so that it extends along the straight line L1 in terms of direction and its width W1 (see FIG. 6) extends beyond the exterior border line 110. Thereby, the presaturation pulse is applied on the "region to be avoided" near the overlapped region S1, and influence of the region contributory to artifact is surely reduced.

Note that the condition setting unit 84 automatically calculates the above application region, so that the application region becomes, for example, a three-dimensionally rectangular parallelopiped region. In other words, the above application region is calculated, so that the region R1 becomes one of transverse sections of the entire application region of the presaturation pulse. In this point, the same applies to other examples described later.

Figure 7:
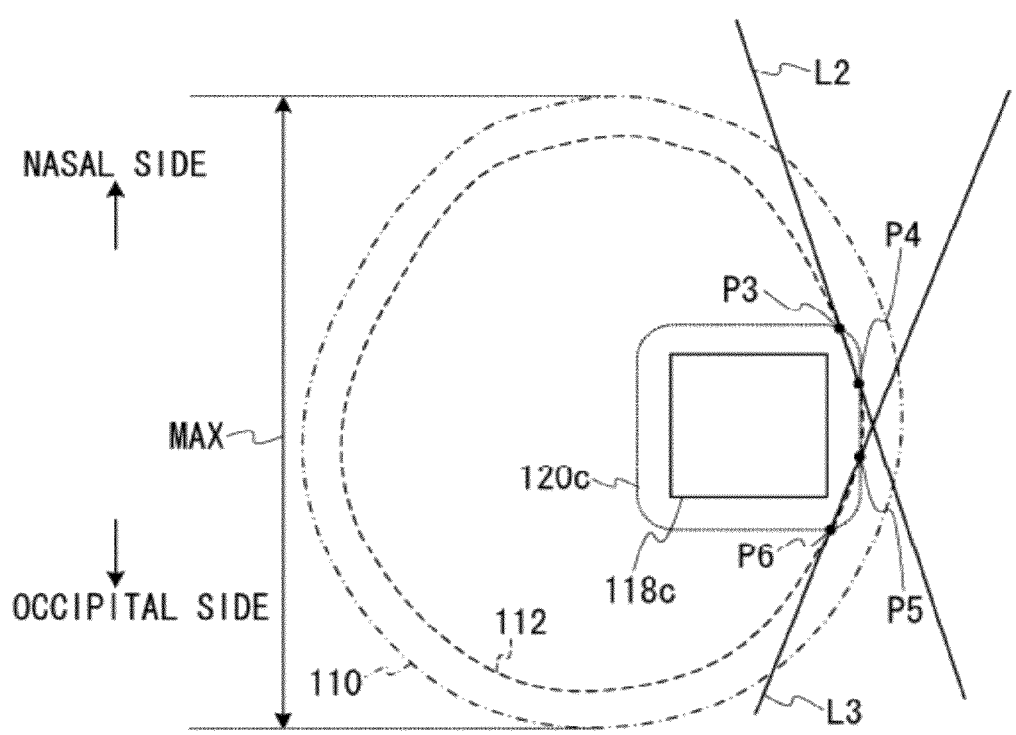
FIG. 7 is a pattern diagram showing the state of the scout image, on which the exterior border line and the interior border line are superimposed and the third example of a data acquisition region of MRS is set.

FIG. 7 is a pattern diagram showing the state of the scout image, on which the exterior border line 110 and the interior border line 112 are superimposed and the third example of a data acquisition region of MRS is set.

Figure 8:
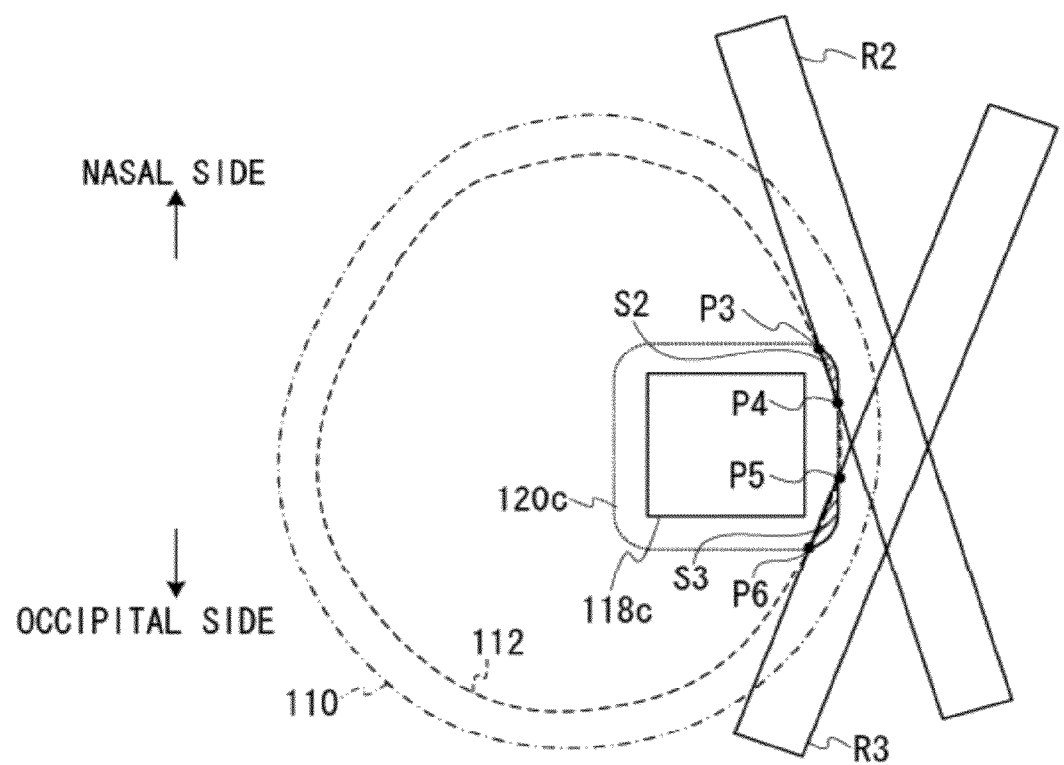
FIG. 8 is a pattern diagram of the displayed scout image, on which application regions of respective presaturation pulses automatically calculated in the third example are superimposed.

FIG. 8 is a pattern diagram of the displayed scout image, on which application regions of respective presaturation pulses automatically calculated in the third example is superimposed.

In the third example, the data acquisition region 118c does not overlap on the "region to be avoided", but the judging region 120c overlaps on two sections of the "region to be avoided".

Thus, the condition setting unit 84 automatically calculates an application region of a presaturation pulse. In this case, the condition setting unit 84 calculates application regions of presaturation pulses, so that the application regions completely covers overlapped regions S2 and S3 (see FIG. 8) in the way similar to the second example. Here, each of the overlapped regions S2 and S3 is a crossover region of the judging region 120c and the "region to be avoided".

More specifically, the condition setting unit 84 defines 4 intersection points between the interior border line 112 and the outer border of the judging region 120c as intersection points P3, P4, P5 and P6 from the top side in sequence.

Next, the condition setting unit 84 calculates the straight line L2 which passes the intersection point P3 and P4, and calculates the straight line L3 which passes the intersection point P5 and P6. As to the length of the straight line L2, and L3, both of them are set longer than the maximum width MAX of the "region to be avoided" in the way similar to the second example (for instance, they are set approximately 1.2 times longer than the maximum width MAX). In this point, the same applies to the straight lines L4, L5, L6, L11, L12, L13, L14, L15, L16, L17 and L18 of other examples described later.

FIG. 7 shows the state just after the above processing.

Next, the condition setting unit 84 calculates "the rectangular region R2 whose one side is the straight line L2" on the scout image, so that the following condition is satisfied like in the aforementioned way. That is, the side opposed to the straight line L2 in the rectangle of the region R2 is located outside the exterior border line 110 (opposite side of the inside of the object Q, see FIG. 8).

The condition setting unit 84 calculates "the rectangular region R3 whose one side is the straight line L3" on the scout image in the similar way. Thereby, the overlapped regions S2 and S3 of the judging region 120c and the "region to be avoided" are completely included within the application regions of presaturation pulses.

Then, the condition setting unit 84 automatically calculates the application region of the first presaturation pulse, so that the application region becomes, for example, a three-dimensionally rectangular parallelopiped region and the region R2 becomes one of transverse sections of the entire application region of the first presaturation pulse.

Additionally, the condition setting unit 84 automatically calculates the application region of the second presaturation pulse in the similar way, so that the region R3 becomes one of transverse sections of the entire application region of the second presaturation pulse.

The first presaturation pulses is applied at the timing different from that of the second presaturation pulses, for example. That is, a presaturation pulse is applied two times to the overlapped region of the region R2 and R3.

However, even if a presaturation pulse is applied two times or more than two times to the same region, there in no problem in terms of the effect of magnetically saturating nuclear spin of the application region. In this point, the same applies to other examples described later.

Figure 9:
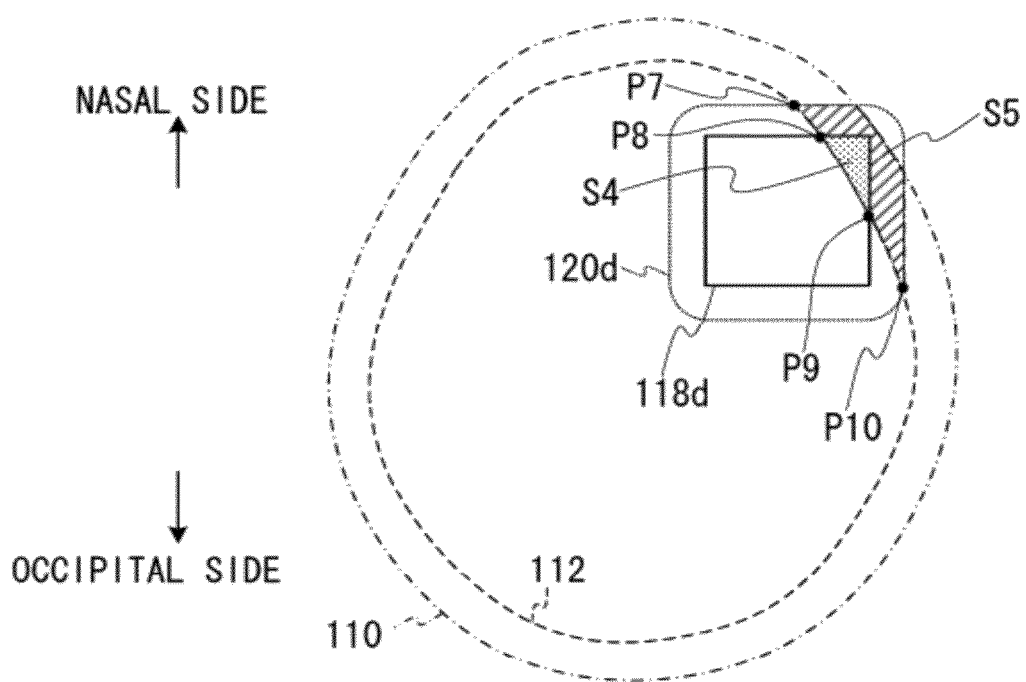
FIG. 9 is a pattern diagram showing the state of the scout image, on which the exterior border line and the interior border line are superimposed and the fourth example of a data acquisition region of MRS is set.

FIG. 9 is a pattern diagram showing the state of the scout image, on which the exterior border line 110 and the interior border line 112 are superimposed and the fourth example of the data acquisition region of MRS is set.

Figure 10:
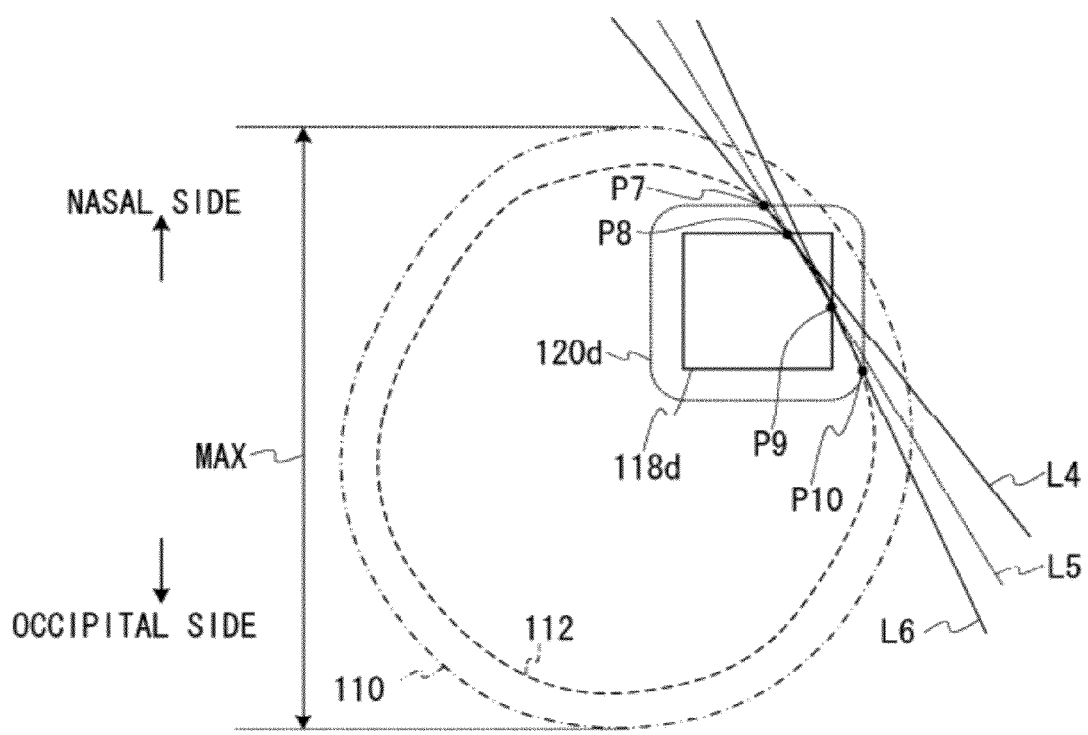
FIG. 10 is a pattern diagram of the displayed scout image, on which "a plurality of straight lines calculated in the calculation process of an application region of each presaturation pulse in the fourth example" are superimposed.

FIG. 10 is a pattern diagram of the displayed scout image, on which "a plurality of straight lines calculated in the calculation process of application regions of respective presaturation pulse in the fourth example" are superimposed.

Figure 11:
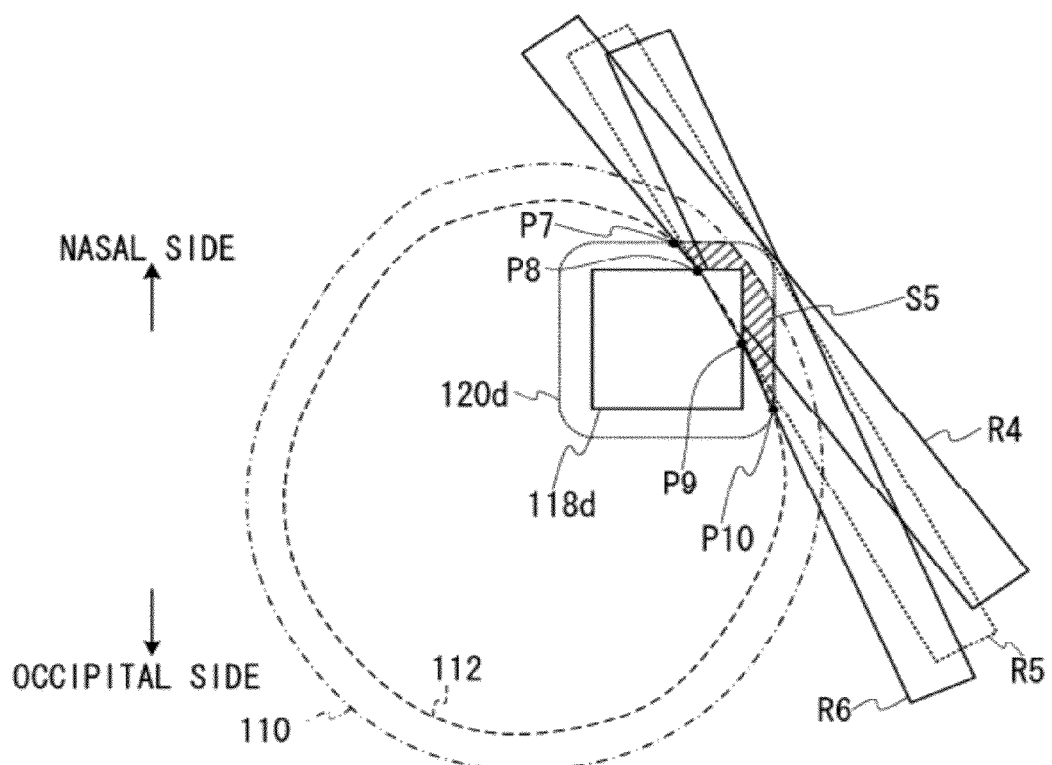
FIG. 11 is a pattern diagram of the displayed scout image, on which application regions of respective presaturation pulses automatically calculated in the fourth example are superimposed.

FIG. 11 is a pattern diagram of the displayed scout image, on which application regions of respective presaturation pulses automatically calculated in the fourth example is superimposed.

The fourth example shows a calculation method for an application region of each presaturation pulse, when the data acquisition region 118d overlaps on the "region to be avoided". Here, the crossover (overlapped) region of "the data acquisition region 118d and the region to be avoided" is defined as the overlapped region S4. And the overlapped region of "the judging region 120d and the region to be avoided" is defined as the overlapped region S5 (see FIG. 9).

In this case, the condition setting unit 84 calculates an application region of each presaturation pulse in the way similar to the aforementioned manner, so that the overlapped regions S4 and S5 are completely included in the application regions.

More specifically, the condition setting unit 84 determines and defines the four intersection points between the interior border line 112 and the border of the judging region 120d as the intersection points P7, P8, P9 and P10 from the top side in sequence. The intersection point P8 and P9 are also intersection points between the interior border line 112 and the outer border of the data acquisition region 118d.

Next, the condition setting unit 84 calculates "the straight line L4 which passes intersection points P7 and P8", "the straight line L5 which passes intersection points P8 and P9" and "the straight line L6 which passes intersection points P9 and P10", so that each length of the straight lines L4, L5 and L6 becomes the aforementioned length. FIG. 10 shows this state.

Note that each length of the straight lines L4 to L6 do not need to be the same. But it is desirable to set each length of the straight lines L4 to L6, so that influence of artifact is sufficiently suppressed by applying each presaturation pulse to the "region to be avoided" near the overlapped regions S4 and S5.

Next, the condition setting unit 84 calculates "the rectangular region R4 whose one side is the straight line L4" on the scout image, so that the side opposed to the straight line L4 in the rectangle of the region R4 is located outside the exterior border line 110. This calculation method is similar to the aforementioned method.

In this way, the condition setting unit 84 calculates "the rectangular region R5 whose one side is the straight line L5" and "the rectangular region R6 whose one side is the straight line L6" on the scout image. FIG. 11 shows the state just after this calculation.

Then, the condition setting unit 84 automatically calculates respective application regions of three presaturation pulses, so that each application region becomes a three-dimensionally rectangular parallelopiped region and the respective regions R4, R5 and R6 become one of transverse sections of the entire application region of each presaturation pulse. Thereby, the overlapped regions S4 and S5 of the "region to be avoided" and "the data acquisition region 118d or the judging region 120d" are completely included in application regions of the presaturation pulses.

Figure 12:
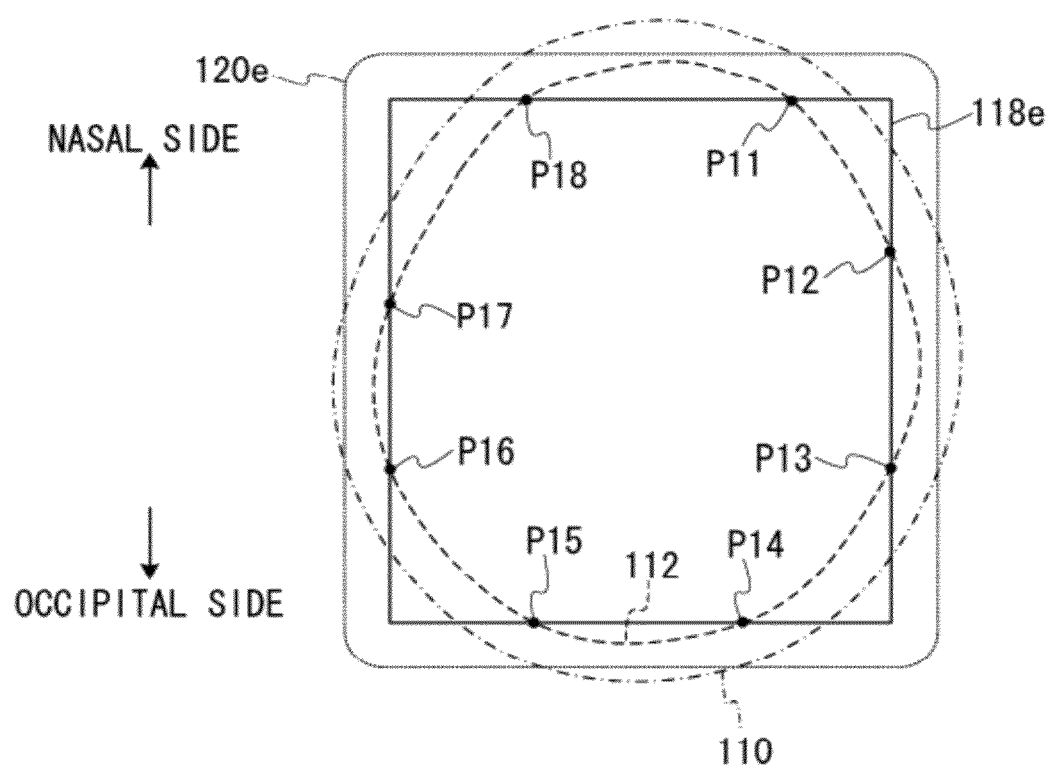

FIG. 12 is a pattern diagram showing the state of the scout image, on which the exterior border line 110 and the interior border line 112 are superimposed and the fifth example of the data acquisition region of MRS is set.

Figure 13:
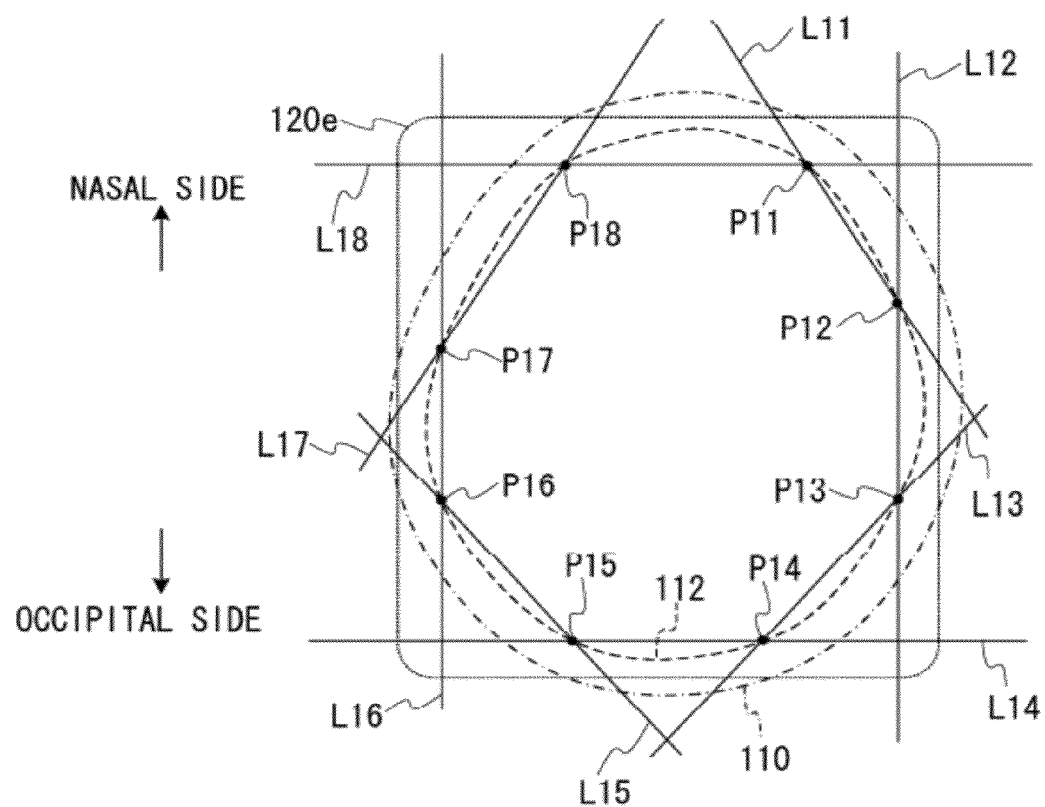
FIG. 13 is a pattern diagram of the displayed scout image, on which "a plurality of straight lines calculated in the calculation process of an application region of each presaturation pulse in the fifth example" are superimposed.

FIG. 13 is a pattern diagram of the displayed scout image, on which "a plurality of straight lines calculated in the calculation process of application regions of respective presaturation pulses in the fifth example" are superimposed.

Figure 14:
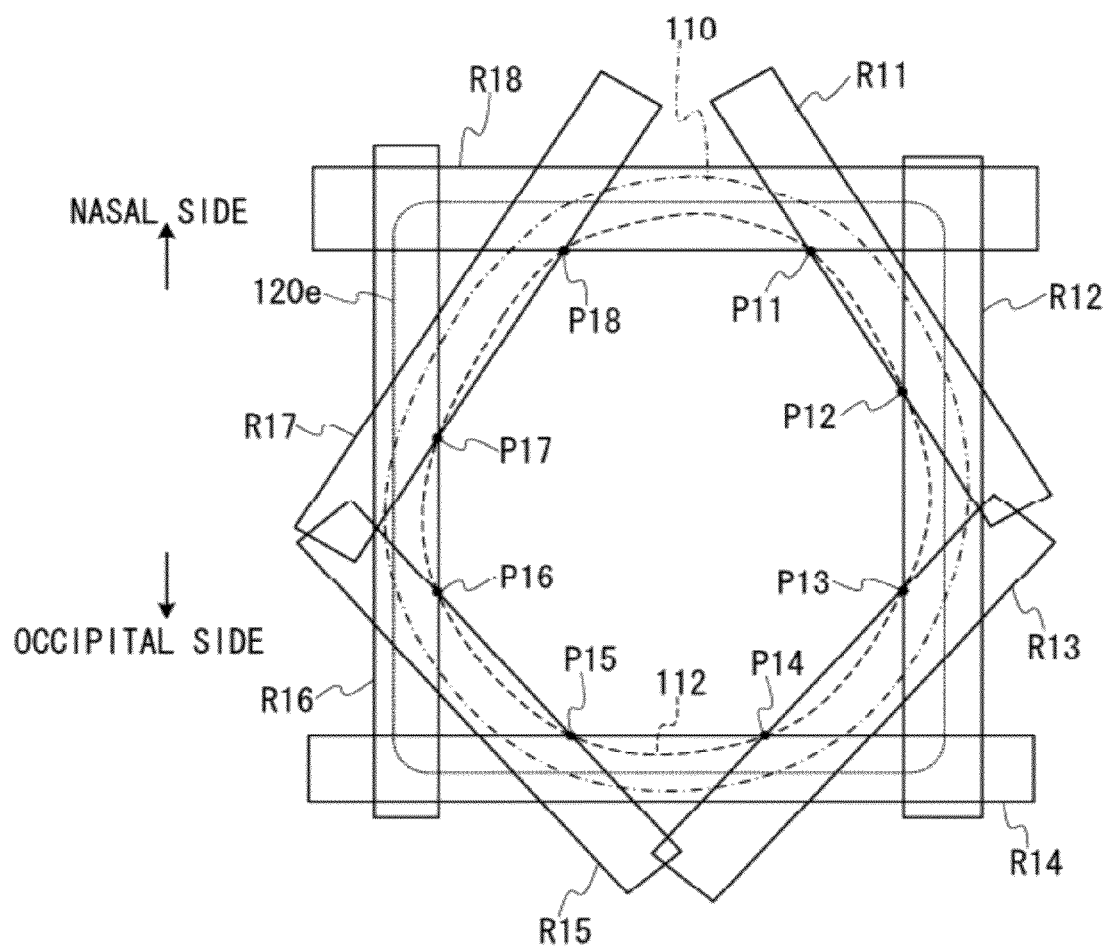
FIG. 14 is a pattern diagram of the displayed scout image, on which application regions of respective presaturation pulses automatically calculated in the fifth example are superimposed.

FIG. 14 is a pattern diagram of the displayed scout image, on which application regions of respective presaturation pulses automatically calculated in the fifth example is superimposed.

The fifth example shows calculation method for application regions of presaturation pulses, when the data acquisition region 118e overlaps on plural sections of the "region to be avoided". In this case, though the number of application regions of the total presaturation pulses, and the number of application times increase, the calculation method is similar to the aforementioned method.

More specifically, the intersection points between the data acquisition region 118e and the interior border line 112 are defined as the intersection points P11, P12, P13, P14, P15, P16, P17 and P18 circularly in sequence (see FIG. 12). Here, the intersection points between the interior border line 112 and the judging region 120e are not considered.

Next, the condition setting unit 84 defines the straight line passing the intersection points P11 and P12 as L11, the straight line passing the intersection points P12 and P13 as L12, the straight line passing the intersection points P13 and P14 as L13, the straight line passing the intersection points P14 and P15 as L14, the straight line passing the intersection points P15 and P16 as L15, the straight line passing the intersection points P16 and P17 as L16, the straight line passing the intersection points P17 and P18 as L17, and the straight line passing the intersection points P18 and P11 as L18, respectively (see FIG. 13). As to each length of the straight lines L11 to L18, it is similar to the aforementioned straight lines such as L1.

Next, the condition setting unit 84 calculates "the rectangular region R11 whose one side is the straight line L11" on the scout image, so that "one side opposed to the straight line L11 in the rectangle of the region R11" is located outside the exterior border line 110. This calculation method is similar to the aforementioned way.

The condition setting unit 84 calculates "the rectangular region R12 whose one side is the straight line L12", "the rectangular region R13 whose one side is the straight line L13", "the rectangular region R14 whose one side is the straight line L14", "the rectangular region R15 whose one side is the straight line L15", "the rectangular region R16 whose one side is the straight line L16", "the rectangular region R16 whose one side is the straight line L16", "the rectangular region R17 whose one side is the straight line L17", and "the rectangular region R18 whose one side is the straight line L18" in the way similar to the aforementioned method.

Then, the condition setting unit 84 automatically calculates the application regions of the eight presaturation pulses, so that the application regions become, for example, three-dimensionally rectangular parallelepiped regions and each of the region R11 to R18 becomes one of transverse sections of the entire application region of the presaturation pulses. Thereby, the overlapped (crossover) region of the "region to be avoided" and "the data acquisition region 118e or the judging region 120e" is completely included in the application regions of the presaturation pulses.

As shown in the above five examples, the condition setting unit 84 automatically determines (judges) whether a presaturation pulse should be applied or not, based on "the image data of the scout image, a position of the data acquisition region and a position of the region to be avoided". If it is determined that a presaturation pulse should be applied, the condition setting unit 84 automatically calculates an application region of each presaturation pulse, so that the number of the applied presaturation pulse(s) is in accordance with the position of the data acquisition region and the position of the "region to be avoided".

The application regions of the presaturation pulses automatically calculated in the way mentioned in the above five examples are stored in the condition storing unit 82 as the data acquisition conditions of MRS, and are displayed on the display device 64. An operator can change the displayed application region of each presaturation pulse as needed.

Figure 15:
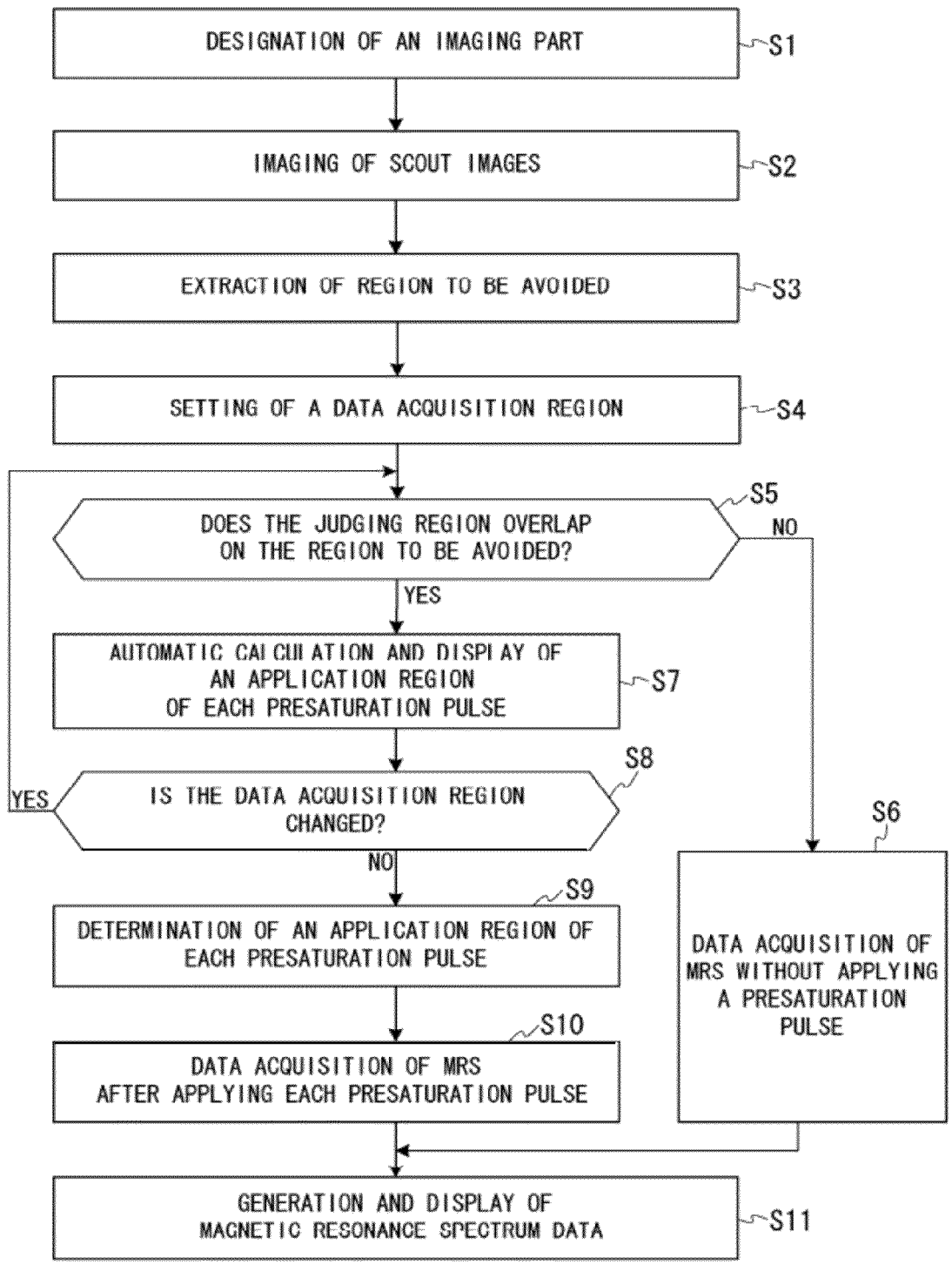
FIG. 15 is a flowchart illustrating a flow of a process performed by the magnetic resonance diagnosis apparatus of the first embodiment.

FIG. 15 is a flowchart illustrating a flow of a process performed by the magnetic resonance diagnosis apparatus 20 of the first embodiment. In the following, according to the step numbers in the flowchart shown in FIG. 15, an operation of the magnetic resonance diagnosis apparatus 20 will be described by referring to the aforementioned FIGS. 1 to 14 as required.

[step S1] the magnetic resonance diagnosis apparatus 20 performs initial setting based on information on the data acquisition conditions of MRS inputted by an operator via the input device 62. Additionally, an imaging part is designated via the input device 62. The imaging part means, for example, which part of an object is set as an imaging region to create picture such as a lumbar division and a pectoral region. Here, as an example, cephalic MRS examination is designated.

The condition setting unit 84 stores the cephalic MRS in the condition storing unit 82 as the data acquisition condition. The condition setting unit 84 obtains the data acquisition conditions of the cephalic MRS set in past times, and obtains conditions inputted by an operator from the input device 62.

The condition setting unit 84 sets imaging conditions of "a cross-section slightly tilted from an axial cross-section in the patient coordinate system" as imaging condition of scout images, because the cephalic MRS examination is designated.

Here, as an example, the X-axis, the Y-axis and the Z-axis of the patient coordinate system are defined as follows. That is, horizontal direction of the object Q is defined as X-axis direction. And front-to-rear direction of the object Q is defined as Y-axis direction, assuming that the abdominal side is the front and the back side is the rear. And topside-to-downside direction of the object Q is defined as Z-axis direction, assuming that the head side is topside and foot side is downside along the direction of a straight-line approximation of the backbone.

Additionally, an X-Y plane of the patient coordinate system is defined as an axial plane, an X-Z plane of the patient coordinate system is defined as a coronal plane, a Y-Z plane of the patient coordinate system is defined as a sagittal plane. When the object Q is set on the bed 32 with "its body axis direction from the head to the foot" laid along the Z-axis of the apparatus coordinate system and imaging is performed under this pose, an axial plane of the patient coordinate system accords with an X-Y plane of the apparatus coordinate system.

Additionally, the condition setting unit 84 sets imaging conditions of fat weighted images and water weighted images in order to obtain images suitable for extraction of tissue regions. The condition setting unit 84 obtains the same imaging conditions from the condition storing unit 82, and displays these imaging conditions on the display device 64 via the display control unit 88. An operator can change the displayed imaging conditions via the input device 62. After this, the process proceeds to Step S2.

Because MR signals from fat regions are inhibited in this example, at least some of the plurality of scout images are preferably imaged as the above fat weighted images by using an appropriate sequence such as Dixon method. Extraction accuracy is more enhanced by extracting fat regions from a fat weighted image than extracting fat regions from "an image in which fat regions are weakly depicted". By including "fat regions accurately extracted like this" in the region to be avoided and calculating an application region of each presaturation pulse, artifact is more effectively suppressed. This applies to the second to fifth embodiments described later.

[step S2] Imaging of the plurality of scout images used for positioning of the data acquisition region of MRS is performed.

More specifically, a static magnetic field is formed in the imaging space by the static magnetic field magnet 22 excited by the static magnetic field power supply 40. In addition, electric current is supplied from the shim coil power supply 42 to the shim coil 24, thereby the static magnetic field formed in the imaging space is uniformed.

Then, when the MPU 80 receives a command of start of imaging from the input device 62, the MPU 80 inputs imaging conditions including a pulse sequence into the sequence controller 56.

Then, the sequence controller 56 drives the gradient magnetic field power supply 44, the RF transmitter 46 and the RF receiver 48 according to the inputted pulse sequence, thereby a gradient magnetic field is formed in the imaging region, where the object Q is set, and RF pulses (signals) are generated from the RF coil 28.

Then, MR signals generated by nuclear magnetic resonance inside the object Q are received by the RF coil 28 and detected by the RF receiver 48. The RF receiver 48 performs the predetermined signal processing on the detected MR signals and then performs A/D conversion onto the MR signals to generate raw data, which are digital data of the MR signals. The RF receiver 48 inputs the generated raw data to the sequence controller 56. The sequence controller 56 inputs the raw data to the image reconstruction unit 90.

The image reconstruction unit 90 arranges the raw data in the k-space in its internal memory as k-space data.

The image reconstruction unit 90 reconstructs image data by performing image reconstruction processing including Fourier transformation on the k-space data, and the image processing unit 92 generates image data for two-dimensional display by performing predetermined image processing on the reconstructed image data. The image processing unit 92 stores the image data for two-dimensional display in the storage device 66. After this, the process proceeds to Step S2.

[step S3] The condition setting unit 84 extracts the cephalic surface and "the interior border line and the external border line of the region to be avoided", by performing the aforementioned tissue region extracting processing on the image data of the scout images. As to this extraction method, it is explained previously using such as FIG. 3. The condition setting unit 84 stores the boundary information on the cephalic surface and the "region to be avoided". After this, the process proceeds to Step S4.

[step S4] The MPU 80 selects a scout image suitable for positioning out of the scout images imaged in step S2. The above "suitable for positioning" means, for example, a scout image in which a lesion area is projected with the maximum dimension. For example, by performing pattern matching with an axial cross-section image of a normal object preliminarily stored in the storage device 66, "a scout image which has the biggest difference from the above image of a normal object" can be selected as a scout image projecting a lesion area (suitable for positioning).

The MPU 80 makes the display device 64 display the selected scout image by controlling the display control unit 88. In this display, like the schematic diagram of FIG. 4 as an example, the interior border line 112 and the exterior border line 110 of the "region to be avoided" are distinguishably superimposed on the selected scout image, so that the interior border line 112 and the exterior border line 110 are distinguishably displayed with mutually different chromatic colors.

An operator can change display color and degree of transparency of the "region to be avoided" which is the region between the interior border line 112 and the exterior border line 110, via the input device 62. Additionally, an operator can switch nondisplay or display of the "region to be avoided" via the input device 62. Moreover, an operator can cancel the selected scout image and can select another scout image for positioning of the data acquisition region once again via the input device 62.

After this, an operator sets the data acquisition region on the selected and displayed scout image. Note that the data acquisition region may be a single voxel or multi-voxel. After this, the process proceeds to Step S5.

[step S5] The condition setting unit 84 sets the aforementioned judging region (120a to 120e in FIG. 4 to FIG. 14, for example) based on "the image data of the selected scout image" and "the data acquisition region (118a to 118e in FIG. 4 to FIG. 14, for example) set on the selected scout image". The condition setting unit 84 determines (judges) whether the judging region overlaps on the "region to be avoided" extracted in step S3 or not, and transmits the judgment result to the MPU 80.

If the judging region overlaps on the "region to be avoided", the MPU 80 makes the process of the magnetic resonance diagnosis apparatus 20 proceed to step S7. If this is not the case, the MPU makes the process of the magnetic resonance diagnosis apparatus 20 proceed to step S6.

[step S6] If the process proceeds to this step S6, the judging region does not overlap on the "region to be avoided". Therefore, it is estimated that the data acquisition region is not influenced by artifact from the "region to be avoided". Thus, the MPU 80 inputs "a pulse sequence for MRS in which a presaturation pulse is not applied" into the sequence controller 56.

Based on start-up of the pulse sequence, pulse current is transmitted from the gradient magnetic field power supply 44 to the gradient coil 26. Thereby, the gradient magnetic field Gss in the slice selection direction and the gradient magnetic field Gpe in the phase encoding direction are applied in the imaging region. RF pulses are generated from the RF coil 28 due to the RF pulse current from the RF transmitter 46 applied at appropriate timings during this period, and thereby nuclear spins in the data acquisition region selected by the magnetic field applied by the gradient coil 26 are magnetically excited.

The MR signals generated by the above excitation are detected by the RF coil 28 again. The detected MR signals are transmitted to the sequence controller 56 via the RF receiver 48. The sequence controller 56 inputs the transmitted MR signals into the MPU 80. After this, the process proceeds to Step S11.

[step S7] The condition setting unit 84 automatically calculates an application region of each presaturation pulse based on the image data of the selected scout image, the data acquisition region set on the selected scout image and the "region to be avoided" extracted in step S3. This calculation method is discussed previously with FIG. 5 to FIG. 14.

The condition setting unit 84 inputs the calculated application region of each presaturation pulse into the display control unit 88. Then, the display control unit 88 makes the display device 64 distinguishably display the application region of each presaturation pulse, in the way the application region of each presaturation pulse is superimposed on the scout image.

Note that the interior border line and the exterior border line of the region to be avoided are also distinguishably superimposed on the selected scout image, so that the interior border line and the exterior border line are distinguishably displayed with mutually different chromatic colors. After this, the process proceeds to Step S8.

[step S8] An operator can change the position, the direction and the size of the data acquisition region, referring to the data acquisition region superimposed and displayed on the scout image with the application region of each presaturation pulse.

If the data acquisition region is changed by an operator via the input device 62, the process returns to step S5. If the data acquisition region is not changed, the process proceeds to step S9.

That is, every time an operator changes the position, the direction or the size of the data acquisition region, the condition setting unit 84 determines (judges) whether a presaturation pulse should be applied or not, based on the updated data acquisition region (in step S5), and calculates an application region of each presaturation pulse again (in step S7).

[step S9] An operator can change the position, the direction and the size of the application region of each presaturation pulse, referring to the application region of each presaturation pulse superimposed and displayed on the scout image with the data acquisition region. If an operator changes the application region of the presaturation pulse via the input device 62, the MPU finally determines that the changed region(s) is (are) the application region(s) of the presaturation pulse.

If the application region of any presaturation pulse is not changed by an operator, the MPU 80 finally determines that the application region of each presaturation pulse is the region automatically calculated by the condition setting unit 84, and makes the condition storing unit 82 store them. After this, the process proceeds to step S10.

[step S10] The MPU 80 inputs "a pulse sequence for MRS in which a presaturation pulse determined in step S9 is applied" into the sequence controller 56.

Then, after the application of the presaturation pulse, nuclear spins in the data acquisition region are magnetically excited, and MR signals generated due to this excitation are inputted to the MPU 80. After this, the process proceeds to step S11.

[step S11] The MPU 80 generates magnetic resonance spectrum data indicative of concentration distribution per metabolic substance in the data acquisition region, by performing processing such as Fourier transformation onto the MR signals inputted in step S6 or step S10.

The foregoing is a description of an operation of the magnetic resonance diagnosis apparatus 20 according to the first embodiment.

According to the first embodiment, an application region of each presaturation pulse for suppressing artifact in MRS is automatically calculated. Therefore, labor for setting conditions of a presaturation pulse can be saved. As a result, throughput of an MRS examination can be improved.

Moreover, according to the first embodiment, the "region to be avoided" is distinguishably superimposed and displayed on the scout image, when an operator sets the data acquisition region by using the scout image (see step S4). Therefore, an operator can intentionally avoid influence of strong MR signals of the "region to be avoided", by separating the data acquisition region from the "region to be avoided" in setting.

Note that it may be automatically determined that each presaturation pulse is applied to the application region automatically calculated by the condition setting unit 84, without giving an operator chance to change the application region of each presaturation pulse automatically calculated. The same applies to each of the following embodiments.

<Second Embodiment>

In the second embodiment, number of applied presaturation pulses is optimized. If only the following two points are considered, it is desirable to make number of applied presaturation pulses as less as possible.

Firstly, if the number of applied presaturation pulses is large, SAR (Specific Absorption Ratio) becomes high and this may make imaging sequence inexecutable according to conditions of the following sequence. Note that SAR means energy of RF pulses absorbed by 1 kg of living tissue.

Secondly, if a large number of spatially selective presaturation pulses are applied, there is a concern that a presaturation pulse for water suppression become less effective. This is because, in many cases, spatially selective presaturation pulses are applied after the application of a frequency-selective presaturation pulse for suppressing MR signals from water.

However, when presaturation pulses are applied eight times due to the large overlapped area between the data acquisition region and the "region to be avoided" like in the aforementioned FIG. 14 as an example, there is a concern that influence of artifact cannot be sufficiently reduced, in the case of drastically decreasing the number of applied presaturation pulses.

Here, if the existence of the "region to be avoided" is not considered, "non-application of a presaturation pulse on the data acquisition region" is preferable in terms of acquiring magnetic spectrum data from the data acquisition region more precisely. Therefore, the dimension of "the region, which undergoes the application of a presaturation pulse and is located inside the data acquisition region as well as outside the region to be avoided", is preferably small. "The region which undergoes the application of a presaturation pulse and is located inside the data acquisition region as well as outside the region to be avoided" is hereinafter referred to as a "sacrifice region".

Considering the aforementioned points, any one of the SAR priority mode, the artifact suppression mode and the operator selecting mode can be selected in the second embodiment, and the second embodiment attempts to optimize the number of applied presaturation pulses according to the data acquisition conditions.

Figure 16A:
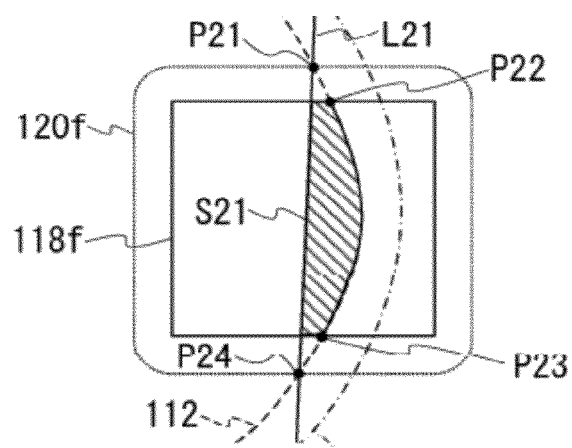
FIG. 16 is a pattern diagram indicative of a calculation method of an application region of each presaturation pulse in each mode of the second embodiment.

FIG. 16 is a pattern diagram indicative of a calculation method of an application region of each presaturation pulse in each mode of the second embodiment, when the data acquisition region overlaps on the "region to be avoided".

FIG. 16 (A) corresponds to the SAR priority mode, FIG. 16 (C) corresponds to the artifact suppression mode, and FIG. 16 (B) indicates an intermediate example between the SAR priority mode and the artifact suppression mode.

In FIGS. 16 (A), (B) and (C), "the exterior border line 110 and the interior border line 112 of the region to be avoided", the data acquisition region 118f, and the judging region 120f are common.

In each figure, the intersection points between the judging region 120f and the interior border line 112 are defined as P21, P22, P23 and P24 in the order from the top of the figures. The intersection points P22 and P23 are also intersection points between the data acquisition region 118f and the interior border line 112.

In the SAR priority mode, it is prioritized to make the number of the applied presaturation pulse as less as possible, in order to reduce SAR. In the example of the SAR priority mode shown in FIG. 16 (A), only one application region of a presaturation pulse is automatically calculated.

More specifically, the straight line L21 passing the uppermost intersection point P21 and the undermost intersection point P24, out of the intersection points P21 to P24 in the figure, is calculated. The condition setting unit 84 calculates "the rectangular application region of a presaturation pulse" whose one side is the straight line L21 in the way similar to the first embodiment (the application region becomes a three-dimensionally rectangular parallelepiped region).

In FIG. 16 (A), the "sacrifice region S21" (shadow area in the figure) is outside the "region to be avoided", but the "sacrifice region S21" is inside the data acquisition region 118f on which the presaturation pulse is applied.

In the artifact suppression mode, suppression of artifact is given the overriding priority. In the example of the artifact suppression mode shown in FIG. 16 (C), three application regions of respective three presaturation pulses are automatically calculated.

More specifically, the straight line L24 passing the intersection points P21 and P22 are calculated, and the application region of the first presaturation pulse is calculated in the aforementioned method so that the straight line L24 becomes its outer border.

Additionally, the straight line L25 passing the intersection points P22 and P23 are calculated, and the application region of the second presaturation pulse is calculated in the aforementioned method so that the straight line L25 becomes its outer border.

Additionally, the straight line L26 passing the intersection points P23 and P24 are calculated, and the application region of the third presaturation pulse is calculated in the aforementioned method so that the straight line L26 becomes its outer border.

Figure 16B:
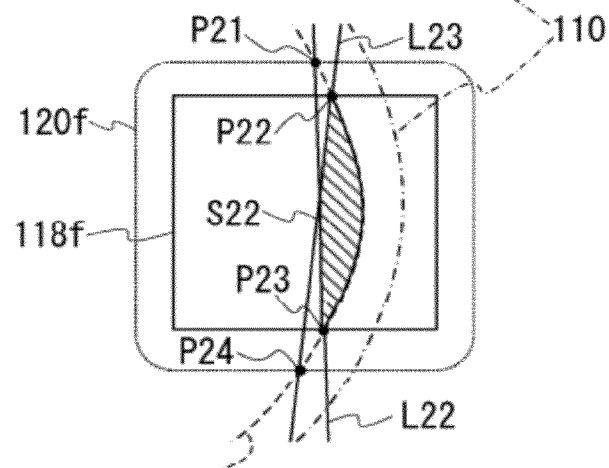
Figure 16C:
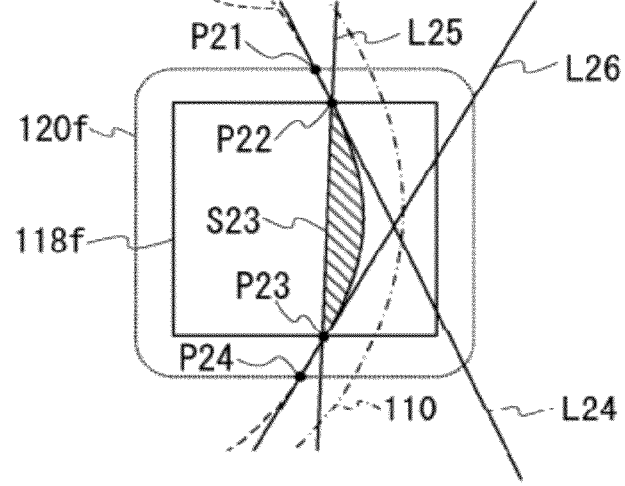

The "sacrifice region S23" (shadow area in the figure) in FIG. 16(C) is outside the "region to be avoided", but is inside the data acquisition region 118f on which presaturation pulses are applied.

FIG. 16 (B) indicates an intermediate calculation method between the aforementioned SAR priority mode and the artifact suppression mode, and two presaturation pulse are applied in this case.

In this example, the straight line L22 passing the intersection points P21 and P23 are calculated, and the application region of the first presaturation pulse is calculated in the aforementioned method so that the straight line L22 becomes its outer border.

Additionally, the straight line L23 passing the intersection points P22 and P24 are calculated, and the application region of the second presaturation pulse is calculated in the aforementioned method so that the straight line L23 becomes its outer border.

In this case, the "sacrifice region S22" (shadow area in the figure) in FIG. 16(B) is outside the "region to be avoided", but is inside the data acquisition region 118f on which presaturation pulses are applied.

As just described, if the "sacrifice regions" are put in ascending order, it becomes S23, S22, S21 (S21 is the largest, and S23 is the smallest).

That is, in the artifact suppression mode, the dimension of "the region which undergoes the application of each presaturation pulse and is inside the data acquisition region" becomes the smallest, and magnetic resonance spectrum data are accurately acquired. On the other hand, the number of applied presaturation pulses becomes larger, and this leads to the increase in SAR in the artifact suppression mode. The contrasting behavior is obtained in the SAR priority mode.

In the operator selecting mode, "the number of the applied presaturation pulse(s) in the artifact suppression mode" and "the number of the applied presaturation pulse(s) in the SAR priority mode" are displayed, and an operator can input the number of the applied presaturation pulse(s) via the input device 62.

In the above cases, for example, if an operator sets the number of the applied presaturation pulses to two, an display screen image on the display device 64 becomes like the one in FIG. 16 (B).

That is, "the data acquisition region", "the region to be avoided", "the straight line L22 and L23 which are outer border of an application region of each presaturation pulse respectively", and "the sacrifice region S22" are superimposed and distinguishably displayed on the scout image.

In the example of FIG. 16, the data acquisition region overlaps on the "region to be avoided" in a single location, and this case is explained.

In the case where the data acquisition region overlaps on the "region to be avoided" in a plurality of locations like in the fifth example shown in FIG. 12 to FIG. 14, an application region of each presaturation pulse can be calculated in each of the artifact suppression mode and the SAR priority mode in the way similar to the aforementioned method.

In the case where the data acquisition region does not overlap on the "region to be avoided" and the judging region overlaps on the "region to be avoided" in a plurality of locations causing the sacrifice region, an application regions of each presaturation pulse can be calculated in each of the artifact suppression mode and the SAR priority mode in the way similar to the aforementioned method.

Figure 17:
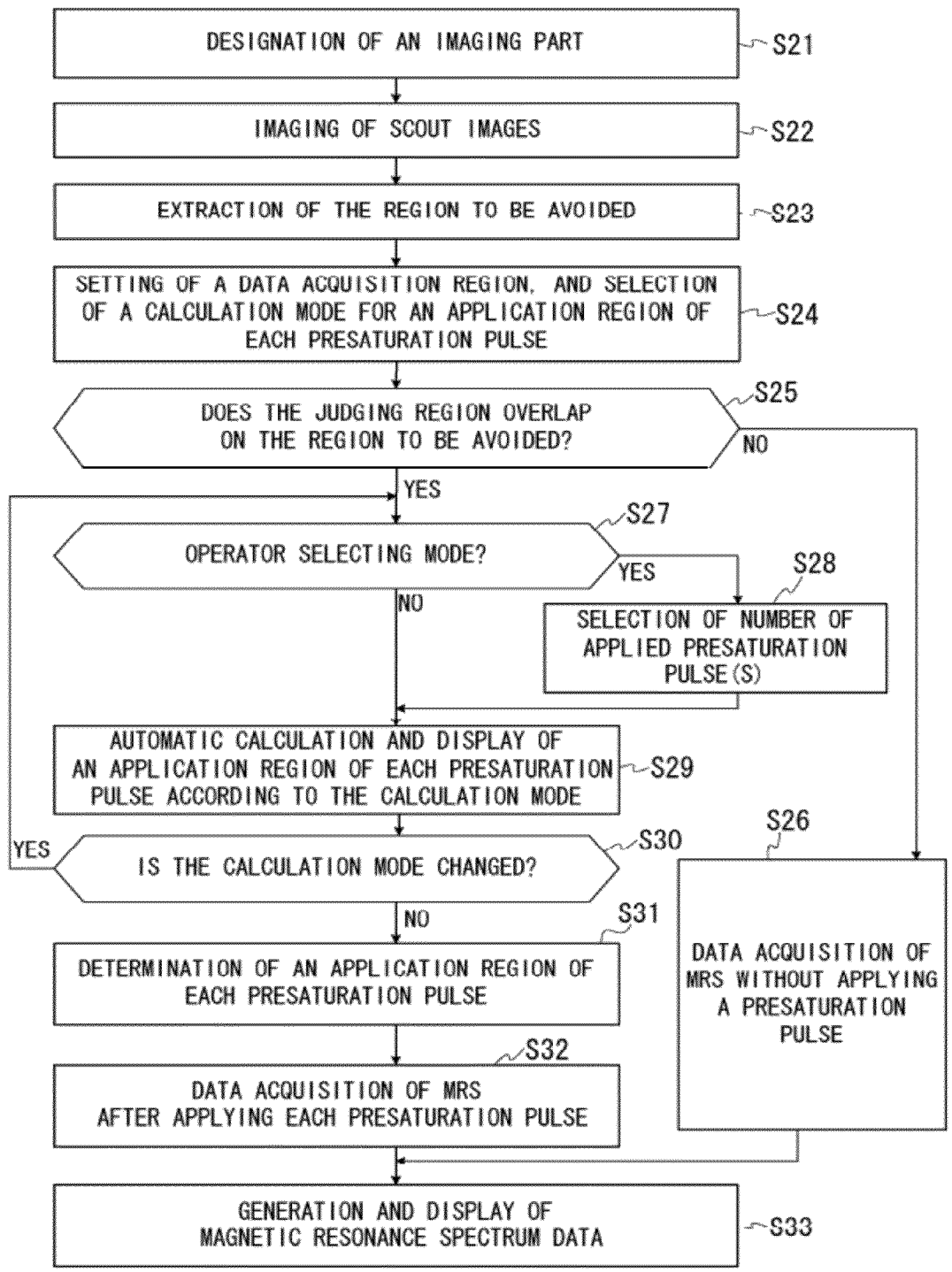
FIG. 17 is a flowchart illustrating a flow of a process performed by the magnetic resonance diagnosis apparatus of the second embodiment.

FIG. 17 is a flowchart illustrating a flow of a process performed by the magnetic resonance diagnosis apparatus 20 of the second embodiment. In the following, according to the step numbers in the flowchart shown in FIG. 17, an operation of the magnetic resonance diagnosis apparatus 20 will be described.

[step S21 to S23] Step S21 to S23 are similar to step S1 to S3 in the first embodiment, and overlapping explanation is abbreviated. After this, the process proceeds to step S24.

[step S24] The MPU 80 selects one scout image suitable for positioning out of the plurality of scout images obtained in step S22 in the way similar to the first embodiment, and then makes the display device 64 display the selected scout image.

Note that an operator can cancel the selected scout image and can select another scout image for positioning of the data acquisition region once again via the input device 62. After this, an operator sets the data acquisition region on the selected and displayed scout image.

Additionally, an operator selects any one of the operator selecting mode, the artifact suppression mode and the SAR priority mode as input information on the calculation method of an application region of each presaturation pulse via the input device 62. Nothing is inputted, the artifact suppression mode is automatically selected, for example. After this, the process proceeds to Step S25.

[step S25, S26] Step S25 and 26 are similar to step S5 and S6 in the first embodiment, and overlapping explanation is abbreviated. If the judging region does not overlap on the "region to be avoided" in step S25, the process proceeds to step S26. If the judging region overlaps on the "region to be avoided" in step S25, the process proceeds to step S27.

[step S27] The MPU 80 determines (judges) whether the magnetic resonance diagnosis apparatus 20 is set to the operator selecting mode or not, as the calculation method of an application region of each presaturation pulse. If it is set to the operator selecting mode, the process proceeds to step S28. If this is not the case, the process proceeds to step S29.

[step S28] The condition setting unit 84 calculates each number of the applied presaturation pulse(s) in the case of both the artifact suppression mode and the SAR priority mode. The condition setting unit 84 makes the display device 64 display the calculated each number of the applied presaturation pulse(s) in the above two cases, by controlling the display control unit 88.

An operator selects the number of applied presaturation pulses via the input device 62. If nothing is inputted, the condition setting unit 84 selects an intermediate number (value) between "the number in the case of the artifact suppression mode" and "the number in the SAR priority mode", as the number of the applied presaturation pulse(s). If the intermediate value becomes a decimal fraction, the condition setting unit 84 rounds the intermediate value off to the closest whole number. After this, the process proceeds to step S29.

[step S29] The condition setting unit 84 automatically calculates an application region of each presaturation pulse according to the set calculation mode.

That is, if it is set to the artifact suppression mode, the condition setting unit 84 calculates an application region of each presaturation pulse in the way similar to the first embodiment, so that the dimension of the sacrifice region becomes the smallest (see FIG. 16 (C)).

If it is set to the SAR priority mode the condition setting unit 84 calculates an application region of each presaturation pulse, so that the number of applied presaturation pulse becomes the smallest (see FIG. 16 (A)).

If it is set to the operator selecting mode, the condition setting unit 84 calculates an application region of each presaturation pulse, so that the number of the applied presaturation pulse(s) becomes the number set in step S28.

The condition setting unit 84 inputs the automatically calculated application region of each presaturation pulse into the display control unit 88, and the display control unit 88 superimposes and distinguishably displays the application region(s) on the scout image.

In this display, "the interior border line and the exterior border line of the region to be avoided" and the data acquisition region are also distinguishably superimposed on the selected scout image, so that they are distinguishably displayed with mutually different chromatic colors. After this, the process proceeds to step S30.

[step S30] An operator can change the mode for the calculation method of an application region of each presaturation pulse, referring to the application region of each presaturation pulse superimposed and distinguishably displayed on the scout image. Thereby, an operator can change the number of applied presaturation pulses, and the application region of each presaturation pulse.

If the mode for calculation method of an application region of each presaturation pulse is changed, the process returns to step S27. If this is not the case, the process proceeds to step S31.

[step S31 to S33] Step S31 to S33 are similar to step S9 to S11 in the first embodiment, and overlapping explanation is abbreviated. The foregoing is a description of an operation of the magnetic resonance diagnosis apparatus 20 according to the second embodiment.

As just described, the similar effects in the first embodiment can be obtained in the second embodiment. Moreover, in the second embodiment, any one of the three modes can be selected as to the calculation method of an application region of each presaturation pulse. Thereby, the number of the applied presaturation pulse(s) and the dimension of the sacrifice region can be optimized according to priority concerns such as reduction of SAR and suppression of artifact.

<Third Embodiment>

In the third embodiment, a plurality of cross-sections which an operator may fail to consider are reflected in the automatic calculation of each presaturation pulse application region.

Figure 18:
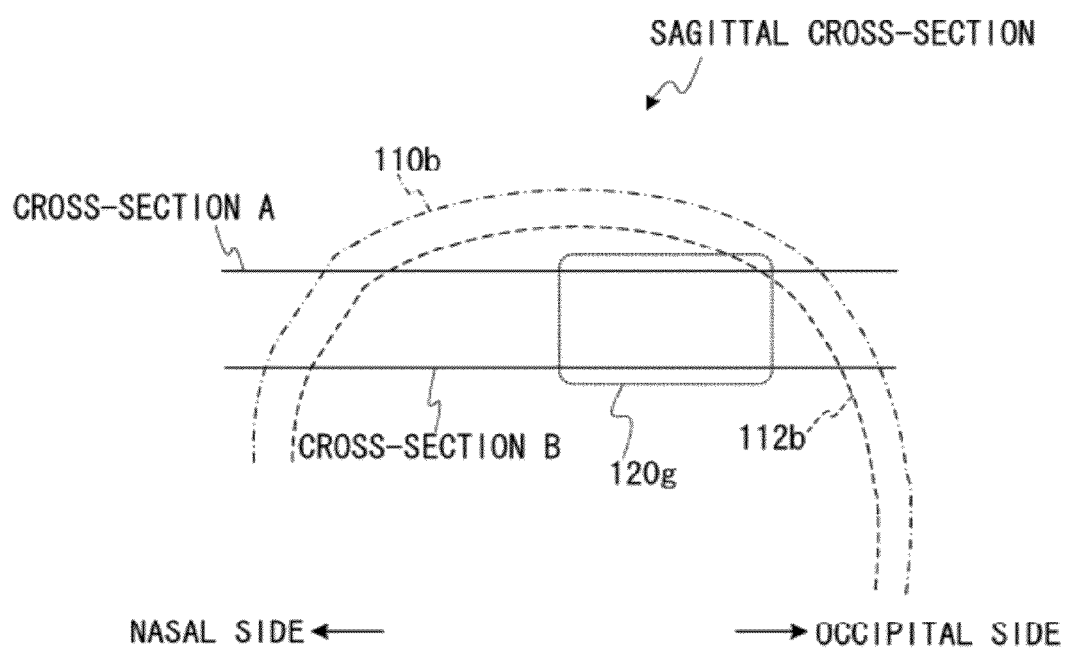
FIG. 18 is a sagittal cross-sectional pattern diagram showing an example of difference in "how the judging region overlaps on the region to be avoided" between the cross-section A and the cross-section B, which are in parallel with each other and slightly tilted from an axial cross-section, in the third embodiment.

FIG. 18 is a sagittal cross-sectional pattern diagram showing an example of difference in how the judging region overlaps on the "region to be avoided" between the cross-section A and the cross-sections B, which are in parallel with each other and slightly tilted from an axial cross-section.

Figure 19:
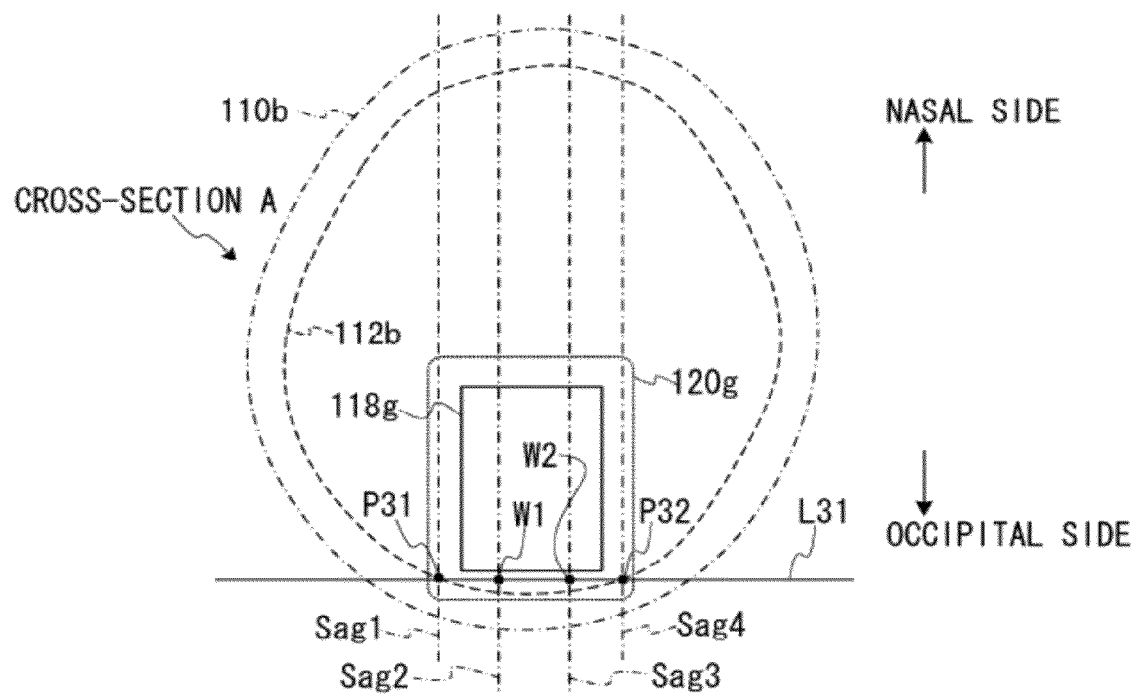
FIG. 19 is a cross-sectional pattern diagram of the cross-section A in FIG. 18.

FIG. 19 is a cross-sectional pattern diagram of the cross-section A in FIG. 18.

Figure 20:
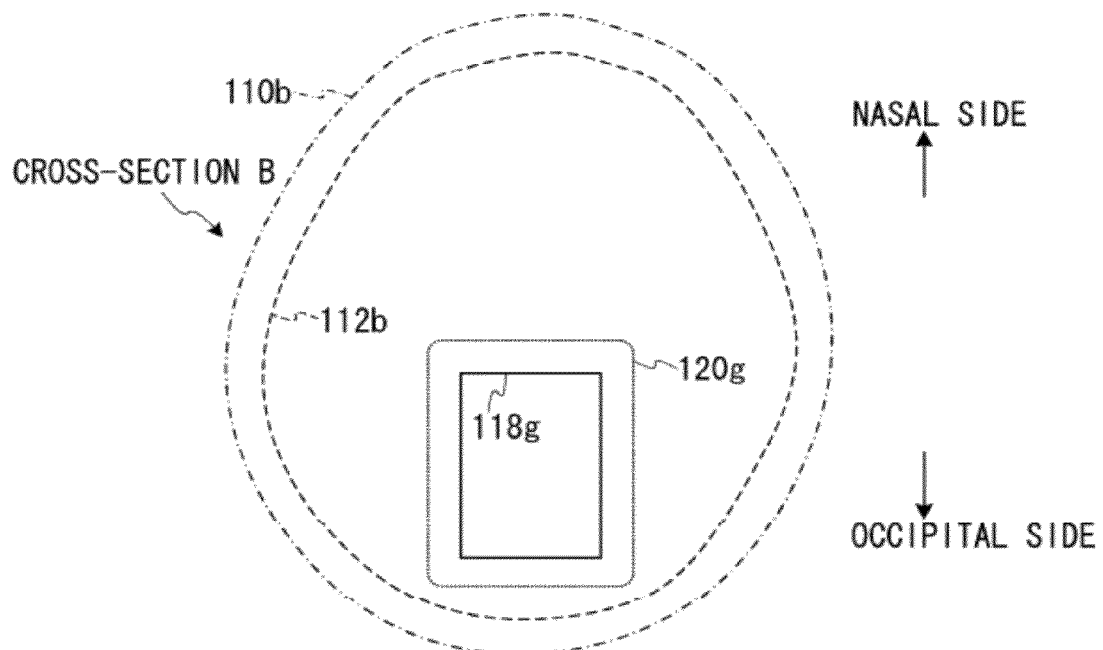
FIG. 20 is a cross-sectional pattern diagram of the cross-section B in FIG. 18.

FIG. 20 is a cross-sectional pattern diagram of the cross-section B in FIG. 18.

Figure 21:
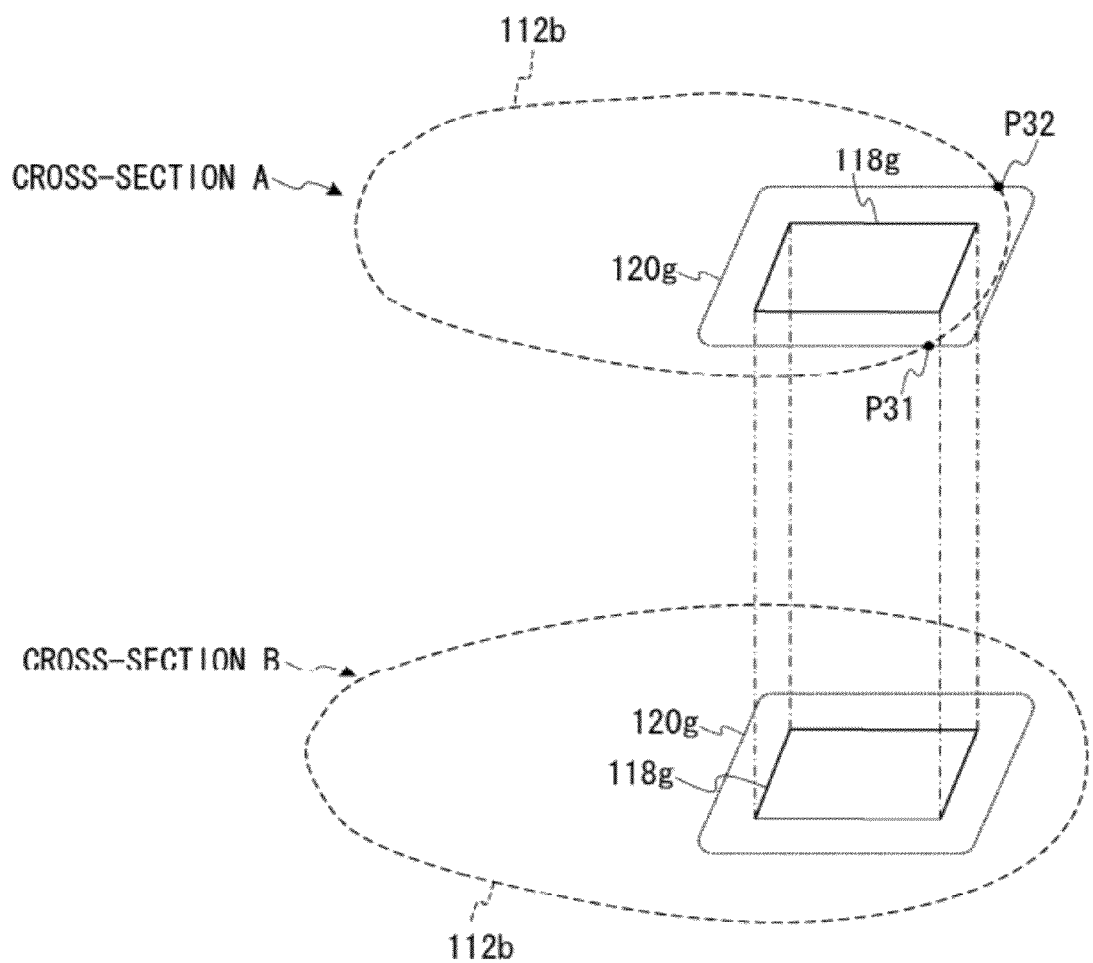
FIG. 21 is an oblique perspective figure of the cross-section A and B in FIG. 18.

FIG. 21 is an oblique perspective figure of the cross-section A and the cross-section B in FIG. 18.

As shown in FIGS. 18, 20 and 21, in the cross-section B, the judging region 120g does not overlap on the interior border line 112b of the "region to be avoided". On the other hand, as shown in FIGS. 18, 19 and 21, in the cross-section A, the judging region 120g overlaps on the interior border line 112b of the "region to be avoided".

Therefore, application of at least one presaturation pulse is desirable in order to suppress artifact. Also, prevention of the following inaccurate judgment is desired. That is, application of a presaturation pulse is judged as unnecessary by an operator, because the operator refers to only "the cross-section B in which the judging region does not overlap on the region to be avoided", for positioning of the data acquisition region 118g.

The calculation method of an application region of each presaturation pulse in the third embodiment will be concretely discussed below by using the example of FIG. 18 to FIG. 21.

As shown in FIG. 19, the condition setting unit 84 defines two intersection points between the judging region 120g and the interior border line 112b in the cross-section A as P31 and P32, respectively. Note that it is assumed that the data acquisition region 118g does not overlap on the "region to be avoided" in this example.

Next, the condition setting unit 84 calculates the straight line L31 passing the intersection points P31 and P32 as an outer border of the application region of the presaturation pulse in the way similar to the first embodiment.

Next, the condition setting unit 84 calculates an average gradient of tangent lines which are tangentially circumscribed to "the part between the intersection points P31 and P32 in the interior border line 112" from the side of the exterior border line 110b in sagittal cross-sections. Here, as an example, four tangent lines are respectively calculated in four points including the intersection points P31 and P32, and the gradients of these four tangent lines are averaged.

More specifically, the condition setting unit 84 evenly trisects "the part between the intersection points P31 and P32 in the straight line L31", and defines the two division points as criterion points W1 and W2 like in FIG. 19.

Figure 22:
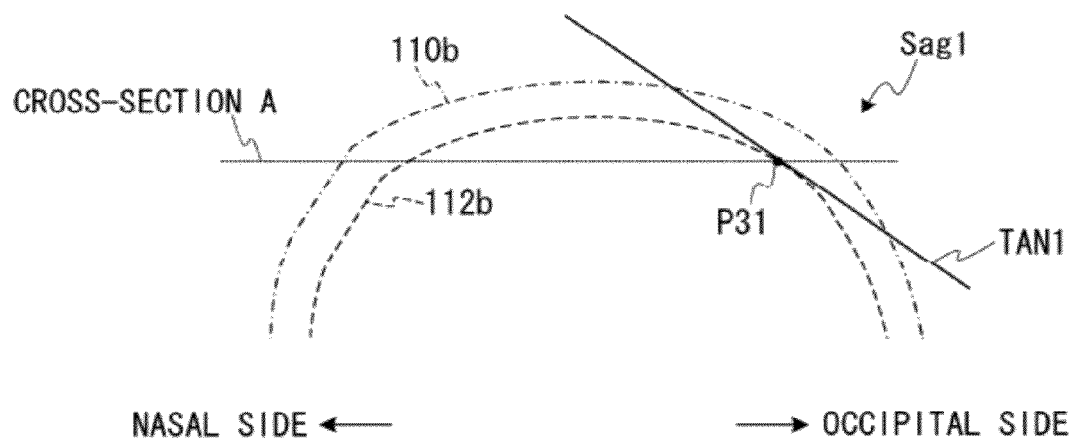
FIG. 22 is a cross-sectional pattern diagram indicative of a tangent line circumscribed to an intersection point between the cross-section A and the interior border line of the "region to be avoided", in the sagittal cross-section Sag1 which intersects the intersection point P31 in FIG. 19.

FIG. 22 is a cross-sectional pattern diagram indicative of a tangent line TAN1 tangentially circumscribed to the intersection point between the cross-section A and the interior border line 112b, in the sagittal cross-section Sag1 which intersects the intersection point P31 in FIG. 19. In the case of FIG. 22, the intersection point between the interior border line 112b and the cross-section A is the intersection point P31.

Figure 23:
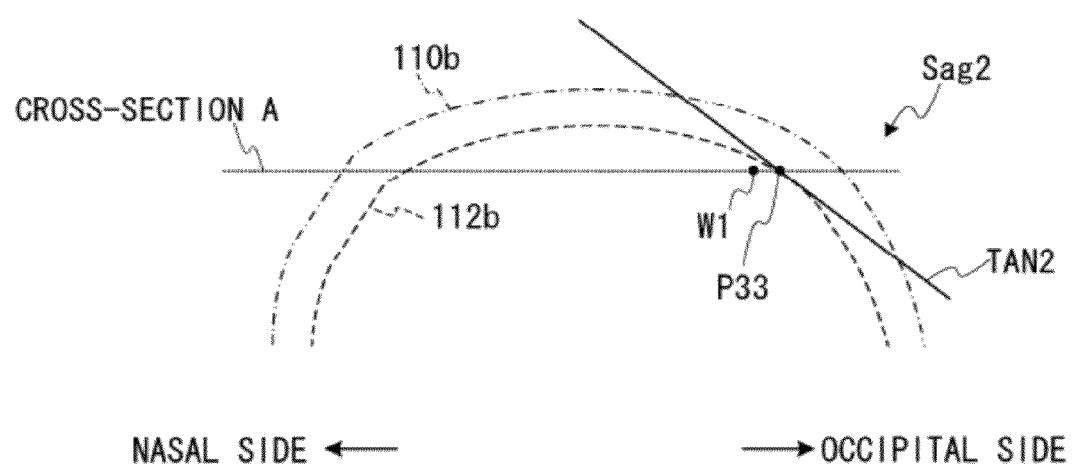
FIG. 23 is a cross-sectional pattern diagram indicative of a tangent line circumscribed to an intersection point between the cross-section A and the interior border line of the "region to be avoided", in the sagittal cross-section Sag2 which intersects the criterion point W1 in FIG. 19.

FIG. 23 is a cross-sectional pattern diagram indicative of a tangent line TAN2 tangentially circumscribed to the intersection point P33 between the cross-section A and the interior border line 112b, in the sagittal cross-section Sag2 which intersects the criterion point W1 in FIG. 19.

Figure 24:
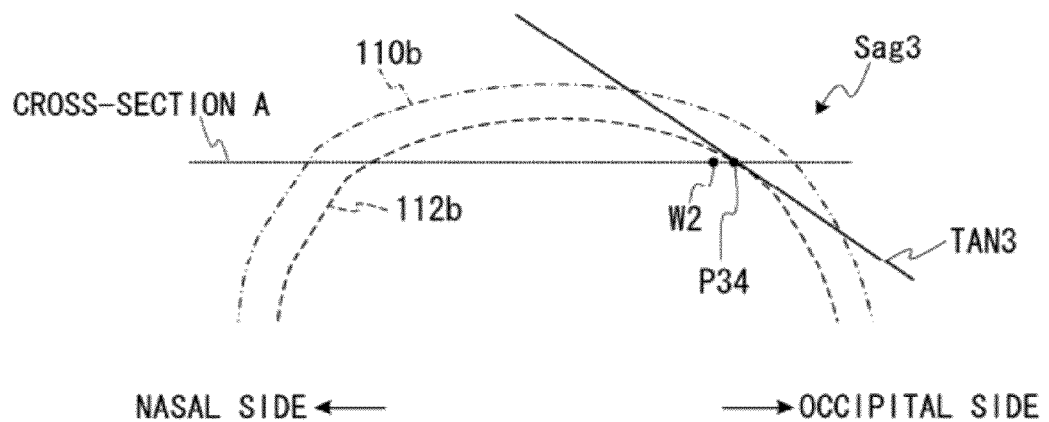
FIG. 24 is a cross-sectional pattern diagram indicative of a tangent line circumscribed to an intersection point between the cross-section A and the interior border line of the "region to be avoided", in the sagittal cross-section Sag3 which intersects the criterion point W2 in FIG. 19.

FIG. 24 is a cross-sectional pattern diagram indicative of a tangent line TAN3 tangentially circumscribed to the intersection point P34 between the cross-section A and the interior border line 112b, in the sagittal cross-section Sag3 which intersects the criterion point W2 in FIG. 19.

Figure 25:
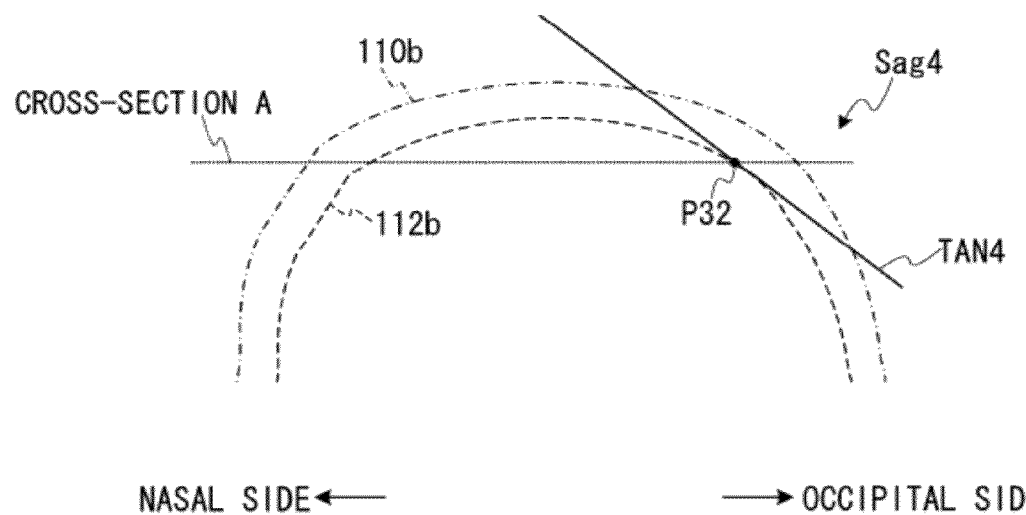
FIG. 25 is a cross-sectional pattern diagram indicative of a tangent line circumscribed to an intersection point between the cross-section A and the interior border line of the "region to be avoided", in the sagittal cross-section Sag4 which intersects the intersection point P32 in FIG. 19.

FIG. 25 is a cross-sectional pattern diagram indicative of a tangent line TAN4 tangentially circumscribed to the intersection point between the cross-section A and the interior border line 112b, in the sagittal cross-section Sag4 which intersects the intersection point P32 in FIG. 19. In the case of FIG. 25, the intersection point between the interior border line 112b and the cross-section A is the intersection point P32.

The condition setting unit 84 calculates each position and each gradient of the four tangent lines TAN1 to TAN4 shown in FIG. 22 to FIG. 25.

Next, the condition setting unit 84 calculates the straight line TANave which overlaps on the intersection point P31 in the sagittal cross-section Sag1 passing the intersection point P31" and has the average gradient of the tangent lines TAN1 to TAN4.

In the above calculation, the straight line TANave is located so that it overlaps on the intersection point P31, but this is only an example.

The straight line TANave may be located to a position where the straight line TANave overlaps on the interior border line 112b on "another sagittal cross-section between the intersection point P31 and P32", if the straight line TANave is in parallel with the sagittal cross-section and has the same average gradient.

Figure 26:
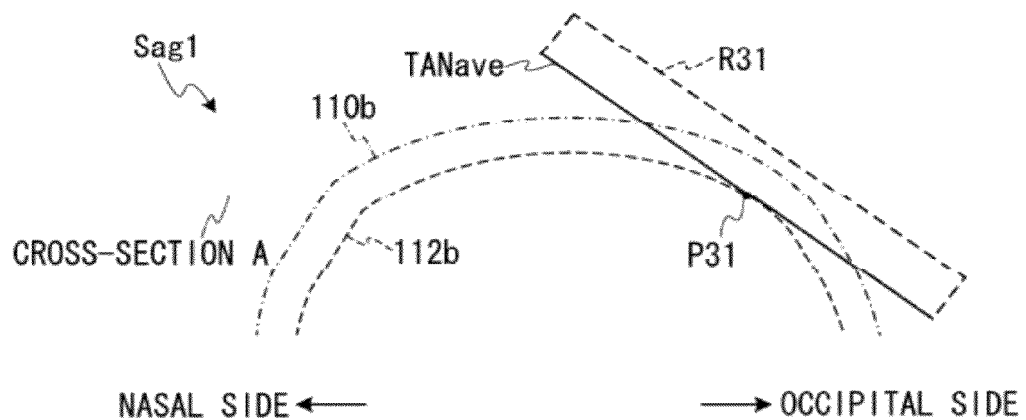
FIG. 26 is a cross-sectional pattern diagram indicative of an application region of a presaturation pulse, in the sagittal cross-section Sag1 which intersects the intersection point P31 in FIG. 19.

FIG. 26 is a cross-sectional pattern diagram indicative of an application region of a presaturation pulse, in the sagittal cross-section Sag1 which intersects the intersection point P31 between the interior borderline 112b and the cross-section A.

As shown in FIG. 26, "a rectangular region indicated by three dashed straight lines and one solid straight line (TANave)" is calculated as a transverse section of the rectangular parallelepiped application region R31 of a presaturation pulse. The application region R31 of the presaturation pulse is calculated, so that it becomes a rectangular parallelepiped and its mutually opposed two surfaces of its six rectangular surfaces are in parallel with the sagittal cross-section, for example.

Figure 27:
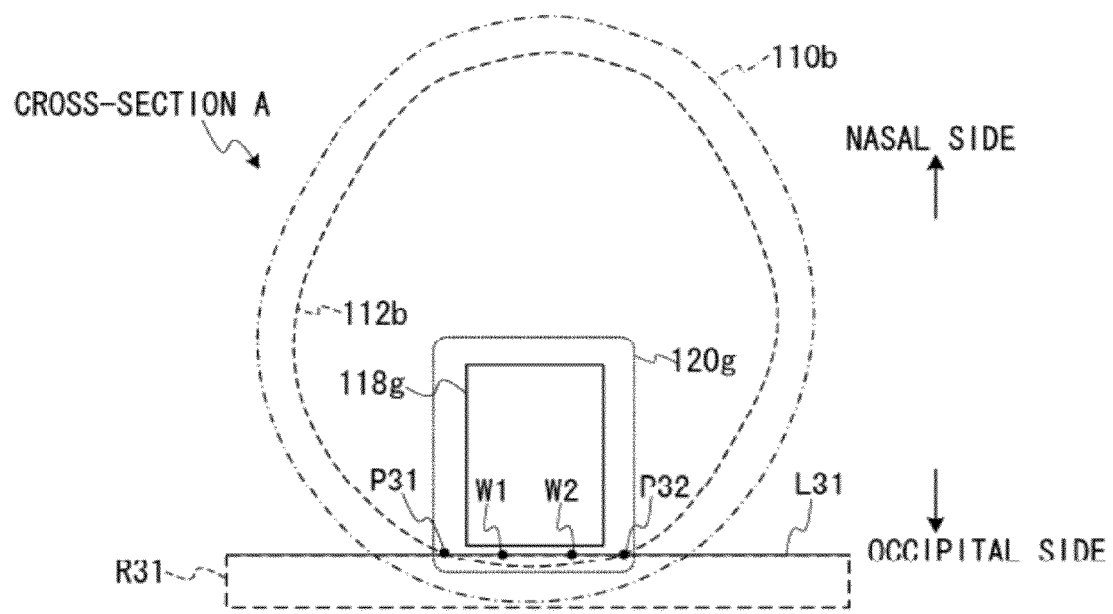
FIG. 27 is a cross-sectional pattern diagram indicative of an application region of a presaturation pulse in the cross-section A in FIG. 18.

FIG. 27 is a cross-sectional pattern diagram indicative of (one transverse section of) the application region R31 of the presaturation pulse in "the cross-section A (in FIG. 18) which is slightly tilted from an axial cross-section".

In FIG. 27, the application region R31 is the region indicated by three dashed straight lines and one solid straight line 31. That is, in this cross-section, the application region R31 of the presaturation pulse is rectangular, and its one side is the straight line L31 passing the intersection points P31 and P32.

More part of the "region to be avoided" can be included in the application region R31 of the presaturation pulse by calculating the outer border of the application region based on tangent lines in this manner.

Figure 28:
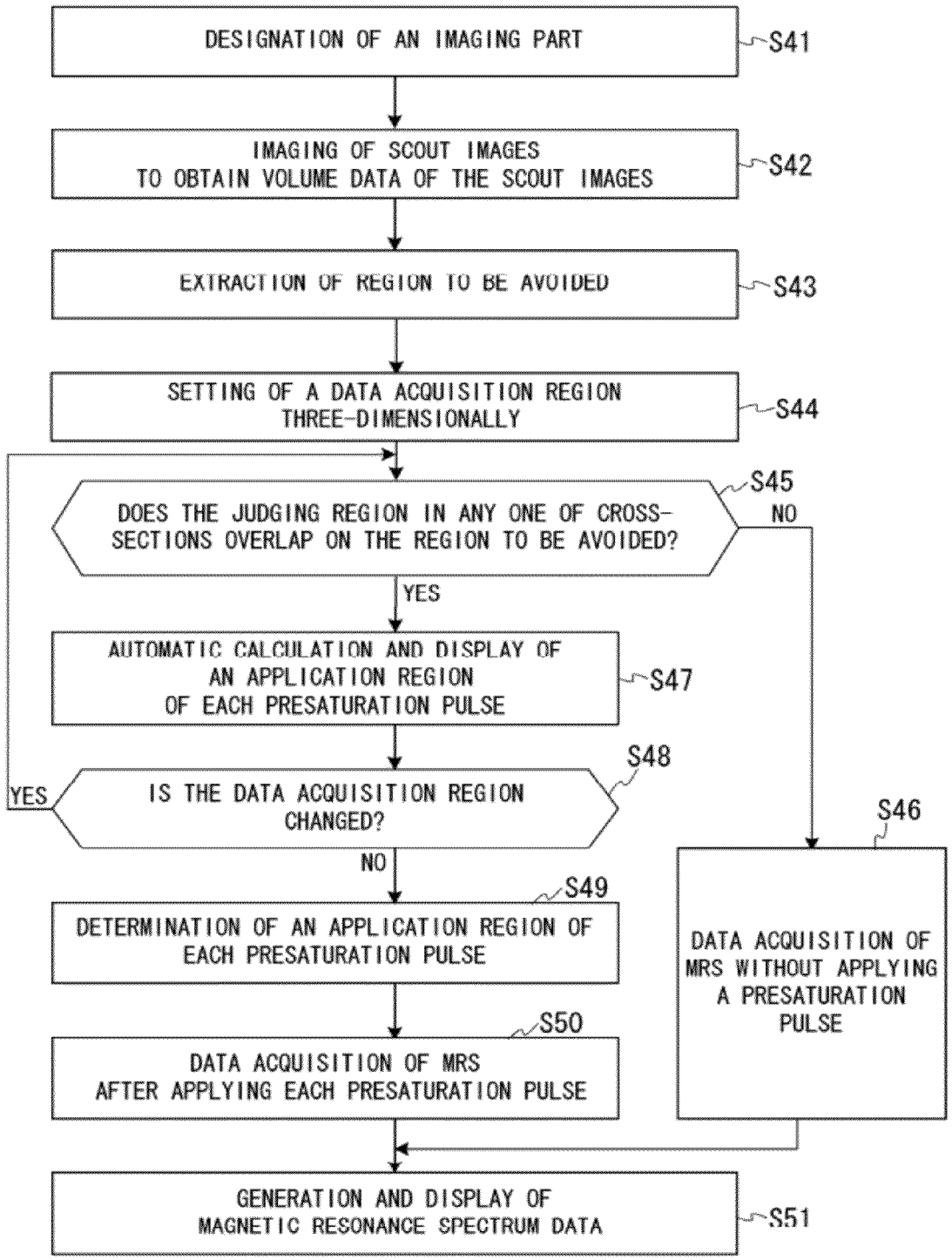
FIG. 28 is a flowchart illustrating a flow of a process performed by the magnetic resonance diagnosis apparatus of the third embodiment.

FIG. 28 is a flowchart illustrating a flow of a process performed by the magnetic resonance diagnosis apparatus 20 of the third embodiment. In the following, according to the step numbers in the flowchart shown in FIG. 28, an operation of the magnetic resonance diagnosis apparatus 20 will be described.

[step S41] Initial setting and designation of an imaging part are performed in the way similar to step S1 in the first embodiment. Here, as an example, cephalic MRS examination is designated. After this, the process proceeds to step S42.

[step S42] The MPU 80 sets imaging conditions of scout images so that volume data including a plurality (for example, 20) of slices which are mutually in parallel with and located at regular intervals, for example. Here, as an example, each slice of the volume data is a cross-section slightly tilted from an axial cross-section like the aforementioned cross-sections A and B (see FIG. 18).

Then, the scout images are imaged in the way similar to step S2 in the first embodiment, and their image data are stored in the storage device 66. After this, the process proceeds to step S43.

[step S43] The condition setting unit 84 extracts the cephalic surface and "the interior border line and the exterior border line of the region to be avoided" from the image data of the scout images in the aforementioned manner, and stores the boundary information on the cephalic surface and the "region to be avoided". After this, the process proceeds to step S44.

[step S44] The MPU 80 selects the scout image suitable for positioning out of the scout images obtained in step S2 in the way similar to step S4 in the first embodiment.

The MPU 80 makes the display device 64 display the selected scout image by controlling the display control unit 88. In this display, the interior border line 112b and the exterior border line 110b of the "region to be avoided" are distinguishably superimposed on the selected scout image, so that the interior border line 112b and the exterior border line 110b are distinguishably displayed with mutually different chromatic colors like the cross-sectional pattern diagrams of FIG. 19 and FIG. 20.

An operator can change the display color and the degree of transparency of the "region to be avoided" which is the region between the interior border line 112b and the exterior border line 110b, via the input device 62. Additionally, an operator can switch nondisplay or display of the "region to be avoided" via the input device 62. Moreover, an operator can cancel the selected scout image and can select another scout image for positioning of the data acquisition region once again via the input device 62.

After this, an operator sets the data acquisition region on the selected scout image which is displayed. Here, as an example, "the data acquisition region 118g thick enough to extend over two or more of the scout images obtained in step S42" is three-dimensionally set. After this, the process proceeds to Step S45.

[step S45] The condition setting unit 84 three-dimensionally calculates the judging region 120g as the hollowed region determined by pulling "the original data acquisition region 118g" out of "the region obtained by extending the outer border of the data acquisition region 118g by the margin M".

Next, the condition setting unit 84 selects "the scout images which the judging region 120g extends over" out of all the scout images.

Next, the condition setting unit 84 determines (judges) whether the judging region 120g overlaps on the "region to be avoided" extracted in step S43 in each of "the scout images which the judging region 120g extends over" or not.

The condition setting unit 84 transmits the determination (judgment) result to the MPU 80. Additionally, if there is a scout image in which the judging region 120g overlaps on the interior border line 112b, the condition setting unit 84 stores which image data corresponds to this scout image.

If there is (are) one or plural scout image(s) in which the judging region 120g overlaps on the "region to be avoided", the MPU 80 makes the process of the magnetic resonance diagnosis apparatus 20 proceed to step S47. If this is not the case, the process proceeds to step S46.

[step S46] The data acquisition of MRS is performed without applying a presaturation pulse in the way similar to step S6 in the first embodiment. After this, the process proceeds to Step S51.

[step S47] The condition setting unit 84 automatically calculates an application region of each presaturation pulse in the manner explained with FIG. 18 to FIG. 27.

That is the condition setting unit 84 calculates the tangent lines circumscribed to the interior border line 112b at "the intersection point between the interior border line 112b and cross-section A in which the judging region 120g overlaps on the region to be avoided" on respective sagittal cross-sections.

The condition setting unit 84 automatically calculates the application region of each presaturation pulse, so that average of these tangent lines becomes the outer border of the application region.

Note that, if there are plural cross-sections (scout images) in which the judging region 120g overlaps on the region to be avoided as an example, the application region of each presaturation pulse may be automatically calculated for each cross-section in the aforementioned manner.

The condition setting unit 84 inputs the application region of each presaturation pulse into the display control unit 88, and the display control unit 88 superimposes and distinguishably displays the application region of each presaturation pulse on the scout image.

Additionally, the condition setting unit 84 inputs the calculated application region of each presaturation pulse into the condition storing unit 82, and the condition storing unit 82 stores the inputted data.

Note that "the interior border line and the exterior border line of the region to be avoided" and the data acquisition region are distinguishably superimposed on the scout image, so that they are distinguishably displayed with mutually different chromatic colors. After this, the process proceeds to Step S48.

[step S48 to S51] Step S48 to S51 are similar to step S8 to S11 in the first embodiment, and overlapping explanation is abbreviated. The foregoing is a description of an operation of the magnetic resonance diagnosis apparatus 20 according to the third embodiment.

As just described, the similar effects in the first embodiment can be obtained in the third embodiment. Moreover, in the third embodiment, the application region of each presaturation pulse is automatically calculated based on a plurality of cross-sections.

Therefore, the following inaccurate determination by an operator can be prevented. That is, even though there is a cross-section in which the judging region overlaps on the region to be avoided, an operator sets the data acquisition region 118g on a cross-section in which the judging region does not overlap on the region to be avoided, and wrongly determines that application of a presaturation pulse is unnecessary.

<Fourth Embodiment>

In the fourth embodiment, the data acquisition region can be set without referring to other cross-sections, so that the data acquisition region is separated from the "region to be avoided". This is achieved by only setting the data acquisition region on one scout image, so that the data acquisition region does not overlap on the combined region of the "regions to be avoided".

Then, in the fourth embodiment, before the determination of the data acquisition region, the combined region (synthetic region) is superimposed and distinguishably displayed on the scout image. The combined region is obtained by overlapping respective "regions to be avoided" in a plurality of cross-sections mutually in parallel with each other.

Figure 29:
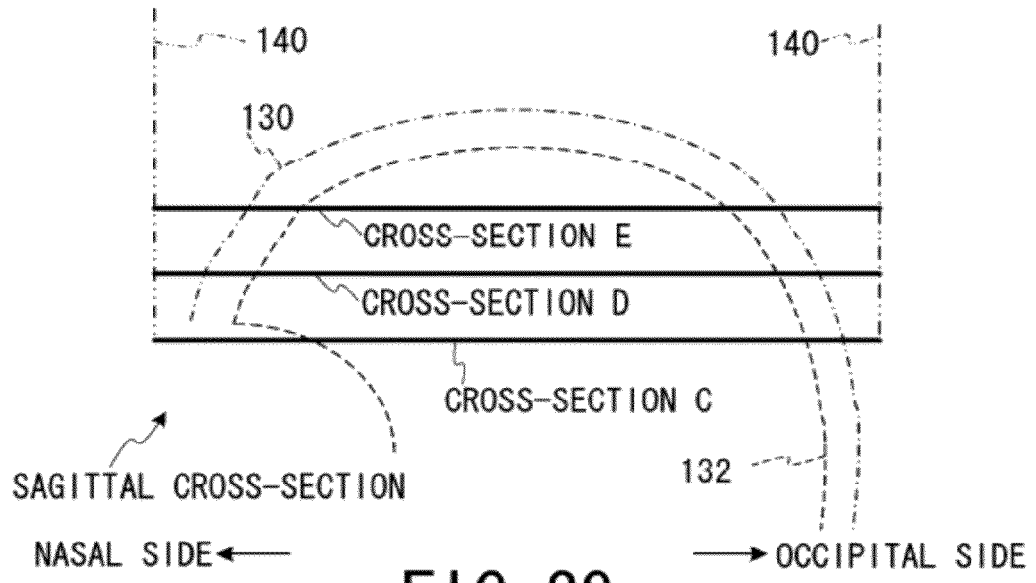
FIG. 29 is a cephalic sagittal cross-sectional pattern diagram indicative of positional relationship between the cross-sections C, D and E which are slightly tilted from an axial cross-section, in the fourth embodiment.

FIG. 29 is a cephalic sagittal cross-sectional pattern diagram indicative of positional relationship between the cross-sections C, D and E which are slightly tilted from an axial cross-section.

Each of the cross-sections C, D and E is a regular tetragon or a rectangle, and has mutually equal planar dimension. The cross-sections C, D and E are in parallel with each other, and are imaged as one volume data so that their outer borders are in alignment with each other.

The chain line in FIG. 29 is the exterior border line 130 of the "region to be avoided", and the dashed line in FIG. 29 is the interior border line 132 of the "region to be avoided". Additionally, the two-dot chain line in FIG. 29 is the outer border 140 of each image of the cross-sections C, D and E.

The "region to be avoided" sandwiched between the exterior border line 130 and the interior border line 132 in FIG. 29 is mainly a fat region (having strong MR signals) adjacent to the cranial bone. As a part of the "region to be avoided", an air region in the nasal cavity is extracted by the interior border line 132. In the cross-section C, the air region in the nasal cavity is included in the "region to be avoided".

Figure 30:
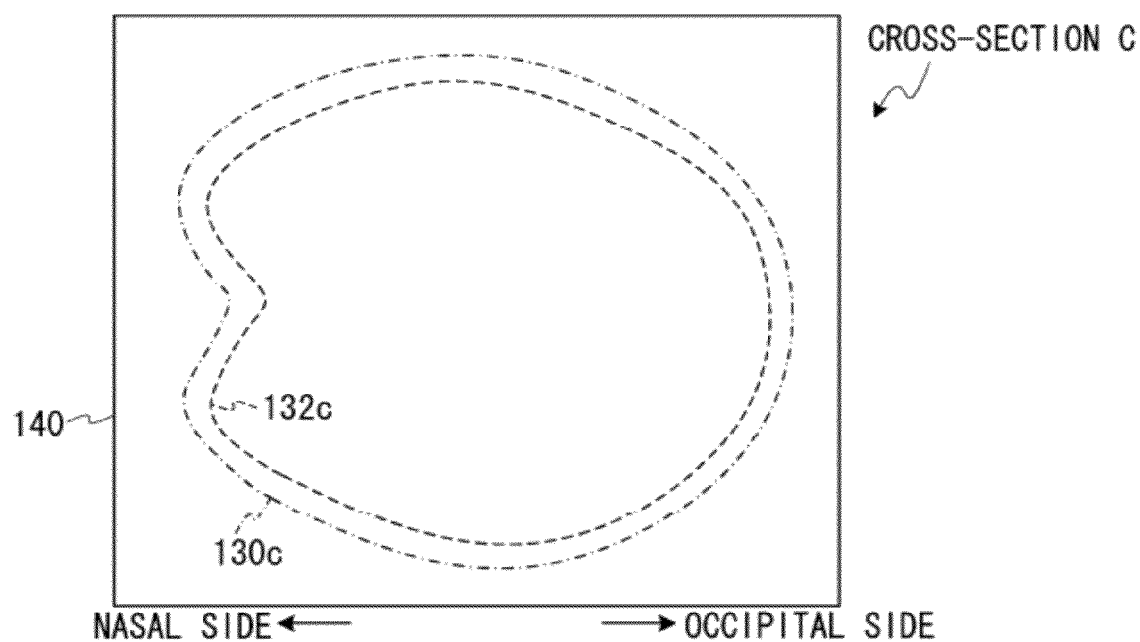
FIG. 30 is a cross-sectional pattern diagram indicative of distribution of the "region to be avoided" in the magnetic resonance image of the cross-section C in FIG. 29.
Figure 31:
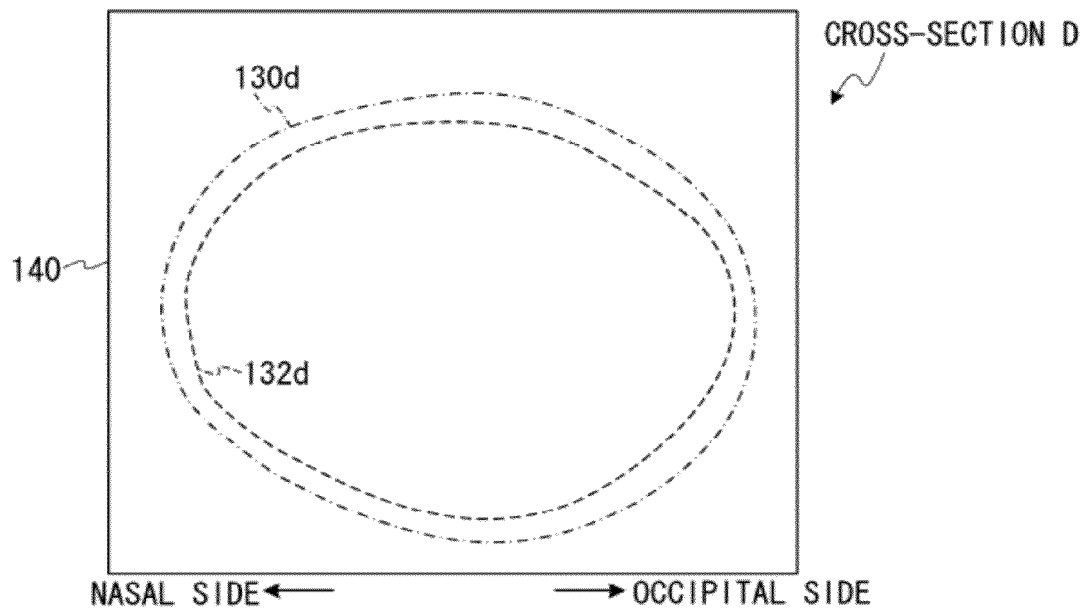
FIG. 31 is a cross-sectional pattern diagram indicative of distribution of the "region to be avoided" in the magnetic resonance image of the cross-section D in FIG. 29.
Figure 32:
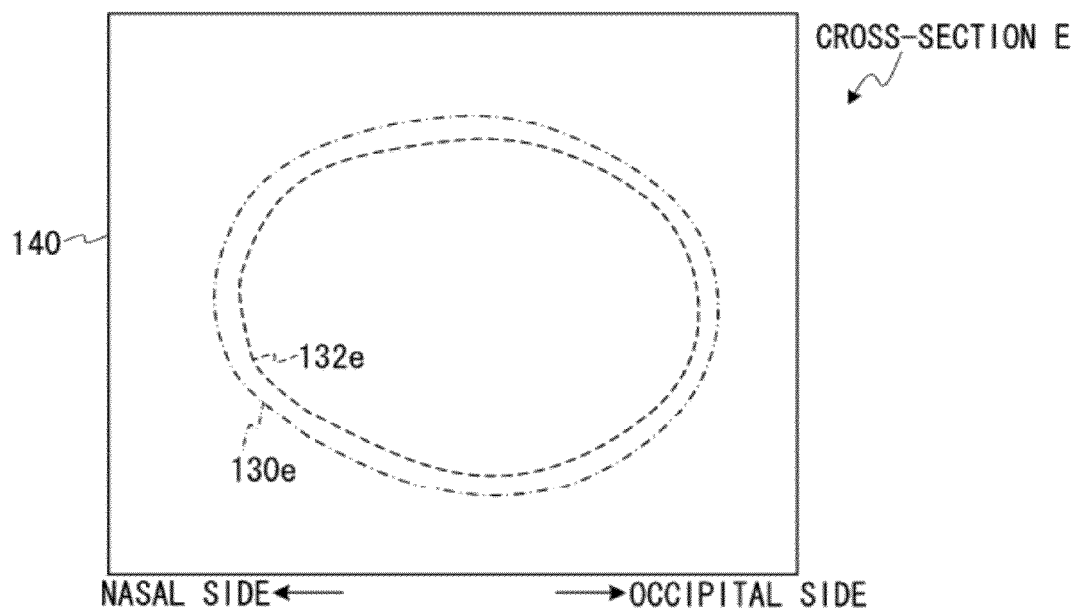
FIG. 32 is a cross-sectional pattern diagram indicative of distribution of the "region to be avoided" in the magnetic resonance image of the cross-section E in FIG. 29.

FIG. 30 to FIG. 32 are cross-sectional pattern diagrams indicative of distribution of the "region to be avoided" in each image of the cross-section C, D and E in FIG. 29.

In the cross-section C, for drawing a distinction between respective symbols, the exterior border line of the "region to be avoided" is coded as 130c, and the interior border line of the "region to be avoided" is coded as 132c as shown in FIG. 30.

Similarly, in the cross-section D, the exterior border line of the "region to be avoided" is coded as 130d, and the interior border line of the "region to be avoided" is coded as 132d as shown in FIG. 31.

Similarly, in the cross-section E, the exterior border line of the "region to be avoided" is coded as 130e, and the interior border line of the "region to be avoided" is coded as 132e as shown in FIG. 32.

Note that in FIG. 30 to FIG. 32, the rectangular frame indicates the outer border 140 of the image. As is clear from FIG. 29 to FIG. 32, the closer the cross-section is to vertex of the head, the smaller the "region to be avoided" becomes. That is the "region to be avoided" is small in dimension in the cross-section E, as compared with the cross-section C and D.

Figure 33:
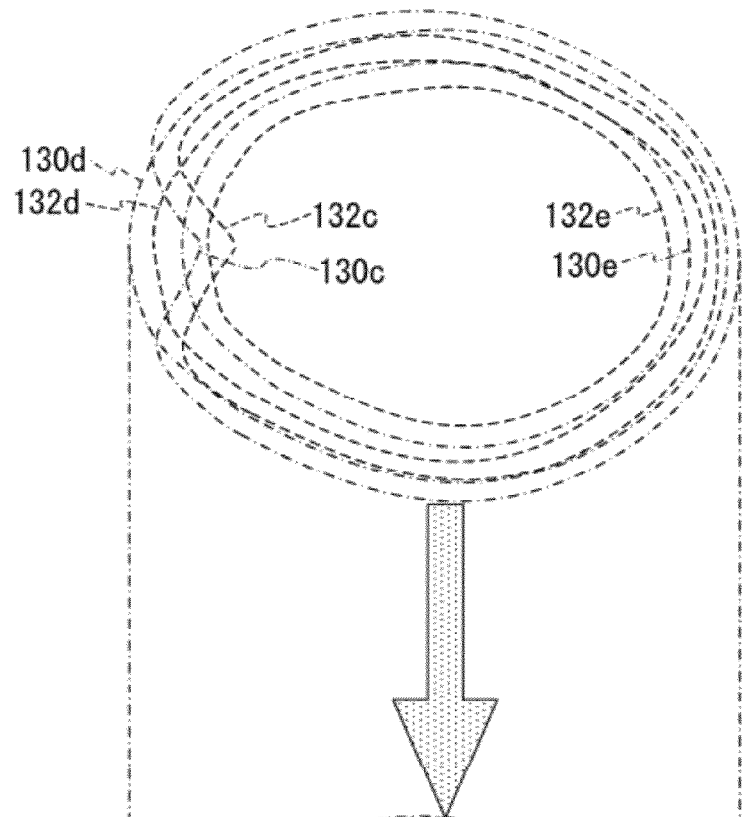
FIG. 33 is an explanatory diagram indicating a combined region obtained by combining each of the "regions to be avoided" in each of the cross-sections C, D and E shown in FIG. 30 to FIG. 32.
Figure 33:
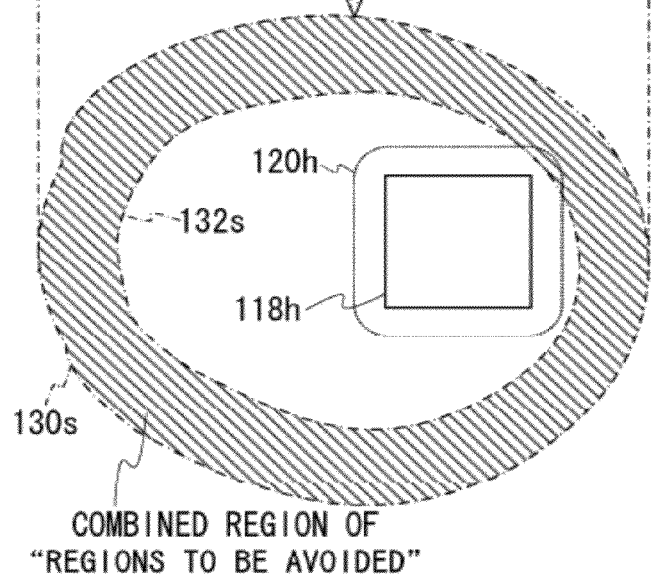

FIG. 33 is an explanatory diagram indicating a combined region obtained by combining each of the "regions to be avoided" in each of the cross-sections C, D and E shown in FIG. 30 to FIG. 32.

FIG. 33 (A) is a schematic diagram showing the state in which the exterior border line 130c, 130d and 130e and the interior border line 132c, 132d and 132e are superimposed on one image by aligning respective outer borders of the cross-section C, D and E.

FIG. 33 (B) shows the maximum region pinched between "the exterior border line 130c, 130d, 130e" and "the interior border line 132c, 132d, 132e" in FIG. 33 (A). That is the shadow area in FIG. 33 (B) is the combined region of the "regions to be avoided", and its interior border line is coded as 132s, and its exterior border line is coded as 130s.

In the forth embodiment, the combined region of the "regions to be avoided" shown in FIG. 33 (B) is superimposed and distinguishably displayed on the scout image. As shown in FIG. 33 (B), an operator can set the range of the data acquisition region 118h by, for example, drag operation, referring to this combined region.

In this setting, it is desirable to superimpose the frame of the outer border of the judging region 120h for the data acquisition region 118h on the scout image, so that the frame of the outer border of the judging region 120h is distinguishably displayed, for example, with a different chromatic color.

This is because an operator can select "the setting status in which application of a presaturation pulse is unnecessary", by setting the data acquisition region 118h in the way the judging region 120h does not overlap on the combined region of the "regions to be avoided" (see step S65 to be hereinafter described).

Figure 34:
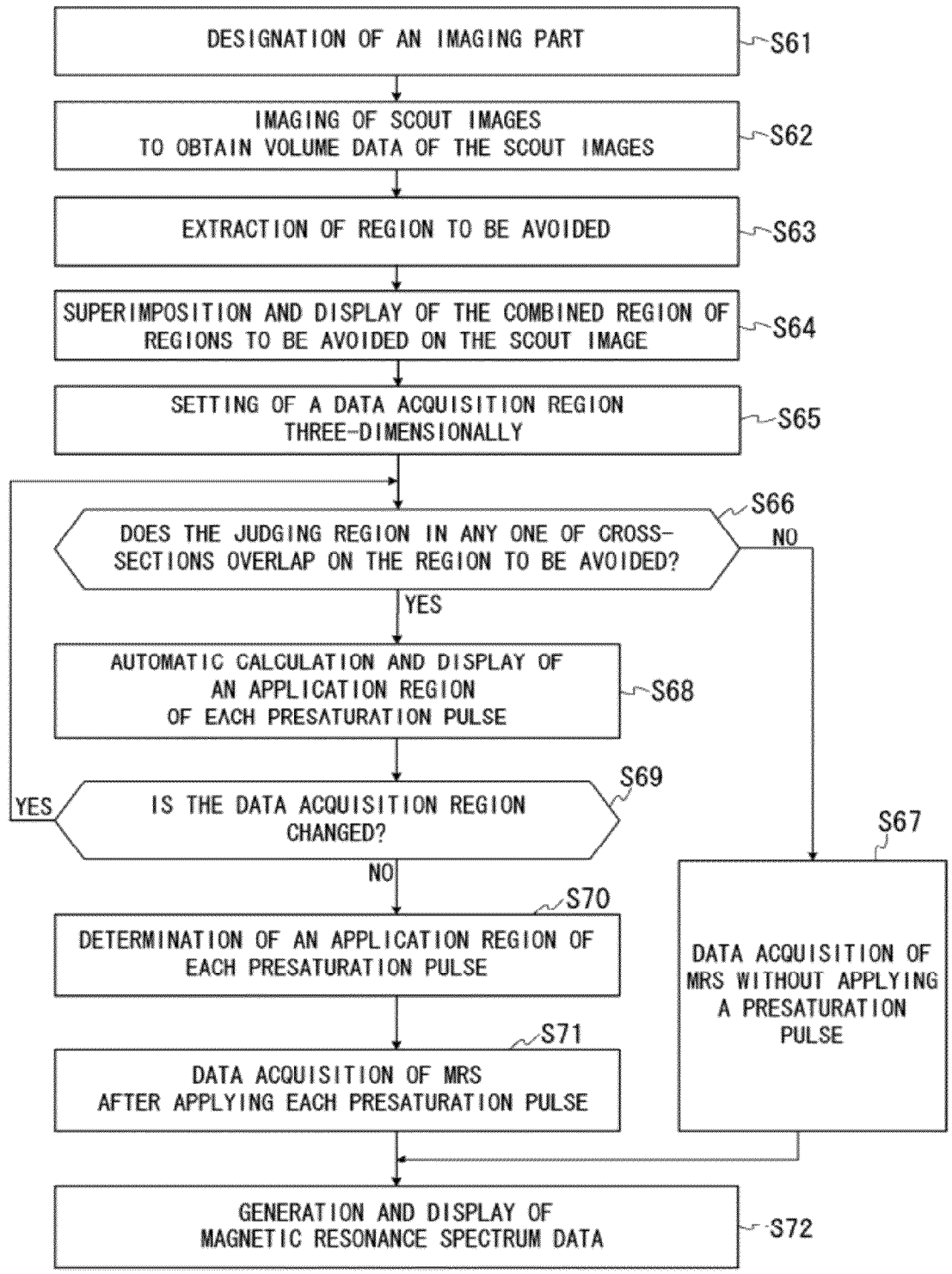
FIG. 34 is a flowchart illustrating a flow of a process performed by the magnetic resonance diagnosis apparatus of the fourth embodiment.

FIG. 34 is a flowchart illustrating a flow of a process performed by the magnetic resonance diagnosis apparatus 20 of the fourth embodiment. In the following, according to the step numbers in the flowchart shown in FIG. 34, an operation of the magnetic resonance diagnosis apparatus 20 will be described.

[step S61 to S63] Step S61 to S63 are similar to step S41 to S43 in the third embodiment, and overlapping explanation is abbreviated. After this, the process proceeds to step S64.

[step S64] The condition setting unit 84 calculates the combined region of the "regions to be avoided" of respective cross-sections in the volume data of the images obtained in step S62 as the scout images.

As to the calculation method of the combined region of the "regions to be avoided", it can be achieved by aligning each criterion line or a plurality of criteria points between each of the cross-sectional images. For example, the frames of the outer borders of the respective images are aligned (with each other) through all the cross-sectional images like in FIG. 33.

Additionally, the MPU 80 selects one scout image suitable for positioning out of the scout images obtained in step S62 in the way similar to the first embodiment.

Next, the MPU 80 makes the display device 64 display the selected scout image by controlling the display control unit 88.

In this display, the combined region of the "regions to be avoided" is superimposed on the selected scout image, so that the combined region is distinguishably displayed with a different chromatic color like in FIG. 33 (B). After this, the process proceeds to step S65.

[step S65] An operator sets the data acquisition region 118h on the displayed scout image. Here, as an example, the frame of the judging region 120h for the data acquisition region 118h is also distinguishably superimposed and displayed, when the operator sets the position and range of the data acquisition region 118h by mouse operation and cursor operation of the input device 62. After this, the process proceeds to step S66.

[step S66 to S72] Step S66 to S72 are similar to step S45 to S51 (see FIG. 28) in the third embodiment, and overlapping explanation is abbreviated. The foregoing is a description of an operation of the magnetic resonance diagnosis apparatus 20 according to the fourth embodiment.

As just described, the similar effects in the third embodiment can be obtained in the fourth embodiment. Moreover, in the fourth embodiment, before the determination of the data acquisition region 118h having a certain thickness, the combined region obtained by overlapping each "region to be avoided" between a plurality of cross-sections is superimposed and distinguishably displayed on the scout image (FIG. 33 (B) and step S64).

Therefore, an operator can set the data acquisition region 118h which does not overlap on each "region to be avoided" in each cross-section, by setting the data acquisition region 118h in the way it does not overlap on the combined region of the "regions to be avoided" on one scout image displayed. In this setting, an operator does not need to refer to other cross-sections.

Additionally, an operator can select "the setting status in which application of a presaturation pulse is unnecessary", by setting the data acquisition region 118h so that the judging region 120h does not overlap on the combined region of the "regions to be avoided" on one selected scout image (step S65).

<Fifth Embodiment>

In the fifth embodiment, setting of the data acquisition region by an operator is guided so that application of a pre-saturation pulse becomes unnecessary in terms of avoiding the aforementioned influence of artifact. When the magnetic resonance diagnosis apparatus 20 is set to the input restriction mode, setting of the data acquisition region by an operator is restricted so that the judging region does not overlap on the "region to be avoided".

Figure 35:
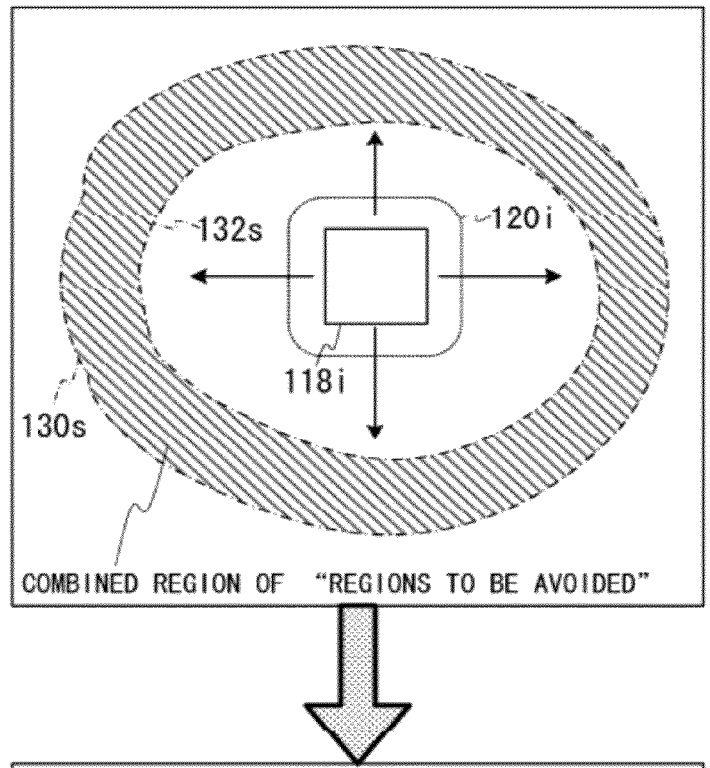
FIG. 35 is a schematic diagram illustrating an example of a guiding method for setting a data acquisition region in the fifth embodiment.
Figure 35:
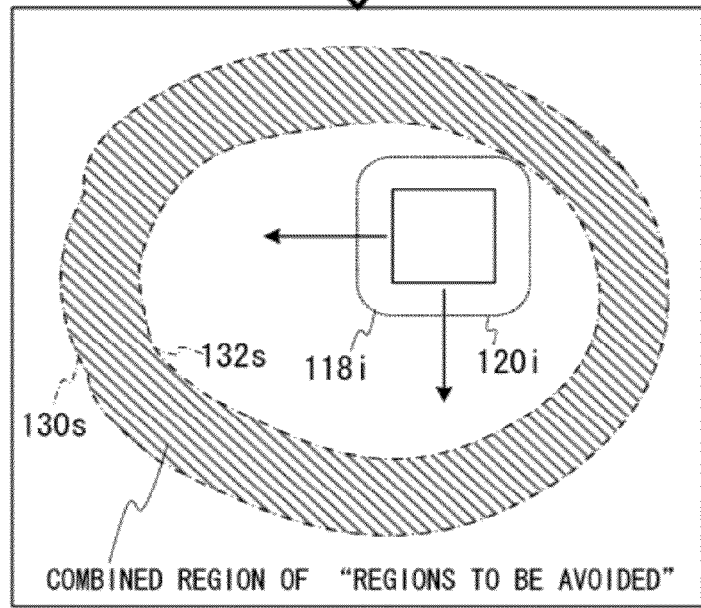

FIG. 35 is a schematic diagram illustrating an example of a guiding method for setting a data acquisition region in the fifth embodiment.

FIG. 35 (A) shows the state in which the combined region of the "regions to be avoided" explained in FIG. 33 (B) in the fourth embodiment is superimposed and distinguishably displayed on the scout image for setting the range of the data acquisition region.

As shown in FIG. 35 (A), in the initial setting, the data acquisition region 118i is automatically displayed, so that its judging region 120i is sufficiently separated from the "region to be avoided" in terms of position and size.

In the state of FIG. 35 (A), an operator can move the data acquisition region 118*i* to the left, right, top or bottom by keyboard input or drag operation with a mouse via the input device 62. Similarly, an operator can enlarge or reduce the data acquisition region 118*i* in size.

Then, the condition setting unit 84 restricts input from an operator via the input device 62, so that the judging region 120*i* and the "region to be avoided" do not overlap on each other. For example, the condition setting unit 84 restricts the input, so that the interval between the judging region 120*i* and the "region to be avoided" becomes equal to or larger than (width of) one pixel.

FIG. 35 (B) shows the state in which the interval between the judging region 120*i* and "the interior border line 132*s* of the region to be avoided" becomes one pixel after operation to move the data acquisition region 118*i* by an operator.

In the state of FIG. 35 (B), the condition setting unit 84 restricts the input, so that an operator cannot move the data acquisition region 118*i* to the right or upward on the screen and an operator cannot enlarge the size of the data acquisition region 118*i*.

Figure 36:
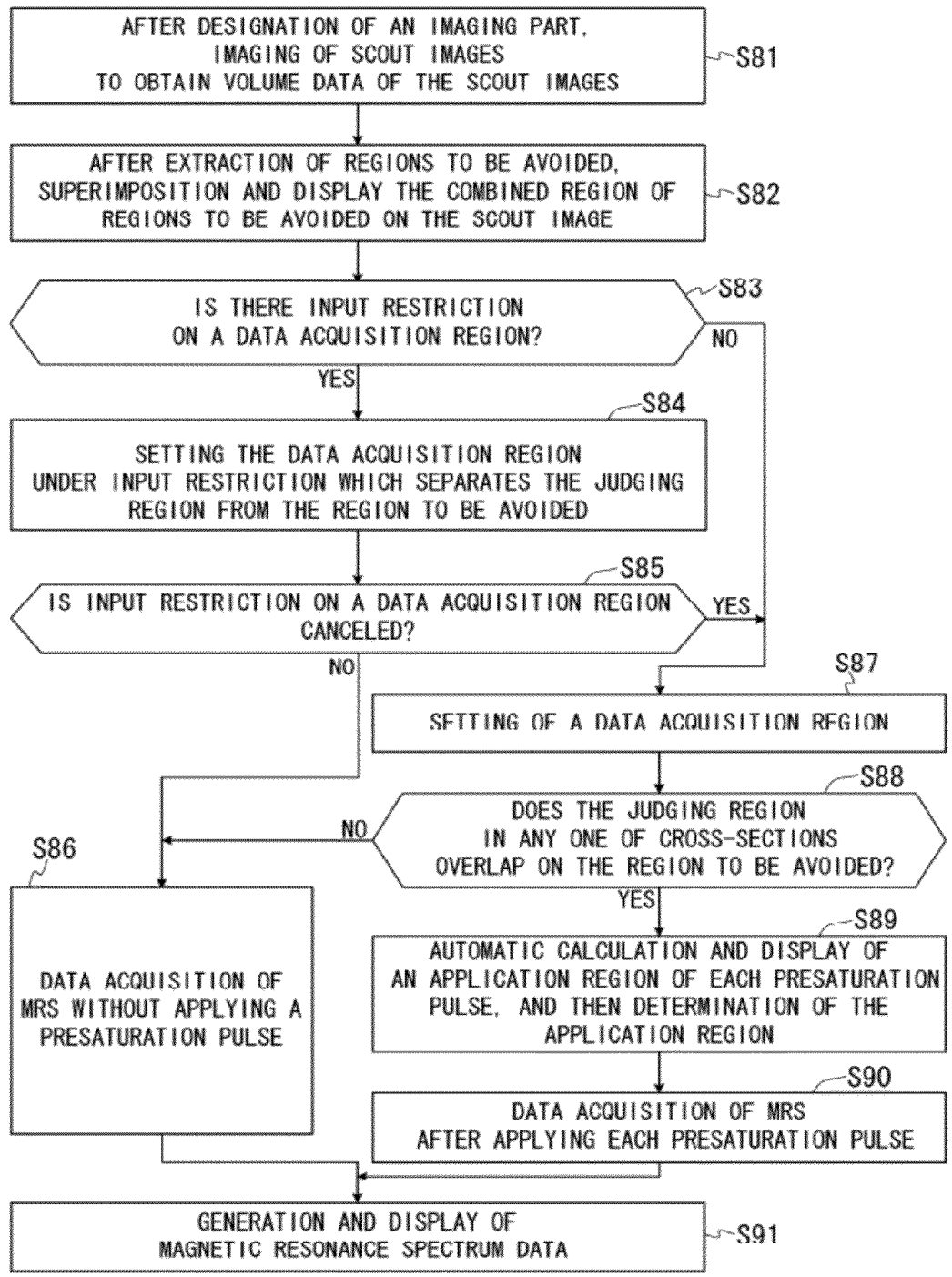
FIG. 36 is a flowchart illustrating a flow of a process performed by the magnetic resonance diagnosis apparatus of the fifth embodiment.

FIG. 36 is a flowchart illustrating a flow of a process performed by the magnetic resonance diagnosis apparatus 20 of the fifth embodiment. In the following, according to the step numbers in the flowchart shown in FIG. 36, an operation of the magnetic resonance diagnosis apparatus 20 will be described.

[step S81] Initial setting and designation of an imaging part are performed in the way similar to step S61 and S62 in the fourth embodiment, and then a plurality of scout images are imaged so that their image data are generated as volume data. Note that an operator can set the magnetic resonance diagnosis apparatus 20 to the input restriction mode via the input device 62 in the above initial setting. After this, the process proceeds to step S82.

[step S82] The condition setting unit 84 extracts each "region to be avoided" from the image data of each scout image, and calculates the combined region of the "regions to be avoided" in the way similar to step S63 and S64 in the fourth embodiment.

Then, after one scout image is selected in the way similar to step S4 in the first embodiment, the combined region of the "regions to be avoided" is superimposed and distinguishably displayed on this selected scout image. After this, the process proceeds to step S83.

[step S83] If the magnetic resonance diagnosis apparatus 20 is set to the input restriction mode, the MPU 80 makes the process of the magnetic resonance diagnosis apparatus 20 proceed to step S84. If this is not the case, the MPU 80 makes the process of the magnetic resonance diagnosis apparatus 20 proceed to step S87.

[step S84] On the display device 64, the selected scout image is displayed, and the combined region of the "regions to be avoided" is superimposed and distinguishably displayed on this scout image.

The condition setting unit 84 restricts input from an operator via the input device 62, so that the judging region 120*i* and the "region to be avoided" do not overlap on each other. For example, the input is restricted, so that the interval between the judging region 120*i* and the "region to be avoided" becomes equal to or larger than one pixel. As to this method, it is previously explained with FIG. 35. Under this restriction state, an operator can set the range of the data acquisition region by input operation. After this, the process proceeds to step S85.

[step S85] If the input restriction mode is canceled by input operation to the input device 62 by an operator, the MPU 80 makes the process of the magnetic resonance diagnosis apparatus 20 proceed to step S87. If this is not the case, the MPU 80 makes the process of the magnetic resonance diagnosis apparatus 20 proceed to step S86.

[step S86] Because the magnetic resonance diagnosis apparatus 20 is set to the input restriction mode, the data acquisition region 118*i* is set so that the judging region 120*i* and the "region to be avoided" do not overlap on each other. The condition setting unit 84 inputs the range of the data acquisition region 118*i* set in the above manner into the condition storing unit 82 to store the range.

After this, the magnetic resonance diagnosis apparatus 20 performs a sequence to acquire MR signals from the data acquisition region 118*i* without application of a presaturation pulse in the way similar to step S6 in the first embodiment. After this, the process proceeds to step S91.

[step S87] If the process proceeds to this step S87, the input restriction mode is canceled. Therefore, the range of the data acquisition region 118*i* is set via the input device 62, without input restriction to separate the judging region 120*i* from the "region to be avoided".

The condition setting unit 84 receives the set range of the data acquisition region 118*i*, inputs the range into the condition storing unit 82. The condition storing unit 82 stores the range of the data acquisition region 118*i*. After this, the process proceeds to step S88.

[step S88] The condition setting unit 84 determines the range of the judging region 120*i* based on the range (position and size) of the data acquisition region 118*i*.

The condition setting unit 84 determines (judges) whether the judging region 120*i* overlaps on the "region to be avoided" in at least one cross-section in the volume data or not, in the way similar to step S45 in the third embodiment. If both of them overlap on each other, the process proceeds to step S89. If this is not the case, the process proceeds to step S86.

[step S89] The condition setting unit 84 automatically calculates an application region of each presaturation pulse in the way similar to step S47 in the third embodiment, and the calculated application region is superimposed and distinguishably displayed on the scout image.

After this, the application region of each presaturation pulse is finally determined in the way similar to step S9 in the first embodiment, and the condition setting unit 84 inputs the determined application region of each presaturation pulse into the condition storing unit 82. The condition storing unit 82 stores the inputted application region(s). After this, the process proceeds to step S90.

[step S90] The sequence to acquire MR signals from the data acquisition region 118*i* under the application of each presaturation pulse is performed in the way similar to step S10 in the first embodiment. After this, the process proceeds to step S91.

[step S91] The magnetic resonance spectrum data are generated based on the MR signals acquired in step S86 or S90 in the way similar to step S11 in the first embodiment. The foregoing is a description of an operation of the magnetic resonance diagnosis apparatus 20 according to the fifth embodiment.

As just described, in the input restriction mode of the fifth embodiment, "input for setting the data acquisition region by an operator" is restricted so that the combined region of the "regions to be avoided" of a plurality of cross-sections does not overlap on the judging region 120*i*.

Therefore, an operator can avoid the influence of the "region to be avoided" in terms of artifact to eliminate the need for application of a presaturation pulse, by selecting the input restriction mode. This is because the data acquisition region is separated from the "region to be avoided" by a predetermined margin in the input restriction mode.

In this case, setting of an application region of a presaturation pulse is unnecessary, and labor of setting the data acquisition conditions by an operator can be saved. Thereby, throughput of examination using the magnetic resonance diagnosis apparatus 20 can be further improved.

Additionally, by canceling the input restriction mode as needed basis, an operator can make the magnetic resonance diagnosis apparatus 20 calculate an application region of each presaturation pulse based on the combined region of the "regions to be avoided" automatically like in the fourth embodiment.

In the above embodiment, "an example in which input is restricted so that the combined region of the "regions to be avoided" of a plurality of cross-sections does not overlap on the judging region 120*i*" has been described. However, embodiments of the present invention are not limited to such an aspect.

Figure 37:
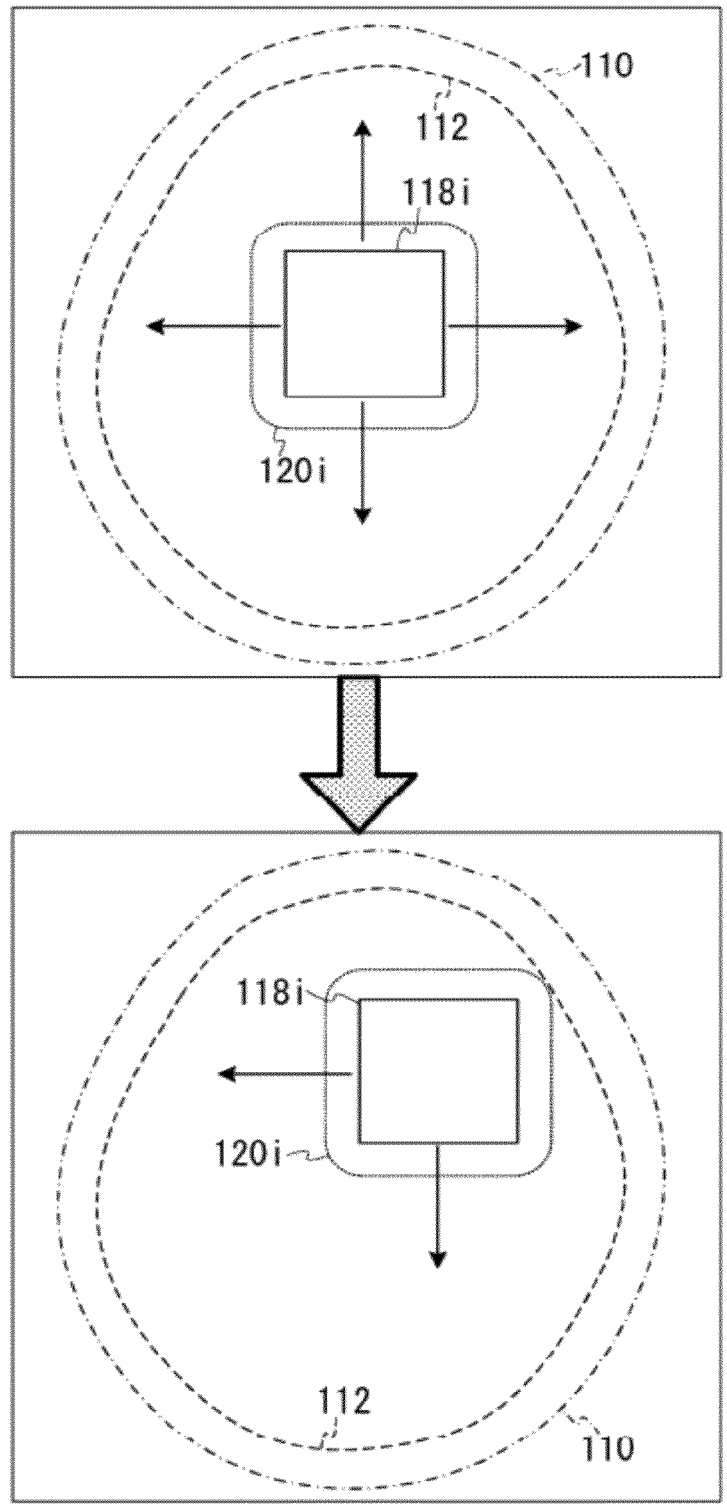
FIG. 37 (A) is a pattern diagram of the display screen image showing "a default range of a data acquisition region" displayed and superimposed on a selected scout image, and FIG. 37 (B) is a pattern diagram showing the state in which input is restricted by the condition setting unit.

For example, as shown in FIG. 37, input may be restricted so that the judging region 120*i* does not overlap on the "region to be avoided" of one scout image displayed for setting the range of the data acquisition region 118*i*.

FIG. 37 (A) is a pattern diagram of the display screen image showing "a default setting range of the data acquisition region 118*i*" superimposed and distinguishably displayed on the selected scout image for positioning of the data acquisition region 118*i*.

After this, when the interval between "the data acquisition region 118*i*" and "the interior border line 112 of the region to be avoided" becomes one pixel after input operation via the input device 62, the condition setting unit 84 restricts input in the same manner explained with FIG. 35 (B). FIG. 37 (B) shows this state.

Additionally, instead of input restriction to separate the judging region 120*i* from the "region to be avoided" in the above manner, the magnetic resonance diagnosis apparatus 20 may be configured to inform "that the judging region 120*i* overlaps on the region to be avoided" by alarm display when both of them overlap on each other (see the following FIG. 38 to FIG. 40), for example.

Figure 38:
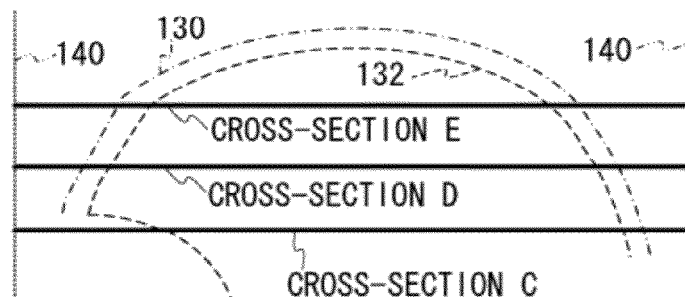
FIG. 38 is the first schematic diagram illustrating a guiding method for setting a data acquisition region in the supplementary embodiment of the fifth embodiment.
Figure 38:
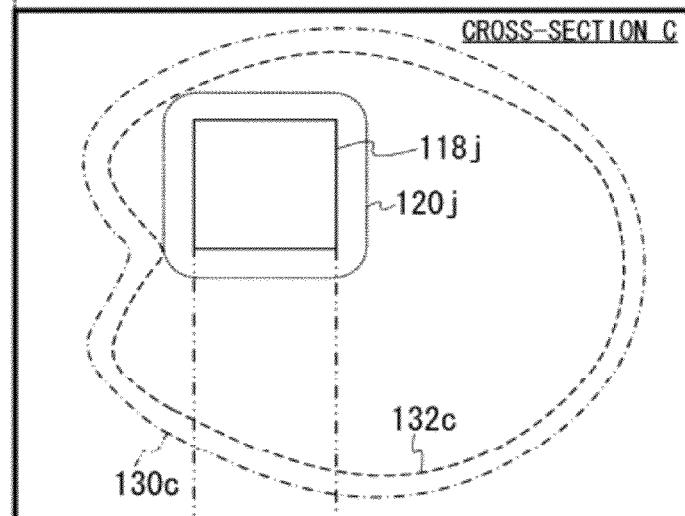
Figure 38:
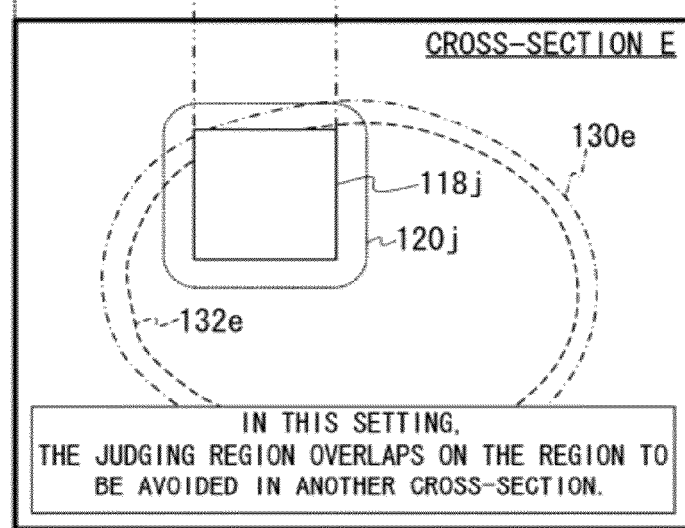

FIG. 38 is the first schematic diagram illustrating a guiding method for setting the data acquisition region in the supplementary embodiment of the fifth embodiment.

Figure 39A:
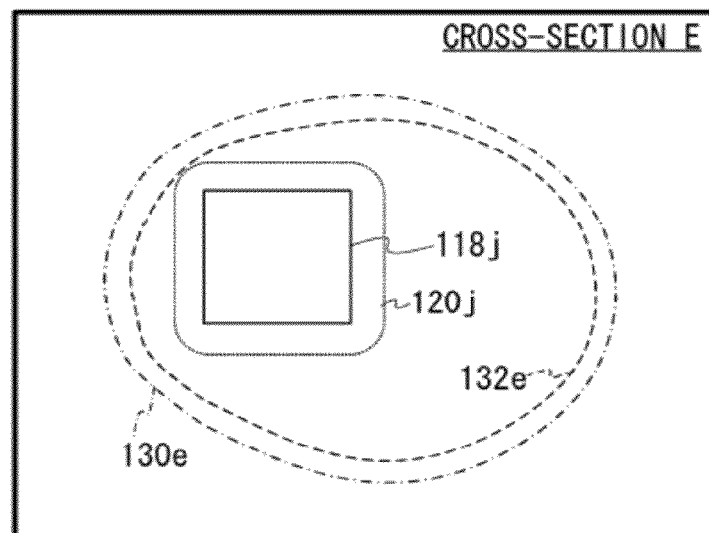
FIG. 39 is the second schematic diagram illustrating a guiding method for setting a data acquisition region in the supplementary embodiment of the fifth embodiment.
Figure 39B:
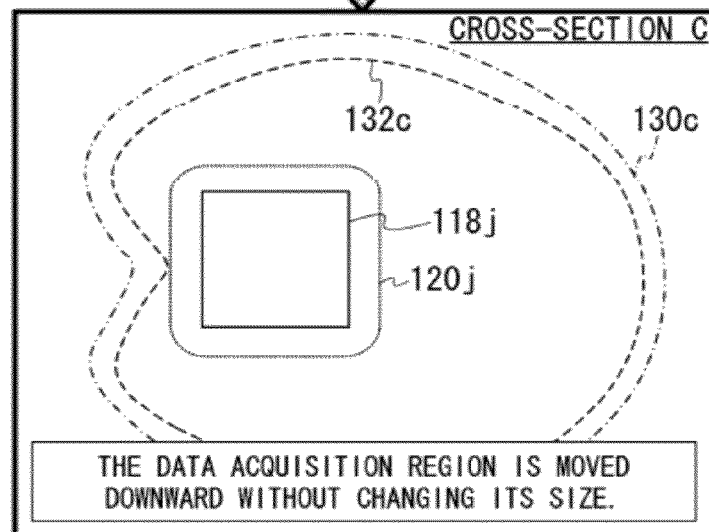

FIG. 39 is the second schematic diagram illustrating the guiding method for setting the data acquisition region in the supplementary embodiment of the fifth embodiment.

FIG. 38 (A) is similar to the sagittal cross-sectional pattern diagram in FIG. 29 of the fourth embodiment. In this modified embodiment, a plurality of scout images are imaged as volume data in the way similar to the fourth embodiment, and "regions to be avoided" are respectively extracted for the scout images.

Then, when the cross-section C in FIG. 38 (A) is selected for setting the data acquisition region 118*j* as an example, the interior border line 132*c* and the exterior border line 130*c* of the "region to be avoided" of the cross-section C are superimposed and displayed on the scout image of the cross-section C. In this state, an operator can set the data acquisition region 118*j*. FIG. 38 (B) shows this state.

Then, as shown in FIG. 38 (B), it is assumed that an operator has set the data acquisition region 118*j* to a position where the judging region 120*j* does not overlap on the interior border line 132*c*. In this case, the condition setting unit 84 determines (judges) whether the judging region 120*j* overlaps on the "region to be avoided" in another scout image of the volume data or not.

If the judging region 120*j* overlaps on the "region to be avoided", the condition setting unit 84 adds warning (notice) to "the image data of the cross-sectional image where both of them overlap on each other", and then inputs these image data into the display control unit 88, and makes the display device display these image data as viewing surface. FIG. 38(C) shows this state. In this example, the judging region 120*j* overlaps on the "region to be avoided" in the cross-section E.

Then, the condition setting unit 84 makes the display device 64 display "the scout image of the cross-section E" on which the "region to be avoided", judging region 120*j*, the data acquisition region 118*j* and warning are superimposed. The warning is, for example, textual information to inform that judging region (120*j*) overlaps on the "region to be avoided" in the range of the currently set data acquisition region.

After the above warning, the condition setting unit 84 automatically calculates the range of the data acquisition region 118*j* so as to separate it from the "region to be avoided" and satisfy the following condition. This condition is, for example, the minimum interval between the judging region 120*j* and the "region to be avoided" is one pixel in all the cross-sectional images of the volume data.

In this automatic calculation, the condition setting unit 84 automatically calculates "the range which satisfies the above condition" by positional change of the data acquisition region 118*j* such as shifting toward the left, right, top and bottom, for example.

When the above condition cannot be satisfied only by positional change, the condition setting unit 84 automatically calculates "the range which satisfies the above condition" by shrinking the size of the data acquisition region 118*j*. In the shrinkage of the data acquisition region 118*j*, it can be preliminarily set so that the three-dimensional shape of the data acquisition region 118*j* is homothetic before and after the shrinkage, for example. Alternatively, it can be preliminarily set so that the data acquisition region 118*j* becomes three-dimensionally rectangular parallelepiped region.

The condition setting unit 84 superimposes the automatically calculated data acquisition region 118*j* on "the cross-section in which the interval between the judging region 120*j* and the region to be avoided is the smallest (in this example, one pixel)" so as to edit the image data of this cross-section.

Then, the condition setting unit 84 inputs the edited image data into the display control unit 88, and makes the display device 64 display the edited image data as a screen image. FIG. 39 (A) shows one example of this state. Here, as an example, the interval between the judging region 120*j* and the "region to be avoided" in the cross-section E is set to one pixel.

Next, the condition setting unit 84 superimposes the automatically calculated data acquisition region 118*j* on "the scout image of the cross-section (in this example, the cross-section C) initially selected and displayed for setting of the data acquisition region 118*j*" so as to generate the image data of this state. Then, the condition setting unit 84 inputs the generated image data into the display control unit 88, and makes the display device 64 display the generated image data as a screen image. FIG. 39 (B) shows this state.

In this display, "information on whether the automatically calculated data acquisition region 118*j* is reduced in size or not compared with the data acquisition region 118*j* initially set by an operator" may be displayed as shown in FIG. 39 (B).

Also, "information on how the automatically calculated data acquisition region 118*j* is moved compared with the data acquisition region 118*j* initially set by an operator" may be displayed as shown in FIG. 39 (B).

Figure 40:
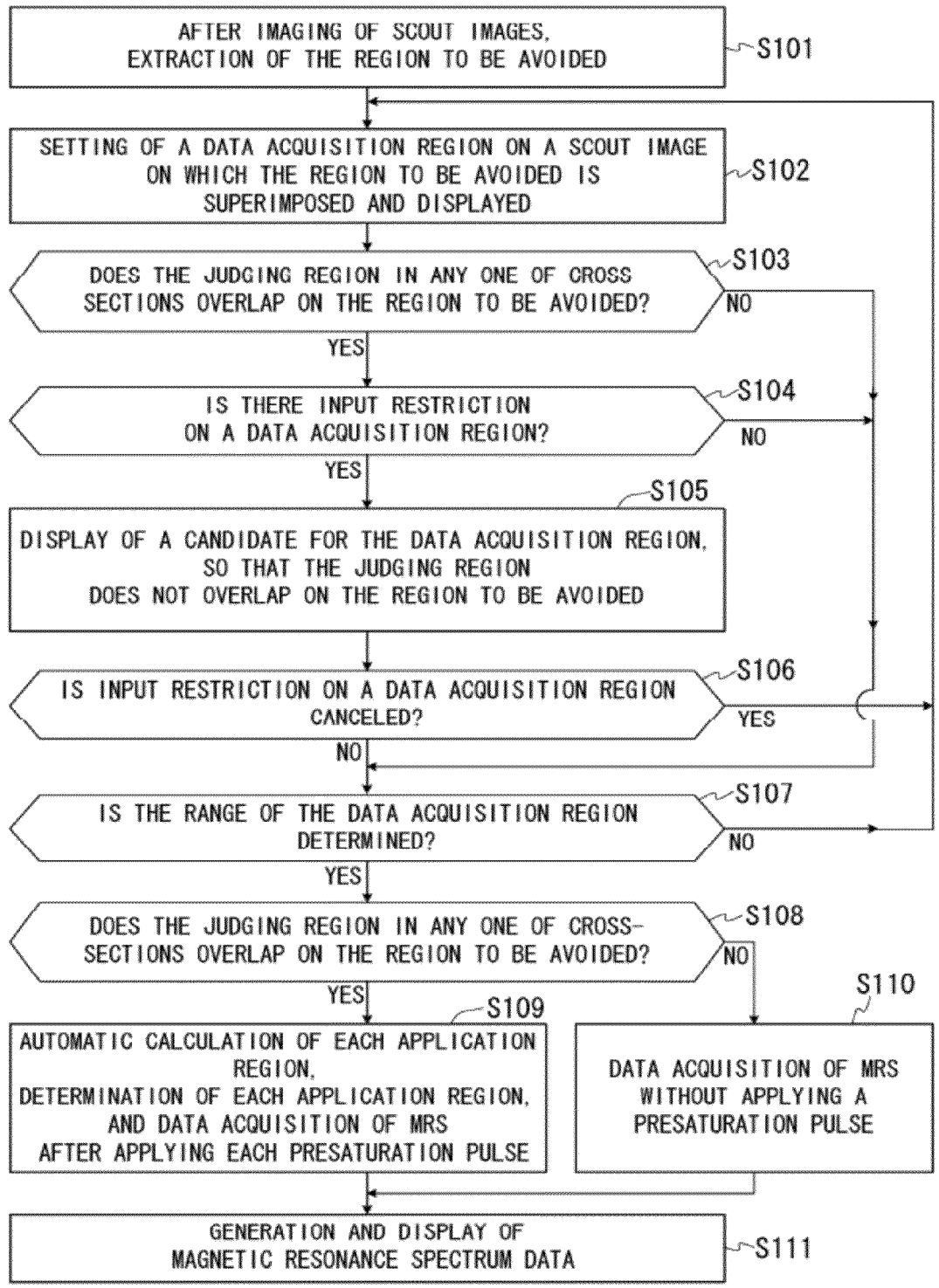
FIG. 40 is a flowchart illustrating a flow of a process performed by the magnetic resonance diagnosis apparatus in the supplementary embodiment of the fifth embodiment.

FIG. 40 is a flowchart illustrating a flow of a process performed by the magnetic resonance diagnosis apparatus 20 in the supplementary embodiment of the fifth embodiment. In the following, according to the step numbers in the flowchart shown in FIG. 40, an operation of the magnetic resonance diagnosis apparatus 20 will be described.

[step S101] Initial setting and designation of an imaging part are performed, and then a plurality of scout images are imaged so that their image data are generated as volume data in the way similar to step S61 to S63 in the fourth embodiment. After this, each "region to be avoided" is extracted from the image data of each scout image. Note that an operator can set the magnetic resonance diagnosis apparatus 20 to the input restriction mode via the input device 62 in the above initial setting. After this, the process proceeds to step S102.

[step S102] The MPU 80 selects one scout image suitable for positioning out of the plurality scout images obtained in step S101 in the way similar to step S4 in the first embodiment. Next, the MPU 80 makes the display device 64 display the selected scout image by controlling the display control unit 88.

In this display, "the interior border line and the exterior border line of the region to be avoided" are distinguishably superimposed on the selected scout image, so that the interior border line and the exterior border line are distinguishably displayed with mutually different chromatic colors. After this, an operator sets the data acquisition region with a certain thickness on the displayed scout image. After this, the process proceeds to Step S103.

[step S103] The condition setting unit 84 calculates the "judging region 120j" three-dimensionally, and respectively determines (judges) whether the "judging region 120j" overlaps on the "region to be avoided" on each of the scout images or not, in the way similar to step S45 (see FIG. 28) in the third embodiment. The condition setting unit 84 transmits the judgment result to the MPU 80.

If the judging region 120j overlaps on the "region to be avoided" in at least one cross-section (scout image), the MPU 80 makes the process of the magnetic resonance diagnosis apparatus 20 proceed to step S104. If this is not the case, the MPU 80 makes the process of the magnetic resonance diagnosis apparatus 20 proceed to step S107.

[step S104] If the magnetic resonance diagnosis apparatus 20 is set to the input restriction mode, the MPU 80 makes the process of the magnetic resonance diagnosis apparatus 20 proceed to step S105. If this is not the case, the MPU 80 makes the process of the magnetic resonance diagnosis apparatus 20 proceed to step S107.

[step S105] The condition setting unit 84 makes the display device 64 display "the scout image of the cross-section in which the judging region 120j overlaps on the region to be avoided" with warning, in the manner explained with FIG. 38 and FIG. 39 (see FIG. 38 (C)).

Next, the condition setting unit 84 automatically calculates the range of the data acquisition region 118j, so that the judging region 120j is separated from the "region to be avoided" and "the minimum interval between the judging region 120j and the region to be avoided" is one pixel in all the cross-sectional images of the volume data.

Next, the condition setting unit 84 makes the display device 64 display "the cross-sectional image having the smallest interval between the judging region 120j and the region to be avoided" with the automatically calculated data acquisition region 118j superimposed on this cross-sectional image (see FIG. 39 (A)).

Next, the condition setting unit 84 makes the display device 64 display "the scout image of the cross-sectional image initially selected and displayed for setting of the data acquisition region 118j" with the automatically calculated data acquisition region 118j superimposed on this scout image (see FIG. 39 (B)). For an operator, the automatically calculated data acquisition region 118j is a candidate for the data acquisition region.

In this display, "information on whether the automatically calculated data acquisition region 118j is reduced in size or not compared with the data acquisition region 118j initially set by an operator" is displayed. Also, "information on how the automatically calculated data acquisition region 118j is moved compared with the data acquisition region 118j initially set by an operator" is displayed. After this, the process proceeds to Step S106.

[step S106] If the input restriction mode is canceled by input operation to the input device 62 by an operator, the MPU 80 makes the process of the magnetic resonance diagnosis apparatus 20 return to step S102. If this is not the case, the MPU 80 makes the process of the magnetic resonance diagnosis apparatus 20 proceed to step S107.

[step S107] If the range of the data acquisition region 118j is finally determined by input to the input device 62 by an operator, the condition setting unit 84 inputs "the range of the data acquisition region 118j finally set" into the condition storing unit 82. The condition storing unit stores the range of the data acquisition region 118j. In this case, the MPU 80 makes the process of the magnetic resonance diagnosis apparatus 20 proceed to step S108.

If the range of the data acquisition region 118j is not determined by "input to set the range of the data acquisition region 118j again and the like", the MPU 80 makes the process of the magnetic resonance diagnosis apparatus 20 return to step S102.

[step S108] The condition setting unit 84 respectively determines (judges) whether the judging region 120j overlaps on the "region to be avoided" on the respective scout images or not, in the way similar to the above step S103.

If the judging region 120j overlaps on the "region to be avoided" on at least one cross-section (scout image), the MPU 80 makes the process of the magnetic resonance diagnosis apparatus 20 proceed to step S109. If this is not the case, the MPU 80 makes the process of the magnetic resonance diagnosis apparatus 20 proceed to step S110.

[step S109] The condition setting unit 84 automatically calculates an application region of each presaturation pulse, and makes the display device 64 superimpose and display the application region on the scout image, in the way similar to step S47 in the third embodiment (see FIG. 28).

After this, the application region of each presaturation pulse is finally determined in the way similar to step S9 in the first embodiment, and the condition setting unit 84 inputs the determined application region of each presaturation pulse into the condition storing unit 82. The condition storing unit 82 stores the inputted application region(s).

Then, the sequence to acquire MR signals from "the data acquisition region 118j finally determined in step S107" under the application of each presaturation pulse is performed in the way similar to step S10 in the first embodiment. After this, the process proceeds to step S111.

[step S110] The sequence to acquire MR signals from "the data acquisition region 118j finally determined in step S107" without application of a presaturation pulse is performed in the way similar to step S6 in the first embodiment. After this, the process proceeds to step S111.

[step S111] The magnetic resonance spectrum data are generated based on the MR signals acquired in step S109 or S110 in the way similar to step S11 in the first embodiment.

The foregoing is a description of an operation of the magnetic resonance diagnosis apparatus 20 according to the supplementary embodiment of the fifth embodiment.

As just described, in the supplementary embodiment of the fifth embodiment, the similar effects in the embodiment explained with FIG. 35 and FIG. 36 can be obtained. In this supplementary embodiment, an operator can be informed of "the fact that the data acquisition region 118*j* set by the operator will be influenced by the region to be avoided in terms of artifact", by selecting the input restriction mode.

Moreover, in the input restriction mode, the condition setting unit 84 automatically calculates the range of the data acquisition region 118*j*, so that the judging region 120*j* does not overlap on the "region to be avoided" of any cross-section of the volume data.

Therefore, an operator can avoid the influence of the "region to be avoided" to eliminate the need for application of a presaturation pulse, by only selecting the automatically calculated data acquisition region 118*j*. That is, labor of setting the data acquisition conditions by an operator can be saved, and throughput of examination using the magnetic resonance diagnosis apparatus 20 can be further improved.

According to each of the aforementioned first to fifth embodiments, operator's labor required for setting of data acquisition conditions can be eased by making the setting of data acquisition conditions such as an application region of a prepulse and an acquisition region of MR signals easier than prior art, when MRS is performed.

<Supplementary Notes on Embodiments>

[1] In each of the aforementioned embodiments, there has been described an example in which a presaturation pulse is used as an example of a prepulse. However, embodiments of the present invention are not limited to such an aspect. For example, embodiments of the present invention are applicable to other prepulses such as MTC pulse (magnetization transfer contrast pulse).

[2] In each of the aforementioned embodiments, there has been described an example in which an application region of a prepulse is automatically calculated in MRS examination for the cephalic part. However, embodiments of the present invention are not limited to such an aspect. The aforementioned method of automatically calculating an application region of a prepulse is applicable to MRS examination for other parts such as the abdominal part and the chest region.

[3] In the explanation of each of the aforementioned embodiments, regions whose MR signals are selectively extracted in MRS are treated as the data acquisition regions 118*a* to 118*j*. However, the data acquisition regions may be treated as "regions of interest".

When the data acquisition region is set as a single voxel, the data acquisition region 118*a* accords with the region of interest, for example.

When the data acquisition region is set as a multi-voxel, the data acquisition region 118*a* is, for example, broadly set so that the data acquisition region 118*a* includes the region of interest. Additionally, as a region of interest, a lesion area is included, for example.

[4] In each of the aforementioned embodiments, as an example of an object's region which is adjacent to a bone and has stronger MR signal intensity in image data than its adjacent regions, a fat region is treated as the "region to be avoided". However, this is only an example and embodiments of the present invention are not limited to such an aspect. For example, "a region which has stronger MR signal intensity in image data of a scout image than its adjacent regions due to airspace of the object such as a nasal cavity and an intraoral part" may be extracted as the "region to be avoided".

[5] In each of the aforementioned embodiments, there has been described an example in which a scout image is used for calculating an application region of an presaturation pulse. However, embodiments of the present invention are not limited to such an aspect. For example, "image data obtained in another magnetic resonance imaging sequence performed before the calculation of the application region of each presaturation pulse" may be alternatively used for the calculation of the application region.

[6] An example has been described in which (as the Magnetic resonance diagnosis apparatus 20,) the RF receiver 48 is disposed outside the gantry that includes the static magnetic field magnet 22, the shim coil 24, the gradient magnetic field coil unit 26, the RF coils 28 and the like (see FIG. 1). However, the embodiment of the present invention is not limited to such an implementation. The RF receiver 48 may be included in the gantry.

Specifically, for example, an electronic circuit board that is equivalent to the RF receiver 48 may be disposed in the gantry. Then, the MR signal, which is an analog electrical signal converted from the electromagnetic wave by the receiving RF coil 28, may be amplified by a pre-amplifier in the electronic circuit board, the amplified signal may be outputted to the outside of the gantry as a digital signal and inputted to the sequence controller 56. In outputting the signal to the outside of the gantry, for example, an optical communication cable is preferably used to transmit the signal in the form of an optical digital signal. This is because the effect of external noise is reduced.

[7] Correspondences between terms used in the claims and terms used in the embodiments described above will be described. Note that the correspondences described below are just some of possible interpretations for reference and should not be construed as limiting the present invention.

"The function of the condition setting unit which automatically calculates an application region of each presaturation pulse" is an example of the application region calculation unit described in the claims.

"The functions of the entirety of the static magnetic field magnet 22, the shim coil 24, the gradient coil 26, the RF coils 28 and the control device 30 (see FIG. 1) that receive MR signals from the object Q under a sequence including application of a static magnetic field, gradient magnetic field and RF pulses" and "the functions of the MPU 80 which generates magnetic resonance spectrum data based on the MR signals" are an example of the data generation unit described in the claims.

"The functions of the display control unit 88 and the display device 64 which display a "region to be avoided" and "an application region of a presaturation pulse" superimposed on a scout image" are an example of the display unit described in the claims.

The (outer border of the) judging region is an example of the judging frame described in the claims.

The function of the condition setting unit which extracts a "region to be avoided" is an example of the extraction unit described in the claims.

"The function of the input device 62 which receives input for setting the range of the data acquisition region by using a scout image displayed on the display device 64 as a criterion" is an example of the input unit described in the claims.

"The function of the input device 62 which receives input for determining the range of the data acquisition region" is an example of the input unit described in the claims.

The input which selects the artifact suppression mode or the SAR priority mode in step S24 in the second embodiment is an example of "input information which makes number of applied presaturation pulse unlimited or limited" described in the claim.

"The function of the condition setting unit which restricts input for setting the data acquisition region via the input device 62 so that a judging region does not overlap on a region to be avoided in the fifth embodiment" is an example of the input restriction unit described in the claims.

"The function of the condition setting unit 84 which makes the display device 64 display warning when a judging region overlaps on a region to be avoided in the supplementary embodiment of the fifth embodiment" is an example of the input restriction unit described in the claims.

[8] While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic resonance diagnosis apparatus performing "generation of image data of an object by magnetic resonance imaging", and magnetic resonance spectroscopy, the magnetic resonance diagnosis apparatus comprising:
    an application region calculation unit configured to automatically calculate an application region of a spatially selective prepulse based on "image data including a region of interest of the object generated by magnetic resonance imaging before application of a prepulse"; and
    a data generation unit configured to receive a magnetic resonance signal from a data acquisition region including the region of interest after applying the prepulse according to the application region automatically calculated by the application region calculation unit, and generate magnetic resonance spectrum data indicative of concentration distribution per metabolic substance in the region of interest based on the magnetic resonance signal.

2. The magnetic resonance diagnosis apparatus according to claim 1, further comprising:
    a display unit configured to display the application region automatically calculated by the application region calculation unit, before determination of the application region of the prepulse; and
    an input unit configured to receive input which determines the application region of the prepulse, after the application region automatically calculated by the application region calculation unit is displayed by the display unit;
    wherein the data generation unit is configured to apply the prepulse to an application region determined by the input received by the input unit.

3. The magnetic resonance diagnosis apparatus according to claim 1,
    wherein the data generation unit is configured to apply the prepulse to the application region automatically calculated by the application region calculation unit.

4. The magnetic resonance diagnosis apparatus according to claim 1,
    wherein the application region calculation unit is configured to automatically calculate the application region of the prepulse according to the region of interest.

5. The magnetic resonance diagnosis apparatus according to claim 1,
    wherein the application region calculation unit is configured to determines whether the data generation unit applies the prepulse or not according to a position of the region of interest and the image data, and automatically calculate the application region of the prepulse if this determination result is affirmative.

6. The magnetic resonance diagnosis apparatus according to claim 1,
    wherein the application region calculation unit is configured to automatically calculate the application region of the prepulse based on a position of a specific tissue region extracted from the image data.

7. The magnetic resonance diagnosis apparatus according to claim 6,
    wherein the application region calculation unit is configured to automatically calculate respective application regions of spatially selective prepulses whose number is according to a position of the region of interest and a position of the specific tissue region.

8. The magnetic resonance diagnosis apparatus according to claim 1, further comprising:
    a display unit configured to display the application region automatically calculated by the application region calculation unit, before determination of the application region of the prepulse.

9. The magnetic resonance diagnosis apparatus according to claim 8,
    wherein the application region calculation unit is configured to extract "a region which is adjacent to a bone of the object and indicates a stronger magnetic resonance signal than its adjacent region in the image data" or "a region indicating a weaker magnetic resonance signal than its adjacent region in the image data due to airspace in the object" as a region to be avoided; and
    the display unit is configured to display the region to be avoided and the application region automatically calculated by the application region calculation unit.

10. The magnetic resonance diagnosis apparatus according to claim 1,
    wherein the application region calculation unit is configured to extract "a region which is adjacent to a bone of the object and indicates a stronger magnetic resonance signal than its adjacent region in the image data" or "a region indicating a weaker magnetic resonance signal than its adjacent region in the image data due to airspace in the object" as a region to be avoided, set a judging frame defined by extending an outer border of the data acquisition region, and automatically calculate the application region of the prepulse when the judging frame overlaps on the region to be avoided.

11. The magnetic resonance diagnosis apparatus according to claim 10,
    wherein the application region calculation unit is configured to calculate positions of a plurality of intersection points between the judging frame and the region to be avoided, automatically calculate an application region of each of spatially selective prepulses respectively corresponding to straight lines each passing two of the intersection points so that each application region is aligned with one of the straight lines, when the judging frame overlaps on the region to be avoided.

12. The magnetic resonance diagnosis apparatus according to claim 11,
    wherein the application region calculation unit is configured to extract "a region which is adjacent to a bone of the object and indicates a stronger magnetic resonance signal than its adjacent region in the image data" as the region to be avoided, when a cephalic part of the object is set as the region of interest.

13. The magnetic resonance diagnosis apparatus according to claim 11,
wherein the application region calculation unit is configured to automatically calculate an application region of each of spatially selective prepulses whose number is according to input information setting the number unlimited or limited, when at least a part of the data acquisition region overlaps on the region to be avoided.

14. The magnetic resonance diagnosis apparatus according to claim 10,
wherein the application region calculation unit is configured to
(a) extract the region to be avoided from each of cross-sections including the region of interest, image data of the cross-sections are generated by magnetic resonance imaging before application of the prepulse;
(b) set the judging frame for each of the cross-sections;
(c) determine whether the judging frame overlaps on an outer border of the region to be avoided in at least one of the cross-sections or not; and
(d) automatically calculate the application region of the prepulse based on intersection points between the judging frame and the outer border of the region to be avoided, when the determination result is affirmative.

15. The magnetic resonance diagnosis apparatus according to claim 14,
wherein the application region calculation unit is configured to
(a) calculate a position of an intersection point between the judging frame and the outer border of the region to be avoided in a cross-section on which the judging frame overlaps on the outer border of the region to be avoided, as a criterion point;
(b) calculate a tangent line circumscribed to the outer border of the region to be avoided at the criterion point in "a cross-section which includes the criterion point and is orthogonal to the cross-section on which the judging frame overlaps on the outer border of the region to be avoided"; and
(c) automatically calculate the application region of the prepulse based on the tangent line.

16. The magnetic resonance diagnosis apparatus according to claim 1, further comprising:
a display unit configured to display a scout image for setting a range of the data acquisition region; and
an input unit configured to receive input which sets the range of the data acquisition region using the scout image as a criterion;
wherein the application region calculation unit is configured to extract "regions which are adjacent to a bone of the object and indicate a stronger magnetic resonance signal than its adjacent region in the image data" or "regions indicating a weaker magnetic resonance signal than its adjacent region in the image data due to airspace in the object" from image data respectively corresponding to cross-sections each including the region of interest, as regions to be avoided, and calculate a combined region of the regions to be avoided through the cross-sections;
the display unit is configured to use one of cross-sectional images of the cross-sections as the scout image, and superimpose and display the combined region on this scout image; and
the data generation unit is configured to receive the magnetic resonance signal from the data acquisition region whose range is based on the input to the input unit.

17. The magnetic resonance diagnosis apparatus according to claim 1,
wherein the application region calculation unit is configured to automatically calculate the application region of the prepulse according to a position of the region of interest, based on image data of a fat weighted image including the region of interest.

18. A magnetic resonance diagnosis apparatus comprising:
an extraction unit configured to extract a region of a specific tissue from image data including a region of interest of an object generated by magnetic resonance imaging, as a region to be avoided;
a display unit configured to display the region to be avoided;
an input unit configured to receive input which sets a range of a data acquisition region;
an input restriction unit configured to set a judging frame defined by extending an outer border of the data acquisition region, and then, "restrict the input to the input unit so as to separate the judging frame from the region to be avoided" or "inform that the judging frame overlaps on the region to be avoided in such case"; and
a data generation unit configured to receive a magnetic resonance signal from the data acquisition region after determining the range of the data acquisition region based on the input to the input unit, and generate magnetic resonance spectrum data indicative of concentration distribution per metabolic substance in the data acquisition region based on the magnetic resonance signal.

19. The magnetic resonance diagnosis apparatus according to claim 18,
wherein the extraction unit is configured to extract "a region indicating a stronger magnetic resonance signal than its adjacent region in the image data" or "a region indicating a weaker magnetic resonance signal than its adjacent region in the image data due to airspace in the object", as the region to be avoided; and
the display unit is configured to display the image data including the region of interest as an image with the region to be avoided superimposed on this displayed image.

20. A data acquisition method of magnetic resonance spectroscopy comprising the steps of:
calculating an application region of a spatially selective prepulse based on "image data including a region of interest of an object generated by magnetic resonance imaging" automatically, before application of a prepulse;
receiving a magnetic resonance signal from a data acquisition region including the region of interest, after applying the prepulse according to the application region automatically calculated; and
generating magnetic resonance spectrum data indicative of concentration distribution per metabolic substance in the region of interest based on the magnetic resonance signal.

* * * * *